(12) United States Patent
Jinta et al.

(10) Patent No.: US 7,239,179 B2
(45) Date of Patent: Jul. 3, 2007

(54) LEVEL CONVERSION CIRCUIT, POWER SUPPLY VOLTAGE GENERATION CIRCUIT, SHIFT CIRCUIT, SHIFT REGISTER CIRCUIT, AND DISPLAY APPARATUS

(75) Inventors: Seiichiro Jinta, Kanagawa (JP); Ryuya Koike, Kanagawa (JP)

(73) Assignee: Sony Corporation (JP)

( * ) Notice: Subject to any disclaimer, the term of this patent is extended or adjusted under 35 U.S.C. 154(b) by 84 days.

(21) Appl. No.: 11/195,837

(22) Filed: Aug. 3, 2005

(65) Prior Publication Data
US 2006/0061385 A1  Mar. 23, 2006

(30) Foreign Application Priority Data
Aug. 5, 2004 (JP) ............................. P2004-228946
Aug. 5, 2004 (JP) ............................. P2004-228947
Aug. 5, 2004 (JP) ............................. P2004-228948

(51) Int. Cl.
*H03K 19/0175* (2006.01)
(52) U.S. Cl. .......................................... 326/81; 326/68
(58) Field of Classification Search ............. 326/81–83, 326/86, 88, 68; 327/108, 109
See application file for complete search history.

(56) References Cited

U.S. PATENT DOCUMENTS 5,877,635 A * 3/1999 Lin .............................. 326/83

6,590,423 B1 * 7/2003 Wong ........................... 326/93
7,138,831 B2 * 11/2006 Tobita ........................... 326/81

FOREIGN PATENT DOCUMENTS

| JP | 2002-028771 | 1/2002 |
|---|---|---|
| JP | 2003-347926 | 12/2003 |

* cited by examiner

*Primary Examiner*—James H. Cho
(74) *Attorney, Agent, or Firm*—Rader Fishman & Grauer PLLC; Ronald P. Kananen

(57) ABSTRACT

The present invention provides a level conversion circuit including first and second transistors, a clock terminal, first switch means, second switch means, and a capacitance element. The first and second transistors are of the opposite conduction types to each other connected in series between a first power supply potential and a second power supply potential. The clock terminal is inputted a clock signal. The first switch means is connected between the clock terminal and the gate of the first transistor and has an on state when a circuit operation control signal is in an active state. The second switch means is connected between the second power supply potential and the gate of the second transistor and has an off state when the circuit operation control signal is in an active state. The capacitance element is connected between the clock terminal and the gate of the second transistor.

62 Claims, 65 Drawing Sheets

US 7,239,179 B2

LEVEL CONVERSION CIRCUIT, POWER SUPPLY VOLTAGE GENERATION CIRCUIT, SHIFT CIRCUIT, SHIFT REGISTER CIRCUIT, AND DISPLAY APPARATUS

BACKGROUND OF THE INVENTION

This invention relates to a level conversion circuit (level shifting circuit), a power supply voltage generation circuit, a shift circuit, a shift register circuit, and a display apparatus, and more particularly to a level conversion circuit formed on an insulating circuit board, a power supply voltage generation circuit formed using the level conversion circuit, and a display apparatus in which the power supply voltage generation circuit is incorporated.

A current mirror type level conversion circuit in related art is known formed using a current mirror circuit. One of such current mirror type level conversion circuits is disclosed, for example, in Japanese Patent Laid-open No. 2003-347926 (hereinafter referred to as Patent Document 1).

FIG. 76 shows an example of a configuration of one of current mirror type level conversion circuits in related art. Referring to FIG. 76, the current mirror type level conversion circuit 100 shown includes a circuit operation control section 101, two bias shift sections 102 and 103, a level shifting section 104, and an outputting section 105.

The circuit operation control section 101 includes two P-channel MOS transistors (P-channel MOS transistor is hereinafter referred to as PMOS transistor) p101 and p102 and an N-channel MOS transistor (hereinafter referred to as "NMOS transistor") n101. The PMOS transistor p101 and the NMOS transistor n101 are connected in series between a power supply line (hereinafter referred to as "Vdd line") to which a positive side power supply potential Vdd is applied and another power supply line (hereinafter referred to as "Vss line") to which a negative side power supply potential Vss is applied. The PMOS transistor p101 and the NMOS transistor n101 are connected to each other at the gates and the drains.

A circuit operation controlling signal xstb is applied from the outside to the gates of the PMOS transistor p101 and the NMOS transistor n101. The circuit operation controlling signal xstb normally has a Low potential when the circuit is in a standby state (inoperative) but normally has a High potential when the circuit is operative. The PMOS transistor p102 is connected at the source thereof to the Vdd line and at the gate thereof to the gates of the PMOS transistor p101 and the NMOS transistor n101.

The bias shift section 102 is formed from two PMOS transistors p103 and p104 and an NMOS transistor n102. The PMOS transistor p103 and the NMOS transistor n102 are connected in series between the Vdd line and the Vss line, and are connected at the gates thereof to each other and also to the drains of the PMOS transistor p101 and the NMOS transistor n101. The PMOS transistor p103 and the NMOS transistor n102 are connected at the drains thereof to each other. The PMOS transistor p104 is connected in parallel to the NMOS transistor n102 and receives a clock CK at the gate thereof. The bias shift section 102 performs an operation of shifting the DC bias of the clock CK.

The bias shift section 103 is formed from two PMOS transistors p105 and p106 and an NMOS transistor n103. The PMOS transistor p105 and the NMOS transistor n103 are connected in series between the Vdd line and the Vss line, and are connected at the gates and the drains thereof to each other. The PMOS transistor p106 is connected in parallel to the NMOS transistor n103 and receives a clock xCK having a phase opposite to that of the clock CK at the gate thereof. The bias shift section 103 performs an operation of shifting the DC bias of the opposite phase clock xCK.

The level shifting section 104 is formed from two PMOS transistors p107 and p108 and two NMOS transistors n104 and n105. The two PMOS transistors p107 and p108 are connected at the sources thereof to the Vdd line and at the gates thereof to each other. The gate and the drain of the PMOS transistor p107 are connected to each other. Thus, a current mirror circuit is formed. The PMOS transistor p107 is connected at the drain (gate) thereof to the drain of the PMOS transistor p102.

The NMOS transistor N104 is connected at the drain thereof to the drain (gate) of the PMOS transistor p107 and at the gate thereof to the drains of the PMOS transistor p103 and the NMOS transistor n102. The opposite phase clock xCK is applied to the source of the NMOS transistor N104. The NMOS transistor N105 is connected at the drain thereof to the drain of the PMOS transistor p108 and at the gate thereof to the drains of the PMOS transistor p105 and the NMOS transistor n103. The clock CK is applied to the source of the NMOS transistor N105.

As can be recognized from the configuration described above, the level shifting section 104 has a circuit configuration of a current mirror amplifier of the source input type. The opposite phase clock xCK and the positive phase clock CK are inputted to the sources of the NMOS transistors n104 and n105, respectively.

The outputting section 105 is formed from an NMOS transistor N106 connected at the drain thereof to the drains of the PMOS transistor p108 and the NMOS transistor N105 and at the source thereof to the Vss line. The NMOS transistor N106 is further connected at the gate thereof to the gates of the PMOS transistor p105 and the NMOS transistor n103.

As one of the shift circuits, which are used for transfer stages (shift stages) of a shift register circuit, a shift circuit with a level shift function is known which level-shifts (level-converts) a clock pulse to be used as a reference for operation from a first amplitude to a second amplitude. One of such shift circuits with a level shift function is disclosed, for example, in Japanese Patent Laid-open No. 2002-287711 (hereinafter referred to as Patent Document 2). A shift register circuit of the type described is used as a shift register circuit forming a scanner used in a display apparatus or an image pickup apparatus.

FIG. 77 shows an example of a configuration of a shift circuit with a level shift function. Referring to FIG. 77, the shift circuit 100 shown includes a current mirror circuit 101 as a basic circuit. The current mirror circuit 101 is formed from NMOS transistors n101 and n102 connected at the gates thereof to each other. The NMOS transistor n101 is connected in a diode connection wherein the gate and the drain thereof are connected to each other. Clocks CK and xCK of the opposite phases to each other having a low voltage amplitude (for example, 0 to 3 V) are inputted to the sources of the NMOS transistors n101 and n102, respectively.

In the current mirror circuit 101, the drain output of the NMOS transistor n102 has a high voltage amplitude of VSS-VDD (for example, 0 to 8 V) and is outputted as a transfer pulse OUT after it is inverted by an inverter 102. PMOS transistors p101 and p102 are connected between the drains of the NMOS transistors n101 and n102 and the power supply potential VDD, respectively.

NMOS transistors n103 and n104 are connected in series between the drain of the NMOS transistor n101 and the power supply potential VSS. A transfer pulse IN is applied to the gate of the NMOS transistor n103 after it is inverted by an inverter 103. The drain output of the NMOS transistor n102 is applied directly to the gate of the NMOS transistor n104.

PMOS transistors p103 and p104 are connected in series between the gate of the PMOS transistor p101 and the power supply potential VDD. PMOS transistors p105 and p106 are connected in series to the gate of the PMOS transistor p102 and the power supply potential VDD. PMOS transistors p107 and p108 are connected in parallel between the drain of the NMOS transistor n102 (drain of the PMOS transistor p102) and the power supply potential VDD.

The drain output of the NMOS transistor n102 after being inverted by the inverter 102, that is, the transfer pulse OUT, is applied to the gates of the PMOS transistors p103, p105, and p107. The transfer pulse IN is applied directly to the gates of the PMOS transistors p104, p106, and p108.

The clock pulse xCK is applied to the gate of the PMOS transistor p101 through NMOS transistors n105 and n106 connected in parallel to each other. The clock pulse CK is applied to the gate of the inverter 102 through NMOS transistors n107 and n108 connected in parallel to each other. The transfer pulse IN is applied directly to the gates of the NMOS transistors n105 and n107. The transfer pulse OUT is applied to the gates of the NMOS transistors n106 and n108.

PMOS transistors p109 and p101 are connected between the gate of the NMOS transistor n103 and the power supply potential VDD and between the drain of the NMOS transistor n102 (drain of the PMOS transistor p102) and the power supply potential VDD, respectively. A Low-active reset pulse rst is applied to the gates of the PMOS transistors p109 and p101.

As can be recognized apparently from the circuit configuration described above, the shift circuit 100 in related art is configured as a combination of a current mirror type level shift circuit, which uses the current mirror circuit 101, and a clock extracting shift circuit. The level shift circuit operates when the transfer pulse IN has the High level or the transfer pulse OUT has the High level.

SUMMARY OF THE INVENTION

In the current mirror type level conversion circuit 100 in related art having the configuration described above, the DC biases of the clocks CK and xCK are shifted by the bias shift sections 102 and 103 first, respectively, and the clocks CK and xCK are finally level-shifted (level-converted) to a clock of an amplitude of Vss-Vdd by the level shifting section 104. Therefore, leak current (penetrating current) always flows in a circuit portion indicated by each arrow mark of a dotted line in FIG. 77. This leak current makes a causes a high power consumption of the level conversion circuit 100.

Further, the current mirror type level conversion circuit 100 has a subject to be solved also in that, since the PMOS transistors p107 and p108 paired with each other to form a current mirror circuit must have the same characteristic, the current mirror type level conversion circuit 100 is poor in toughness against the dispersion in transistor characteristic.

Further, in the shift circuit 100 in related art with a level shifting function having the configuration described hereinabove, since it has a circuit configuration including the current mirror circuit 101 as a basic circuit, when the level shift circuit operates, leak current (penetrating current) always flows between the power supply potential VDD and the clocks CK and xCK (portions indicated by the dotted line arrow marks). The leak current causes a high power consumption of the shift circuit 100.

Furthermore, since leak current always flows between the power supply potential VDD and the clocks CK and xCK, an output capacity that can absorb the leak current is required. Therefore, the burden on the clocks CK and xCK is high. Further, since the NMOS transistors n101 and n102 paired with each other to form the current mirror circuit 101 must have the same characteristic, the current mirror circuit 101 is poor in toughness against the dispersion in transistor characteristic.

It is desirable to provide a level conversion circuit, a power supply voltage generation circuit, a shift circuit, a shift register circuit, and a display apparatus that can operate with reduced power consumption and is tough against dispersion in transistor characteristic.

According to an embodiment of the present invention, there is provided a level conversion circuit including first and second transistors of the opposite conduction types to each other connected in series between a first power supply potential and a second power supply potential, a clock terminal to which a clock signal is inputted, first switch means connected between the clock terminal and the gate of the first transistor and having an on state when a circuit operation control signal is in an active state, second switch means connected between the second power supply potential and the gate of the second transistor and having an off state when the circuit operation control signal is in an active state, and a capacitance element connected between the clock terminal and the gate of the second transistor.

In the level conversion circuit having the configuration described above, when the circuit operation signal is in an active state, the first switch section has an on state, and consequently, the clock signal is supplied from the clock terminal to the gate of the first transistor through the first switch means. Simultaneously, the second switch means is placed into an off state. Consequently, the supply of the second power supply potential to the gate of the second transistor is interrupted, and the gate of the second transistor is placed into a floating state. Further, the clock signal is transmitted to the gate of the second transistor through coupling by the capacitance element.

At this time, the clock signals applied to the gates of the first and second transistors have the same phase, and the potential on the high level side of the clock signal applied to the gate of the second transistor becomes the second power supply potential. The second power supply potential is obtained as a potential produced by relatively shifting the potential on the high level side of the clock signal applied to the gate of the first transistor. Further, the amplitude of the clock signals has a value higher than a threshold level Vth of the first and second transistors. Consequently, at a timing at which the first and second transistors are to be turned off, they are placed into an off state with certainty from the relationship of the gate potentials described above. Accordingly, in the complementary circuit formed from the first and second transistors, leak current when the transistors are off can be prevented with certainty.

According to another embodiment of the present invention, there is provided a shift circuit including level shifting means for level-shifting a clock pulse from a first amplitude to a second amplitude when a control pulse is in an active state and outputting the level-shifted clock pulse, and control pulse generation means for generating the control pulse, the level shifting means including first and second transistors of the opposite conduction types to each other connected in series between a first power supply potential and a second power supply potential, a clock terminal to which the clock pulse is inputted, first switch means connected between the clock terminal and the gate of the first transistor and having an on state when the control pulse is in an active state, second switch means connected between the second power supply potential and the gate of the second transistor and having an off state when the control pulse is in an active state, and a capacitance element connected between the clock terminal and the gate of the second transistor.

In the shift circuit with a level shifting function having the configuration described above, when the control pulse is in an active state, the first switch means has an on state, and consequently, the clock pulse is supplied from the clock terminal to the gate of the first transistor through the first switch means. Simultaneously, the second switch means is placed into an off state. Consequently, the supply of the second power supply potential to the gate of the second transistor is interrupted, and the gate of the second transistor is placed into a floating state. Further, the clock pulse is transmitted to the gate of the second transistor through coupling by the capacitance element.

At this time, the clock pulses applied to the gates of the first and second transistors have the same phase, and the potential on the high level side of the clock pulse applied to the gate of the second transistor becomes the second power supply potential. The second power supply potential is obtained as a potential produced by relatively shifting the potential on the high level side of the clock pulse applied to the gate of the first transistor. Further, the amplitude of the clock pulses has a value higher than a threshold level Vth of the first and second transistors. Thus, at a timing at which the first and second transistors are to be turned off, they are placed into an off state with certainty from the relationship of the gate potentials described above. Accordingly, in the complementary circuit formed from the first and second transistors, leak current when the transistors are off can be prevented with certainty.

According to a further embodiment of the present invention, there is provided a shift register circuit including a plurality of first shift circuit pairs and a plurality of second shift circuit pairs connected alternately in cascade connection, each of the first shift circuit pairs including a first shift circuit and a second shift circuit connected in cascade connection while each of the second shift circuit pairs includes a third shift circuit and a fourth shift circuit connected in cascade connection, the first shift circuit being operable, when a first control pulse has an active state, to extract a low level side pulse of a first clock pulse, level-shift the low level side pulse from a first amplitude to a second amplitude, and output the level-shifted low level side pulse, the second shift circuit being operable, when the first control pulse has an active state, to extract a low level side pulse of a second clock pulse having a frequency equal to that of the first clock pulse but having a phase displaced by a ¼ cycle from that of the first clock pulse, level-shift the low level side pulse from the first amplitude to the second amplitude, and output the level-shifted low level side pulse, the third shift circuit being operable, when a second control pulse has an active state, to extract a high level side pulse of the first clock pulse, level-shift the high level side pulse from the first amplitude to the second amplitude, and output the level-shifted high level side pulse, and the fourth shift circuit being operable, when the second control pulse has an active state, to extract a high level side pulse of the second clock pulse, level-shift the high level side pulse from the first amplitude to the second amplitude, and output the level-shifted high level side pulse.

In the shift register circuit having the configuration described above, that a plurality of first shift circuit pairs and a plurality of second shift circuit pairs are connected alternately in cascade connection signifies that the first, second, third, and fourth shift circuits are connected in cascade connection and a plurality of sets of the four shift circuits are disposed repetitively and connected in cascade connection. Then, to the repetitive dispositions of the first, second, third, and fourth shift circuits, the first clock pulse and the second clock pulse having phases displaced by a ¼ cycle from each other are applied alternately. Consequently, the frequency of the clock pulses to be used to drive the shift register circuit can be reduced to one half that of the clock pulses used in the shift register circuit in related art, which is formed from a plurality of shift circuits of the same circuit configuration disposed repetitively. In the first and second shift circuits, a low level (hereinafter referred to as "Low potential") side pulse of each of the first and second clock pulse is extracted to perform level shifting (level conversion). In the third and fourth shift circuits, a high level (hereinafter referred to as "High potential") side pulse of the first and second clock pulses is extracted to perform level shifting. The extracted and level-shifted pulses are outputted as transfer pulses from the individual transfer stages (shift circuits).

In the shift register circuit having the configuration described above, each of the first and second shift circuits may include first and second transistors of the opposite conduction types to each other connected in series between a first power supply potential and a second power supply potential, a first clock terminal to which the first and second clock pulses are inputted, first switch means connected between the first clock terminal and the gate of the first transistor and having an on state when the first control pulse is in an active state, second switch means connected between the second power supply potential and the gate of the second transistor and having an off state when the first control pulse is in an active state, and a first capacitance element connected between the first clock terminal and the gate of the second transistor. Meanwhile, each of the third and fourth shift circuits may include third and fourth transistors of the opposite conduction types to each other connected in series between the first power supply potential and the second power supply potential, a second clock terminal to which the first and second clock pulses are inputted, fifth switch means connected between the second clock terminal and the gate of the third transistor and having an on state when the second control pulse is in an active state, sixth switch means connected between a third power supply potential lower by an amplitude voltage of the first and second clock pulses than the second power supply potential and the gate of the fourth transistor and having an off state when the second control pulse is in an active state, and a second capacitance element connected between the second clock terminal and the gate of the fourth transistor.

In the first and second shift circuits having the configuration described above, since the first switch means has an on state when the first control pulse is in an active state, the clock pulse (first clock pulse to the first shift circuit, and second clock pulse to the second shift circuit) is applied to the gate of the first transistor from the first clock terminal through the first switch means. Simultaneously, the second switch means is placed into an off state. Consequently, the supply of the second power supply potential to the gate of the second transistor is interrupted, and the gate of the second transistor is placed into a floating state. Further, the clock pulse is transmitted to the gate of the second transistor through coupling by the first capacitance element.

At this time, the clock pulses applied to the gates of the first and second transistors have the same phase, and the potential on the high level side of the clock pulse applied to the gate of the second transistor becomes the second power supply potential. The second power supply potential is obtained as a potential produced by relatively shifting the potential on the high level side of the clock pulse applied to the gate of the first transistor. Further, the amplitude of the clock pulses has a value higher than a threshold level Vth of the first and second transistors. Consequently, at a timing at which the first and second transistors are to be turned off, they are placed into an off state with certainty from the relationship of the gate potentials described above. Accordingly, in the complementary circuit formed from the first and second transistors, leak current when the transistors are off can be prevented with certainty. Also in the third and fourth shift circuits, a basically similar operation to that of the first and second shift circuits is performed.

With the level conversion circuit, shift circuit, and shift register circuit, since leak current when the transistors are off can be prevented with certainty, the power consumption can be reduced. Besides, since the level conversion circuit, shift circuit, and shift register circuit have a circuit configuration that does not use a current mirror circuit, they are tough against dispersion in transistor characteristic.

BRIEF DESCRIPTION OF THE DRAWINGS

These and other objects of the invention will be seen by reference to the description, taken in connection with the accompanying drawings, in which.

DETAILED DESCRIPTION OF THE PREFERRED EMBODIMENTS

First Embodiment

Figure 1:
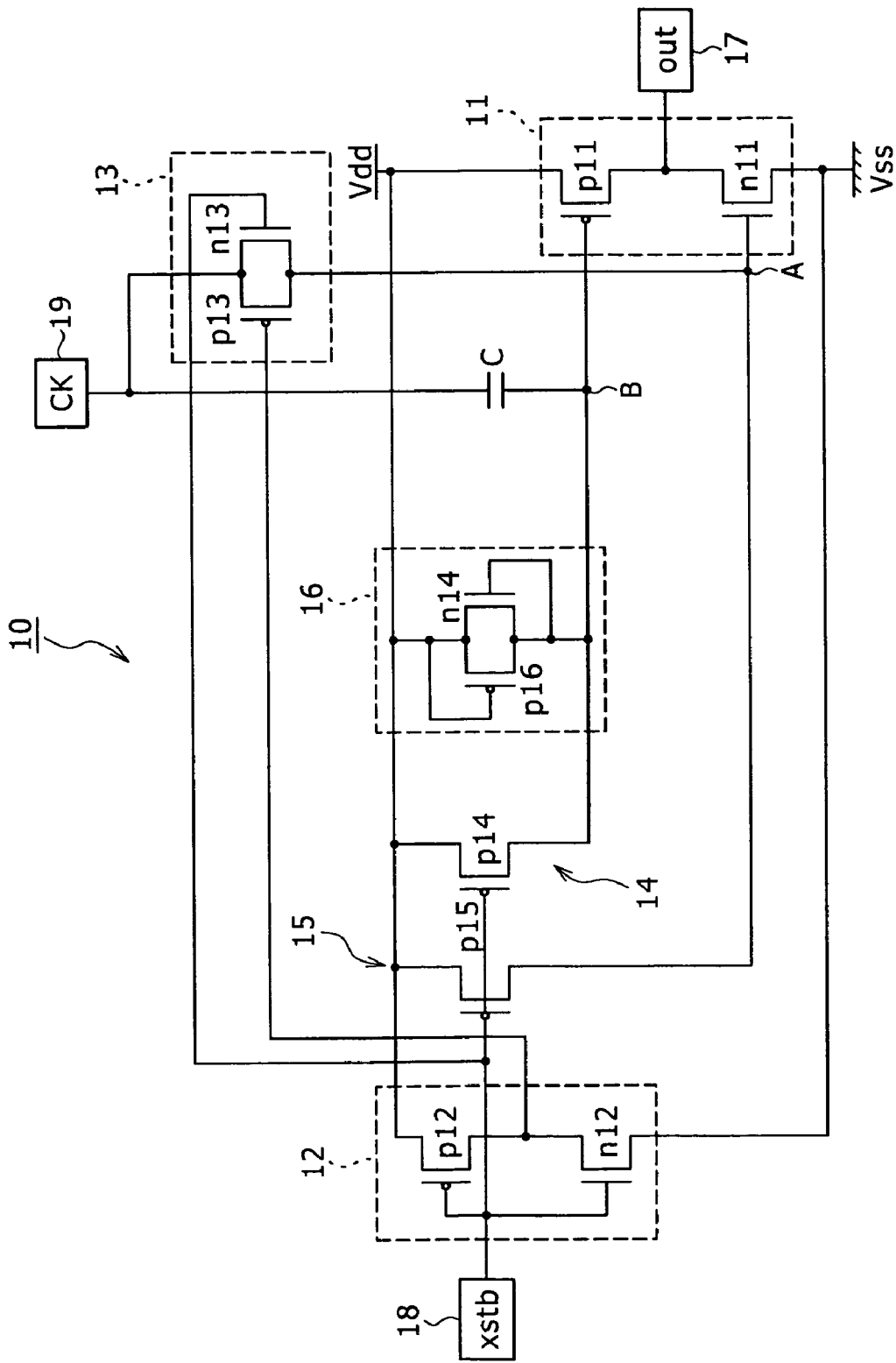
FIG. 1 is a circuit diagram showing a configuration of a level conversion circuit according to a first embodiment of the present invention.

FIG. 1 shows a circuit configuration of a level conversion circuit according to a first embodiment of the present invention. Referring to FIG. 1, the level conversion circuit 10 according to the present embodiment uses a first power supply potential Vss and a second power supply potential Vdd as operation power supply potentials and performs circuit operation of carrying out level conversion (level shifting) of a clock signal CK of a first amplitude, for example, 0 to 3 V into another clock signal of a second amplitude, particularly Vss-Vdd (for example, 0 to 8 V).

The level conversion circuit 10 includes a complementary circuit 11, an inverter 12, first to third switch circuits 13 to 15, a unidirectional circuit 16, and a capacitance element C.

The complementary circuit 11 includes first and second transistors of the opposite conduction types to each other, that is, an NMOS transistor n11 and a PMOS transistor p11, connected in series between the power supply potential Vss and the power supply potential Vdd. The drains of the NMOS transistor n11 and the PMOS transistor p11 are connected to a circuit output terminal 17.

The inverter 12 is connected in series between the power supply potential Vss and the power supply potential Vdd and has a CMOS inverter configuration which includes an NMOS transistor n12 and a PMOS transistor p12 having the gates and the drains individually connected in common. The gates of the NMOS transistor n12 and the PMOS transistor p12 are connected to a control terminal 18 to which a circuit operation control signal "xstb" is supplied from the outside.

The circuit operation control signal "xstb" normally has the power supply potential Vss (hereinafter referred to as "Low potential") when the circuit is in a standby state (in an inoperative state), but normally has the power supply potential Vdd (hereinafter referred to as "High potential") when the circuit is operative.

The first switch circuit 13 is formed from a CMOS switch including an NMOS transistor n13 and a PMOS transistor p13 connected in parallel to each other. The first switch circuit 13 is connected at an input terminal thereof to a clock terminal 19 to which the clock pulse CK of, for example, the amplitude of 0 to 3 V is supplied from the outside, and at an output terminal thereof to the gate of the NMOS transistor n11.

Further, the NMOS transistor n13 is connected at the gate thereof to an input terminal (the gates of the NMOS transistor n12 and the PMOS transistor p12) of the inverter 12. Meanwhile, the PMOS transistor p13 is connected at the gate thereof to an output terminal (the drains of the NMOS transistor n12 and the PMOS transistor p12) of the inverter 12. Consequently, the circuit operation control signal "xstb" is supplied to the gate of the NMOS transistor n13 while a signal having a phase opposite to that of the circuit operation control signal "xstb" is supplied to the gate of the PMOS transistor p13.

It is to be noted that, while a CMOS switch is used as the first switch circuit 13 here, where the High potential of the clock pulse CK is so lower than the power supply potential Vdd that there is no necessity to pay attention to the threshold level Vth of the transistors, a sufficient margin can be assured even with a switch formed only from a single NMOS transistor. Accordingly, in this instance, a switch formed from a single NMOS transistor can be used as the first switch circuit 13. Where a switch formed from a single NMOS transistor is used, there is no necessity to produce the signal having the phase opposite to that of the circuit operation control signal "xstb", and consequently, the inverter 12 can be omitted.

The second switch circuit 14 is formed from a PMOS transistor p14 connected between the power supply potential Vdd and the gate of the PMOS transistor p11 such that it receives the circuit operation control signal "xstb" as an input to the gate thereof. The second switch circuit 14 is placed into an off state when the circuit operation control signal "xstb" has an active state (High potential) to place the gate of the PMOS transistor p11 into a floating state.

The third switch circuit 15 is formed from a PMOS transistor p15 connected between the power supply potential Vdd and the gate of the NMOS transistor n11 such that it receives the circuit operation control signal "xstb" as an input to the gate thereof. The third switch circuit 15 is placed into an off state when the circuit operation control signal "xstb" is in an active state to electrically disconnect the gate of the NMOS transistor n11 and the power supply potential Vdd from each other.

The unidirectional circuit 16 includes an NMOS transistor n14 having a diode connection, that is, having the gate and the drain connected commonly and a PMOS transistor p16 similarly having a diode connection. The unidirectional circuit 16 is connected between the gate of the PMOS transistor p11 and the power supply potential Vdd. The unidirectional circuit 16 is rendered operative when the potential at a node B, that is, the potential at the gate of the PMOS transistor p11, becomes higher than the power supply potential Vdd to correct the potential at the node B so as to be equal to the power supply potential Vdd.

However, even if potential correction at the node B by the unidirectional circuit 16 is performed, actually the potential at the node B drops only to a potential equal to the sum of the threshold level Vth of the MOS transistors n14 and P16 to the power supply potential Vdd.

The capacitance element C is connected to the clock terminal 19 and the gate of the NMOS transistor n11. Consequently, the clock pulse CK is transmitted to the gate of the PMOS transistor p11 through coupling by the capacitance element C.

Now, circuit operation of the level conversion circuit 10 according to the first embodiment having the configuration described above is described with reference to FIGS. 2 to 4.

Figure 2:
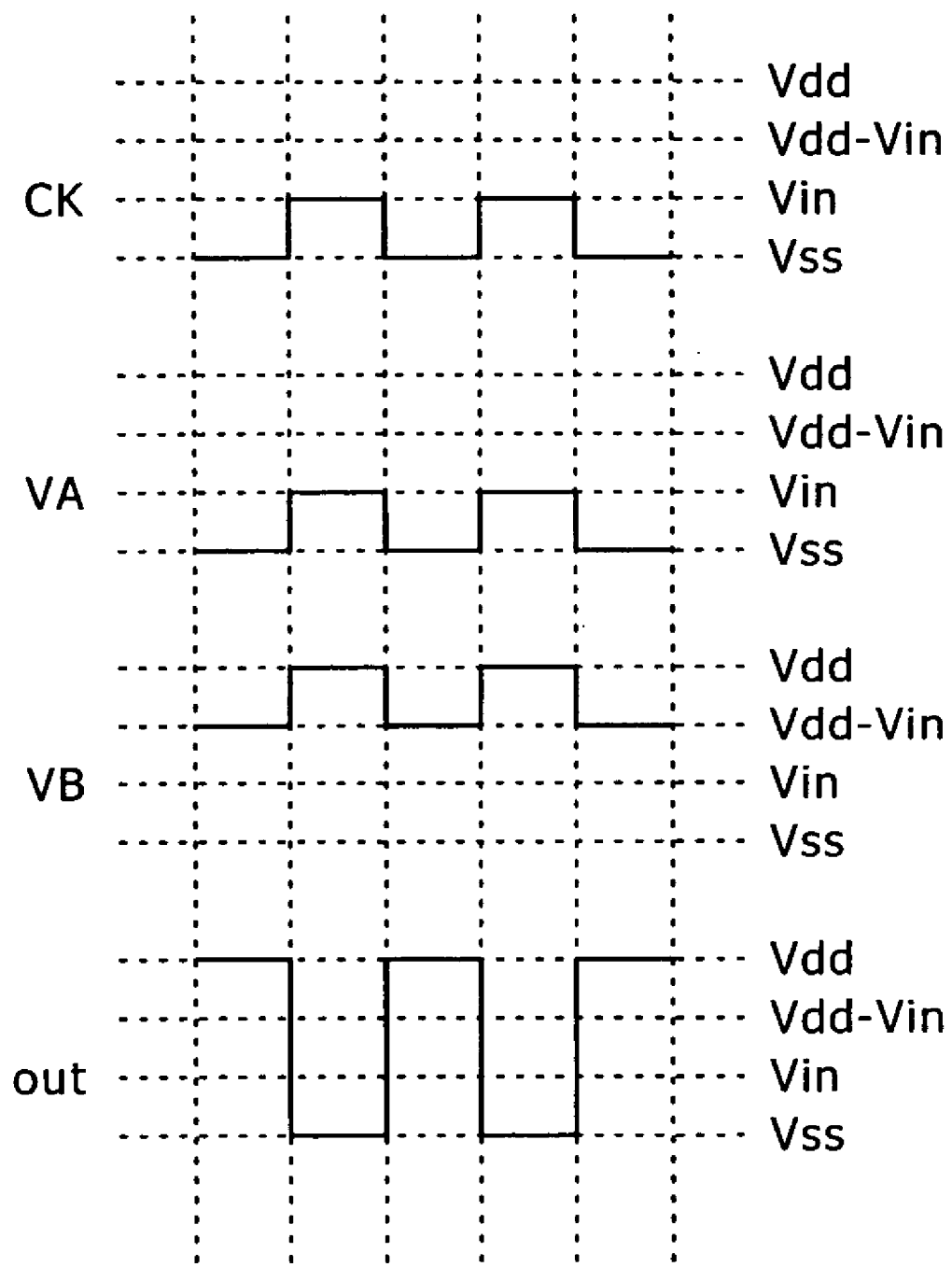
FIG. 2 is a timing chart-illustrating basic circuit operation of the level conversion circuit of FIG. 1 when a circuit operation control signal is in an active state.

First, basic circuit operation of the level conversion circuit 10 when the circuit operation control signal "xstb" is in an active state, that is, has the High level (power supply potential Vdd), is described with reference to FIG. 2.

If the circuit operation control signal "xstb" is placed into an active state, then the first switch circuit 13 is placed into an on state while the second and third switch circuits 14 and 15 are placed into an off state. When the first switch circuit 13 is placed into an on state, the clock pulse CK is applied from the clock terminal 19 to the gate of the NMOS transistor n11 through the first switch circuit 13.

Simultaneously, when the second and third switch circuits 14 and 15 are placed into an off state, supply of the power supply potential Vdd to the gates of the PMOS transistor p11 and the NMOS transistor n11 is interrupted, and the gate of the PMOS transistor p11 is placed into a floating state. Consequently, the clock pulse CK from the clock terminal 19 is transmitted to the gate of the PMOS transistor p11 though the coupling by the capacitance element C.

At this time, while the clock pulses CK applied to the gates of the PMOS transistor p11 and the NMOS transistor n11 have the same phase, the potential on the High side of the clock pulse CK applied to the gate of the PMOS transistor p11 has the power supply potential Vdd. Consequently, the potential VB at the node B, that is, the gate potential of the PMOS transistor p11, is considered as a potential shifted relatively from the potential VA at a node A, that is, the gate potential of the NMOS transistor n11.

Further, the clock pulse CK has an amplitude having a value greater than the threshold level Vth of the PMOS transistor p11 and the NMOS transistor n11. Consequently, at a timing at which the PMOS transistor p11 and the NMOS transistor n11 are to be turned off, they are placed into an off state with certainty from the relationship of the potentials VA and VB at the nodes A and B. Accordingly, the complementary circuit 11 formed from the PMOS transistor p11 and the NMOS transistor n11 can level-convert the clock pulse CK into a clock pulse "out" of the Vss-Vdd amplitude while leak of the MOS transistors p11 and n11 in an off state is prevented with certainty.

Figure 3:
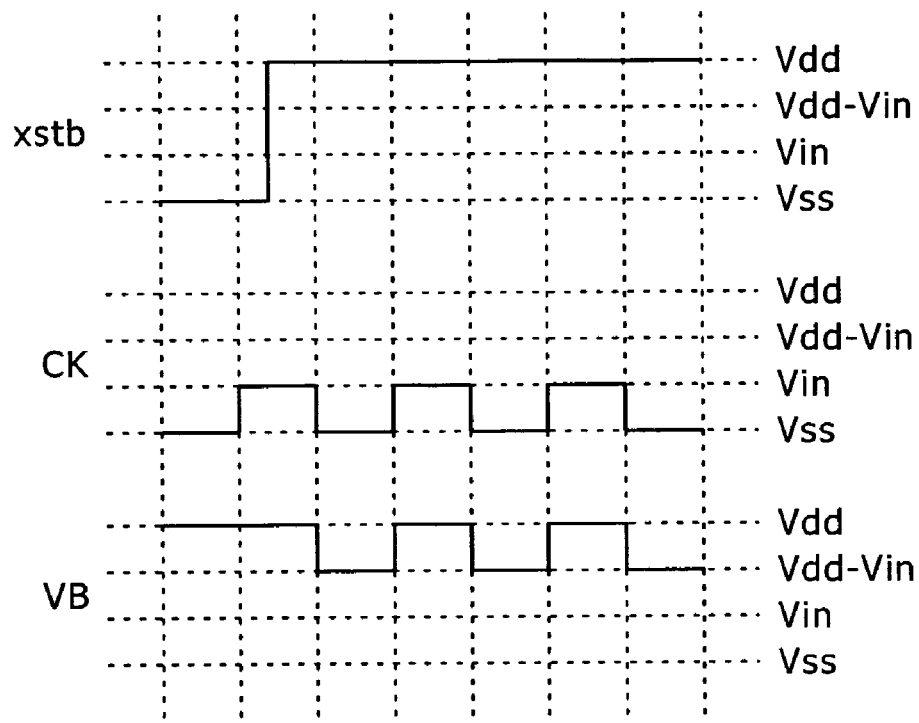
FIG. 3 is a timing chart illustrating a recommended timing of the circuit operation control signal with respect to a clock pulse.

FIG. 3 illustrates a recommended timing of the circuit operation control signal "xstb" with respect to the clock pulse CK. As seen from the timing chart of FIG. 3, the timing of the circuit operation control signal "xstb" is preferably set such that, while the clock pulse CK is in the High state, the circuit operation control signal "xstb" changes from an inactive state into an active state, that is, rises from the Low level to the High level. As a result of such timing setting, immediately before the circuit operation control signal "xstb" rises to the High level, the second switch circuit 14 is in an on state. Consequently, the potential VB at the node B is the power supply potential Vdd, and therefore, the potential VB at the node B behaves in an intended manner from the point of time of starting of driving.

Figure 4:
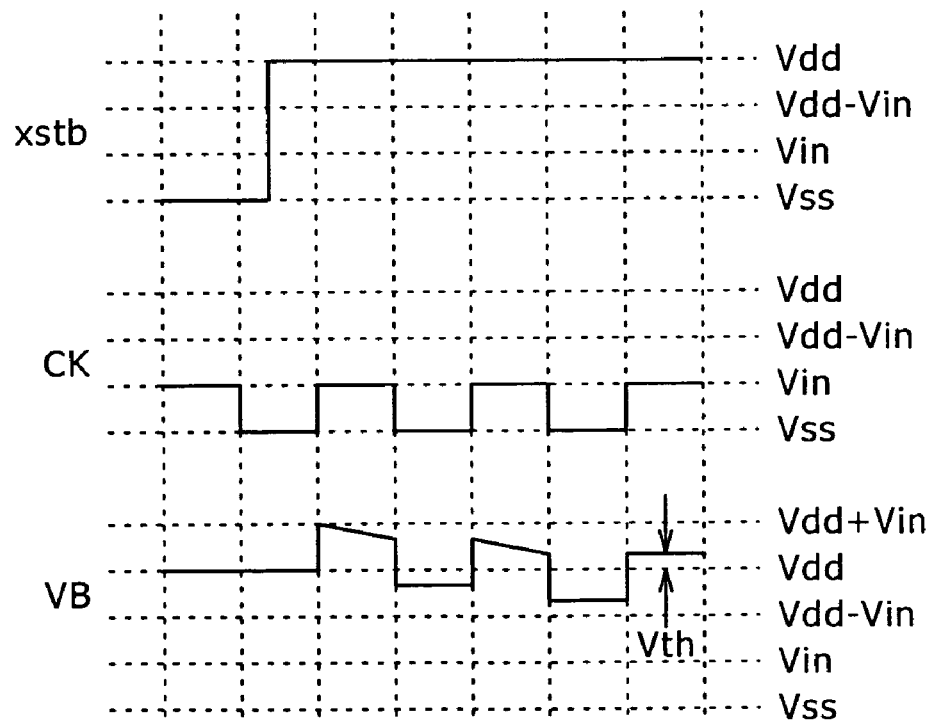
FIG. 4 is a timing chart illustrating a timing relationship when the circuit operation control signal rises to a High level while the clock pulse is in a Low state.

FIG. 4 illustrates a timing relationship when the circuit operation control signal "xstb" rises to the High level while the clock pulse CK is in the Low state. When the circuit operation control signal "xstb" rises to the High level while the clock pulse CK is in the Low state, where the High potential of the clock pulse CK is represented by Vin, the circuit operation starts in a state wherein the potential VB at the node B is pumped up to Vdd+Vin.

In this instance, the potential VB at the node B is corrected so as to become equal to the power supply potential Vdd by the unidirectional circuit 16 which operates when the potential VB at the node B becomes higher than the power supply potential Vdd. Actually, however, the potential at the node B drops only to the potential equal to the sum of the power supply potential Vdd and the threshold level Vth of the MOS transistors n14 and p16.

As apparent from the foregoing, although there is no problem with the circuit operation even where the timing relationship is such as illustrated in FIG. 4, where the interval of time until the circuit operation is assured or further stabilized operation is taken into consideration, it is considered preferable to adopt the timing relationship of FIG. 3, that is, the timing relationship that the circuit operation control signal "xstb" rises to the High level while the clock pulse CK is in the High state.

As described above, the level conversion circuit 10 for level-converting the clock pulse CK of a first amplitude (for example, 0–3 V) into the clock pulse "out" of a second amplitude (for example, 0–8 V) includes, as a basic circuit, the complementary circuit 11 formed from the NMOS transistor n11 and the PMOS transistor p11. Then, upon circuit operation of the level conversion circuit 10, the clock pulse CK is applied to the gate of the NMOS transistor n11 while the clock pulse CK after relatively shifted to the power supply potential Vdd side through the coupling by the capacitance element C is applied to the gate of the PMOS transistor p11. Consequently, at a timing at which the NMOS transistor n11 and the PMOS transistor p11 are to be turned off, they are placed into an off state with certainty. Therefore, no leak current flows to the complementary circuit 11.

Since no leak current flows to the level conversion circuit 10 in this manner, reduction in power consumption of the level conversion circuit 10 can be implemented. Further, since the complementary circuit 11 formed from transistors of the opposite conduction types is used as a basic circuit, the level conversion circuit is tough against the dispersion in transistor characteristic (threshold level Vth, drain-source current Ids, and so forth) when compared with the level conversion circuit in relate art using a current mirror circuit as a basic circuit. Besides, only two signals of the clock pulse CK and the circuit operation control signal "xstb" are required as clock signals to be inputted, and the number of required clock signals can be reduced when compared with the level conversion circuit in related art requiring the clock pulses CK and xCK of the opposite phases.

Second Embodiment

Figure 5:
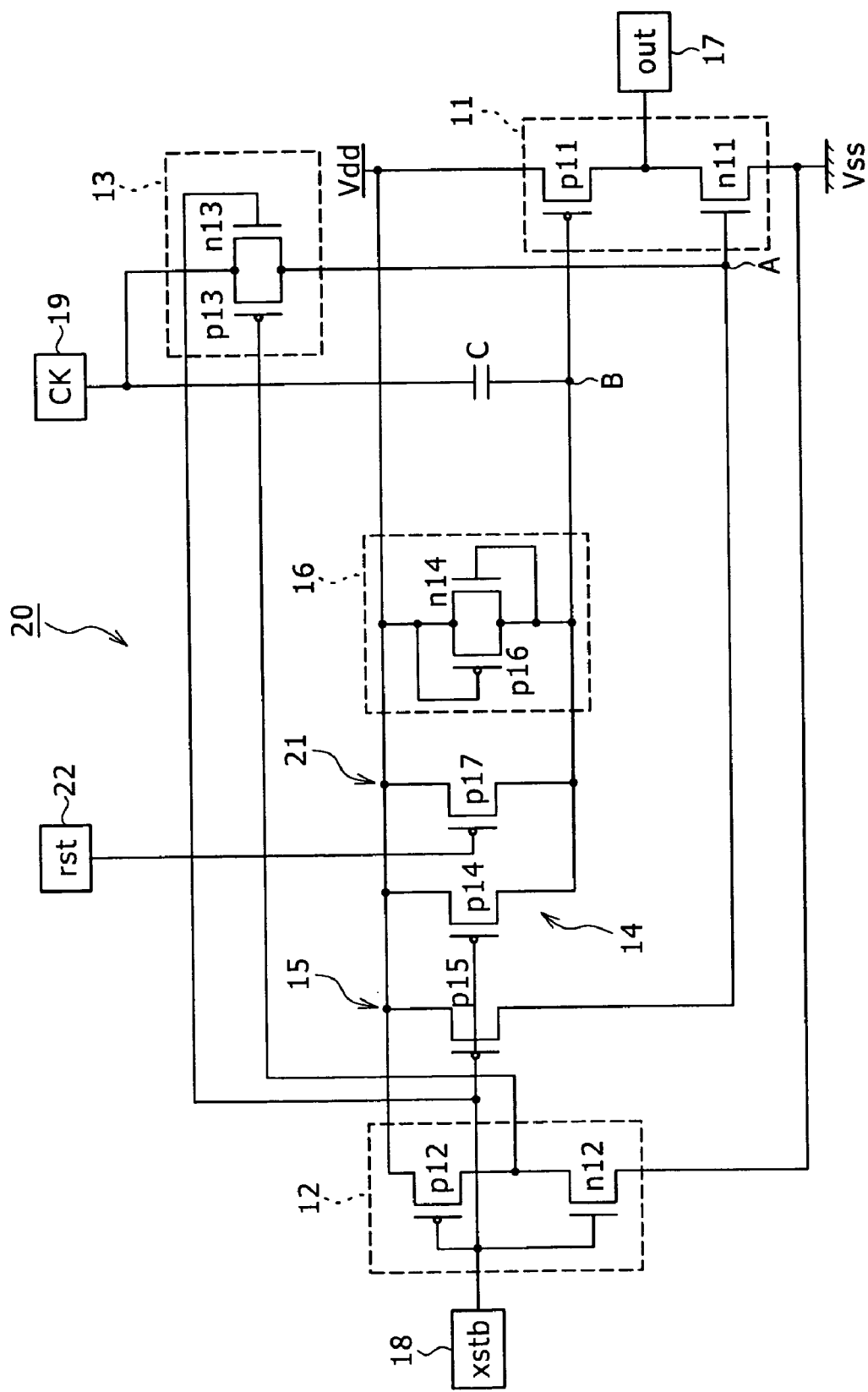
FIG. 5 is a circuit diagram showing a configuration of a level conversion circuit according to a second embodiment of the present invention.

FIG. 5 shows a circuit configuration of a level conversion circuit according to a second embodiment of the present invention.

Referring to FIG. 5, the level conversion circuit 20 according to the second embodiment includes a reset circuit 21 in addition to the components of the level conversion circuit 10 of the first embodiment, that is, the complementary circuit 11, inverter 12, first to third switch circuits 13 to 15, unidirectional circuit 16, and capacitance element C.

The reset circuit 21 is formed from a PMOS transistor p17 connected between the power supply potential Vdd and the gate of the PMOS transistor p11 so as to receive, as a gate input thereto, a reset pulse "rst" applied to a reset terminal 22 from the outside. The reset pulse "rst" is a pulse signal exhibiting the Low level when the clock pulse CK has the High level. The reset circuit 21 is placed into an on state when the level of the reset pulse "rst" is changed into the Low level thereby to supply the power supply potential Vdd to the gate of the PMOS transistor p11.

Now, circuit operation of the level conversion circuit 20 of the second embodiment having the configuration described above is described with reference to FIG. 6.

The reset pulse "rst" has a timing relationship set such that the duty thereof is longer within a Low period than within a High period and the Low period is included in a High period of the clock pulse CK. Here, the Low period of the reset pulse "rst" is required to be a period of time sufficient to charge the potential VB at the node B to the power supply potential Vdd.

Figure 6:
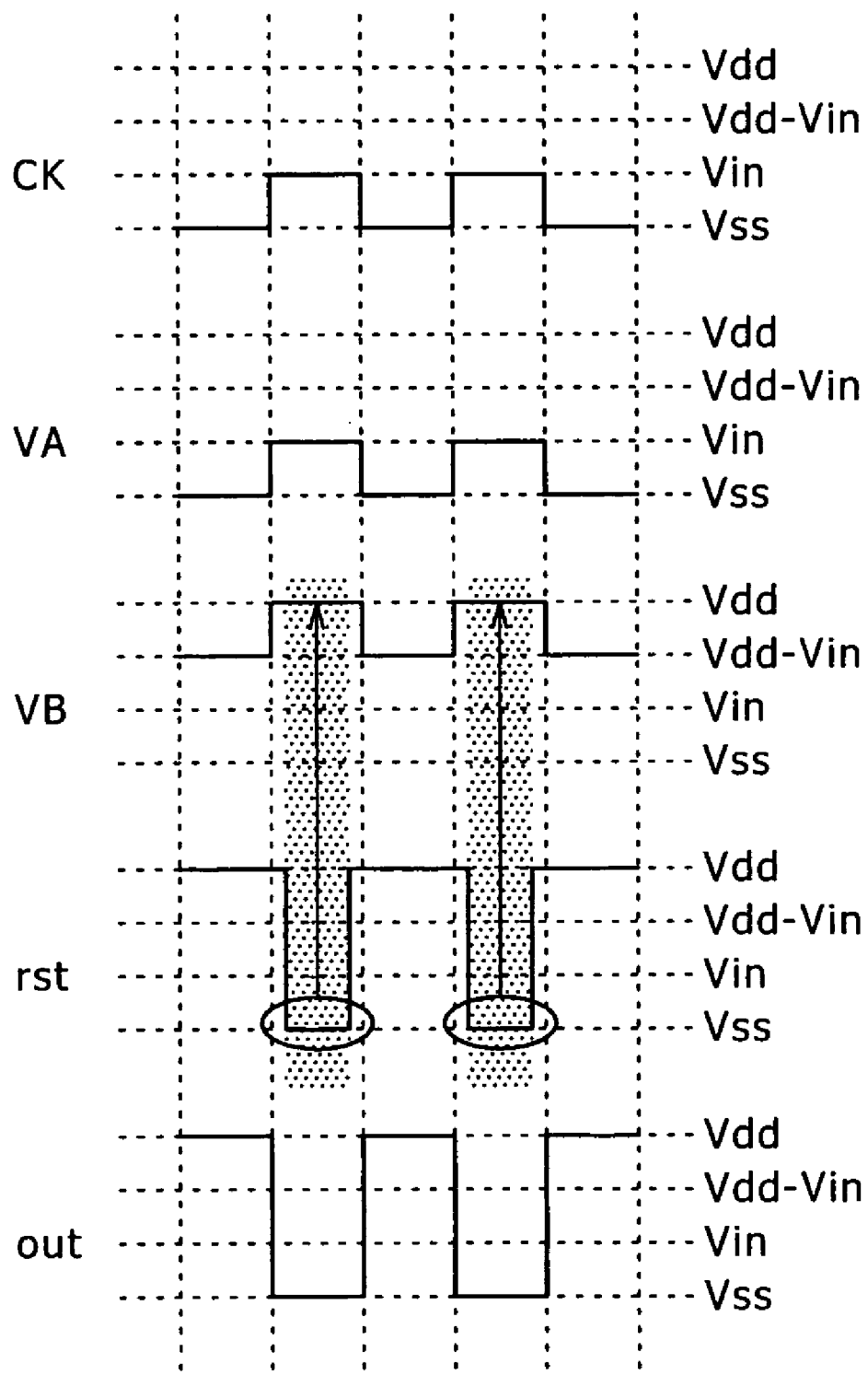
FIG. 6 is a timing chart illustrating circuit operation of the level conversion circuit of FIG. 5.

As can be seen also from the timing chart of FIG. 6, the potential VB at the node B should logically be equal to the power supply potential Vdd. Actually, however, the potential VB at the node B is displaced a little from the power supply potential Vdd. The reset circuit 21 is provided in order to correct the small displacement from the power supply potential Vdd.

In the reset circuit 21, the PMOS transistor p17 is placed into an on state in response to the reset pulse "rst" which exhibits the Low level when the clock pulse CK has the High level. Therefore, every time the clock pulse CK exhibits the High level, the power supply potential Vdd is supplied to the node B (gate of the PMOS transistor p11).

As a result, the potential VB at the node B becomes equal to the power supply potential Vdd with certainty within a High period of the clock pulse CK. In other words, the reset circuit 21 performs an operation of setting the potential VB at the node B with certainty to the power supply potential Vdd periodically, in the present example, after each cycle of the clock pulse CK. Thus, the circuit operation of the level conversion circuit 20 is performed with certainty.

That the circuit operation is performed with certainty is described more particularly below. Within a circuit operation period within which the circuit operation control signal "xstb" has the High level, since the PMOS transistor p14 exhibits an off state, the node B has a floating state. Consequently, the potential VB at the node B is liable to be influenced by mixing-in noise or the like through a parasitic capacitance or the like, and it is necessary to control the potential VB while the floating state is kept. If the potential VB becomes higher than the power supply potential Vdd, then the potential VB at the node B is corrected actually to the potential of Vdd+Vth by action of the unidirectional circuit 16 so that the potential VB becomes equal to the power supply potential Vdd.

However, the unidirectional circuit 16 is a circuit which acts only when the potential VB becomes higher than the power supply potential Vdd. Accordingly, if the potential VB becomes lower than the power supply potential Vdd, then the state wherein the potential VB at the node B is lower than the power supply potential Vdd continues unless the circuit operation control signal "xstb" is placed into the High state after it is returned to the Low state once, and if the potential VB becomes excessively low, then the circuit operation cannot be continued.

In contrast, with the level conversion circuit 20 according to the second embodiment, since the action of setting the potential VB at the node B at which the node B is placed into a floating state with certainty to the power supply potential Vdd periodically within a circuit operation period by the reset circuit 21, particularly such a situation that the potential VB drops excessively can be prevented. Consequently, the circuit operation can be performed with certainty.

The level conversion circuits 10 and 20 can be used widely as a level conversion circuit for level-converting (level-shifting) the clock pulse CK of a first amplitude to the clock pulse "out" of a second amplitude and can be used, as an example, in a power voltage generation circuit. The power voltage generation circuit performs circuit operation based on a clock pulse. In the following, several applications using the level conversion circuit 10 or 20 according to the first or second embodiment in a power supply voltage generation circuit are described.

[Application 1]

Figure 7:
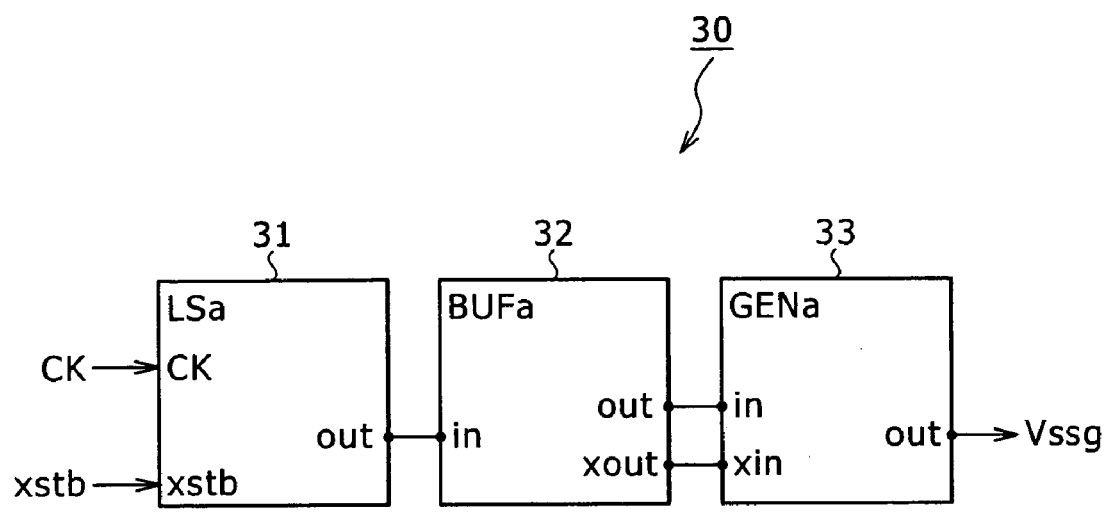
FIG. 7 is a block diagram showing a configuration of a power supply voltage generation circuit according to an Application 1 of the present invention.

FIG. 7 shows a configuration of a power supply voltage generation circuit according to an Application 1 of the present invention. Referring to FIG. 7, the power supply voltage generation circuit 30 according to the present Application 1 includes a level shifting section (LSa) 31, a buffer section (BUFa) 32, and a negative power supply generation section (GENa) 33. Further, the power supply voltage generation circuit 30 includes, as the level shifting section 31 thereof, the level conversion circuit 10 according to the first embodiment or the level conversion circuit 20 according to the second embodiment described above.

Figure 8:
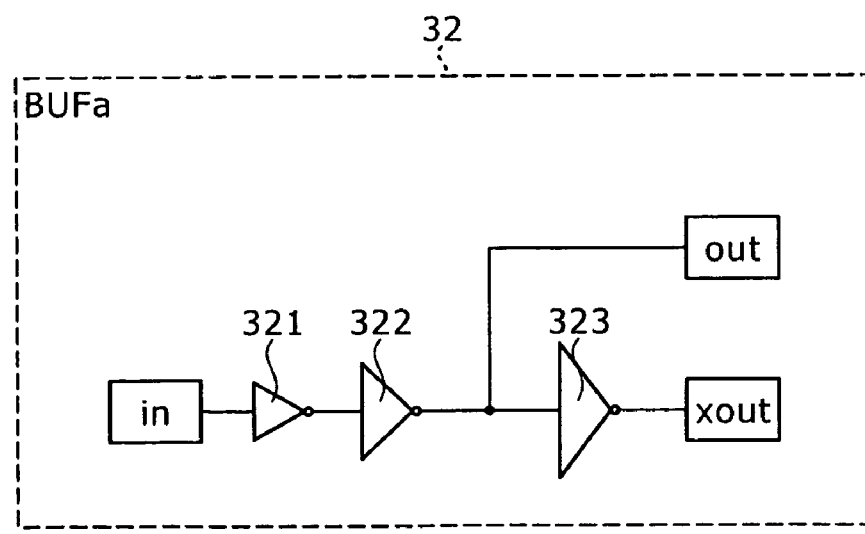
FIG. 8 is a block diagram showing an example of a configuration of a buffer section shown in FIG. 7.

FIG. 8 shows an example of a configuration of the buffer section 32. Referring to FIG. 8, the buffer section 32 shown includes three inverter circuits 321, 322, and 323 connected in cascade connection. The three inverter circuits 321, 322, and 323 are configured such that the transistor size gradually increases from the inverter circuit 321 on the input side to the inverter circuit 323 on the output side in order to assure a driving capacity for the succeeding stage.

Figure 9:
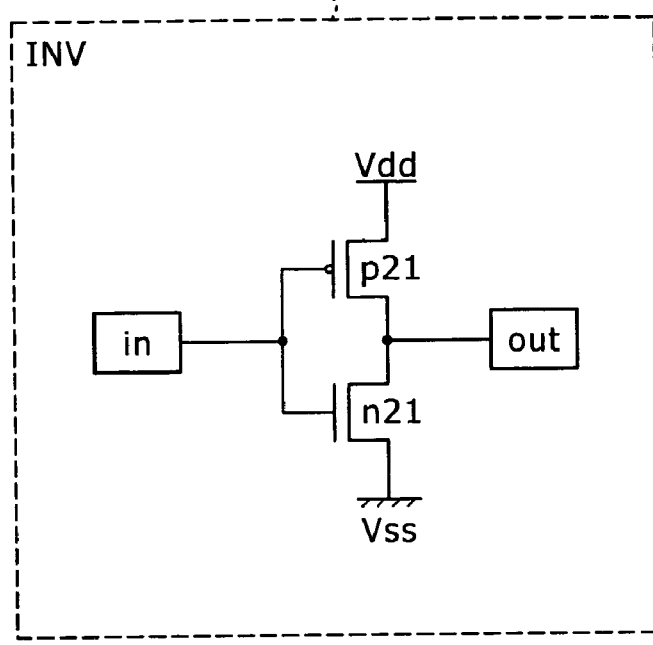
FIG. 9 is a circuit diagram showing an example of a configuration of an inverter circuit shown in FIG. 8.

Referring to FIG. 9, for the inverter circuits 321, 322, and 323, for example, a CMOS inverter is used wherein a PMOS transistor p21 and an NMOS transistor n21 are connected in series between the power supply potential Vdd and the power supply potential Vss such that the gates and the drains thereof are individually connected to each other. Naturally, however, the inverter circuits 321, 322, and 323 need not necessarily be formed from a CMOS inverter.

Figure 10:
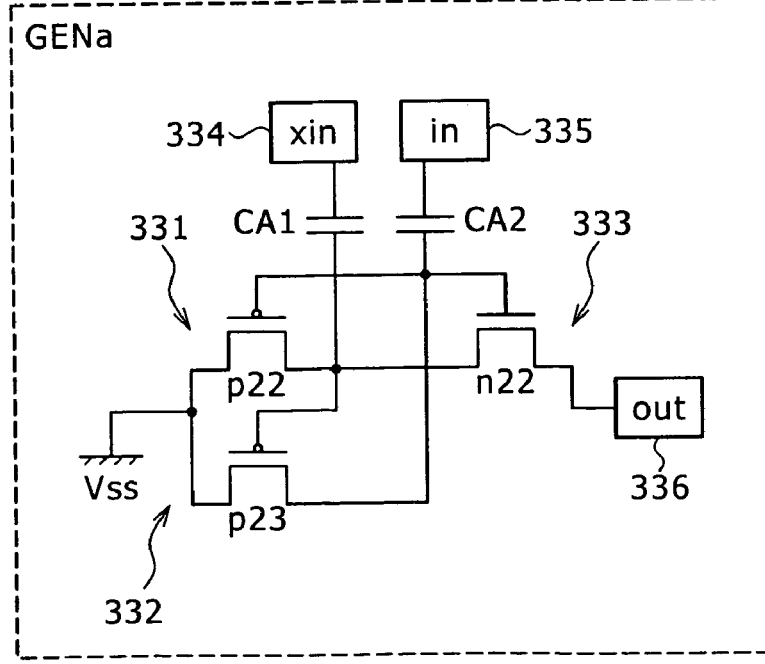
FIG. 10 is a circuit diagram showing an example of a configuration of a negative power supply generation section shown in FIG. 7.

FIG. 10 shows an example of a configuration of the negative power supply generation section 33. Referring to FIG. 10, the negative power supply generation section 33 shown includes two capacitors CA1 and CA2, two clamp circuits 331 and 332, and a sampling circuit 333. The clock pulses "xin" and "in" of the opposite phases are inputted to the negative power supply generation section 33 through clock terminals 334 and 335, respectively. The clock pulses "xin" and "in" of the opposite phases are obtained by passing the clock pulse "out" of the Vss-Vdd amplitude level-converted by the level shifting section 31 through the buffer section 32.

The two capacitors CA1 and CA2 act to cut the DC component of the clock pulses "xin" and "in", respectively. The clamp circuit 331 is formed from a PMOS transistor p22 connected between an output terminal of the capacitor CA1 and the power supply potential Vss and is connected to an output terminal of the capacitor CA2, and clamps the output level of the capacitor CA1 at the power supply potential Vss. The clamp circuit 332 is formed from a PMOS transistor p23 connected between the output terminal of the capacitor CA2 and the power supply voltage Vss and connected to the output terminal of the capacitor CA1 and clamps the output level of the capacitor CA2 at the power supply potential Vss.

The sampling circuit 333 is formed from an NMOS transistor n22 connected between the output terminal of the capacitor CA1 and a circuit output terminal 336 and connected to the output terminal of the capacitor CA2, and samples the clamp output of the clamp circuit 331 based on the clamp output of the clamp circuit 332. A negative power supply potential −Vdd is outputted from the circuit output terminal 336 as a result of operation of the clamp circuits 331 and 332 and the sampling circuit 333.

As described above, where the level conversion circuit 10 or 20 according to the first or second embodiment described hereinabove is used as the level shifting section 31 in the power supply voltage generation circuit 30 having the level shifting section 31, buffer section 32, and negative power supply generation section 33, since leak current can be prevented in the level conversion circuit 10 or 20, the power consumption can be suppressed low. Consequently, low power consumption of the power supply voltage generation circuit 30 can be achieved.

[Application 2]

Figure 11:
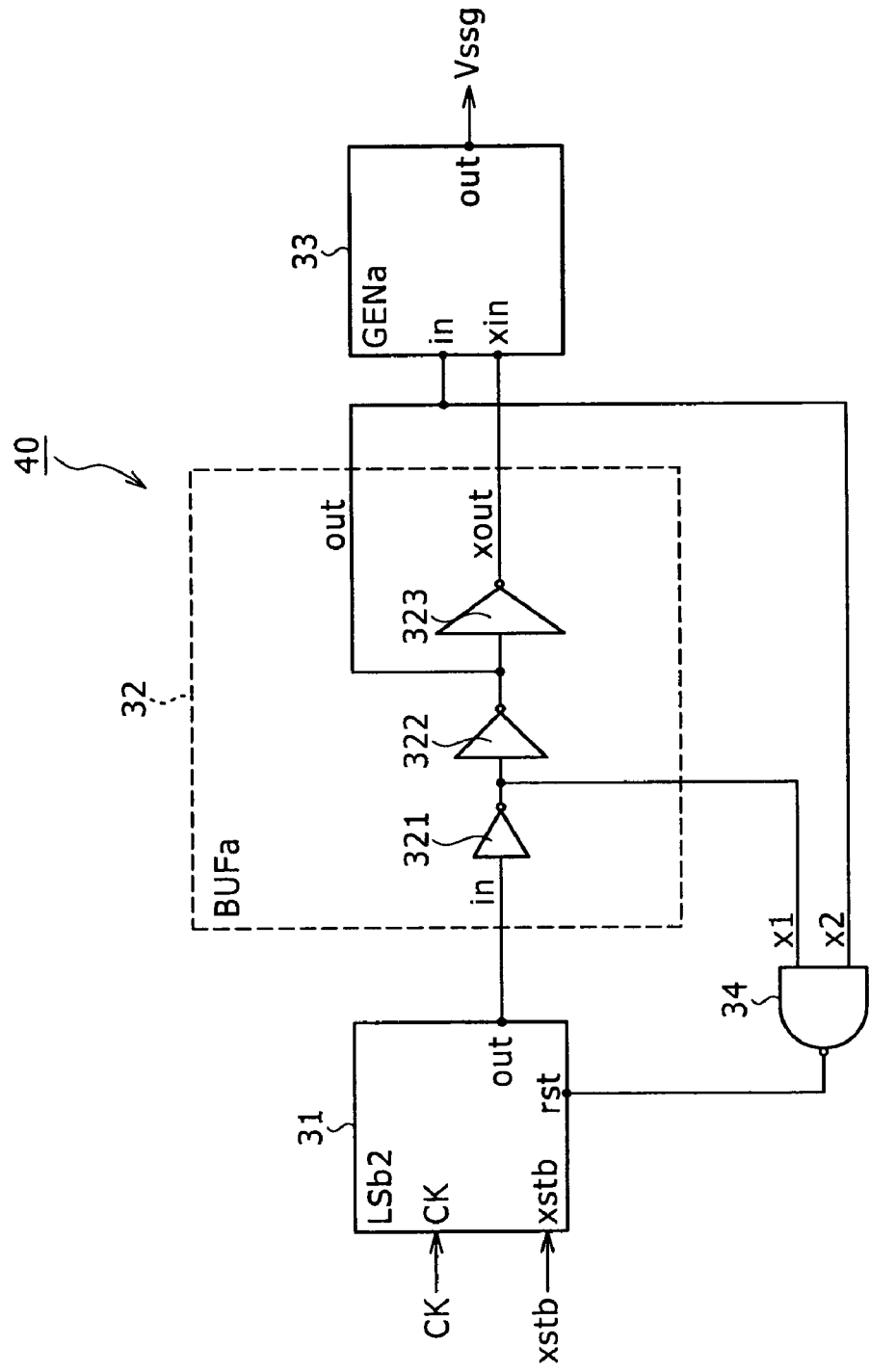
FIG. 11 is a circuit diagram showing a configuration of a power supply voltage generation circuit according to an Application 2 of the present invention.

FIG. 11 shows a configuration of a power supply voltage generation circuit according to an Application 2 of the present invention.

Referring to FIG. 11, in the power supply voltage generation circuit 40 according to the Application 2, the level conversion circuit 20 according to the second embodiment is used as the level shifting section 31. The level conversion circuit 20 according to the second embodiment is configured such that it includes the reset circuit 21 for setting the potential VB at the node B, which is placed into a floating state within a circuit operation period, with certainty to the power supply potential Vdd periodically. Accordingly, the reset pulse "rst" for controlling the reset circuit 21 is required.

The power supply voltage generation circuit 40 according to the Application 2 is characterized in that the reset pulse "rst" is produced in the inside of the power supply voltage generation circuit 40 making use of a delay in the power supply voltage generation circuit 30. More particularly, an output x1 of the inverter circuit 321 at the first stage of the buffer section 32 and an output x2 of the inverter circuit 322 at the second stage are extracted and inputted to two inputs of a NAND circuit 34 so that the reset pulse "rst" that is Low active is produced as an output of the NAND circuit 34.

Figure 12:
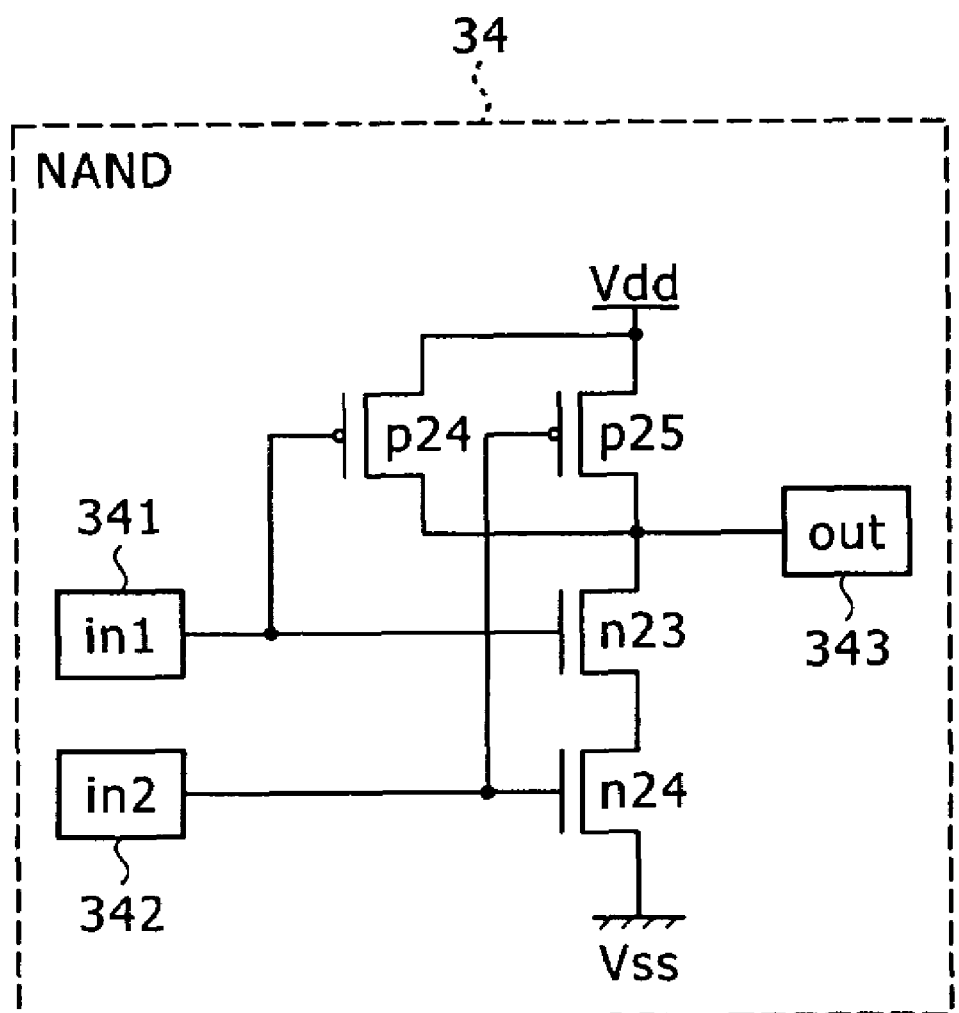
FIG. 12 is a circuit diagram showing an example of a configuration of a NAND circuit shown in FIG. 11.

FIG. 12 shows an example of a configuration of the NAND circuit 34. Referring to FIG. 12, the NAND circuit 34 shown includes NMOS transistors n23 and n24 connected in series to each other between a circuit output terminal 343 and the power supply potential Vss and connected at the gates thereof to circuit input terminals 341 and 342, and PMOS transistors p24 and p25 connected in parallel to each other between the power supply potential Vdd and the circuit output terminal 343 and connected at the gates thereof to the circuit input terminals 341 and 342, respectively. It is to be noted that the circuit configuration described is a mere example and the configuration of the NAND circuit 34 is not limited to the circuit configuration just described.

Figure 13:
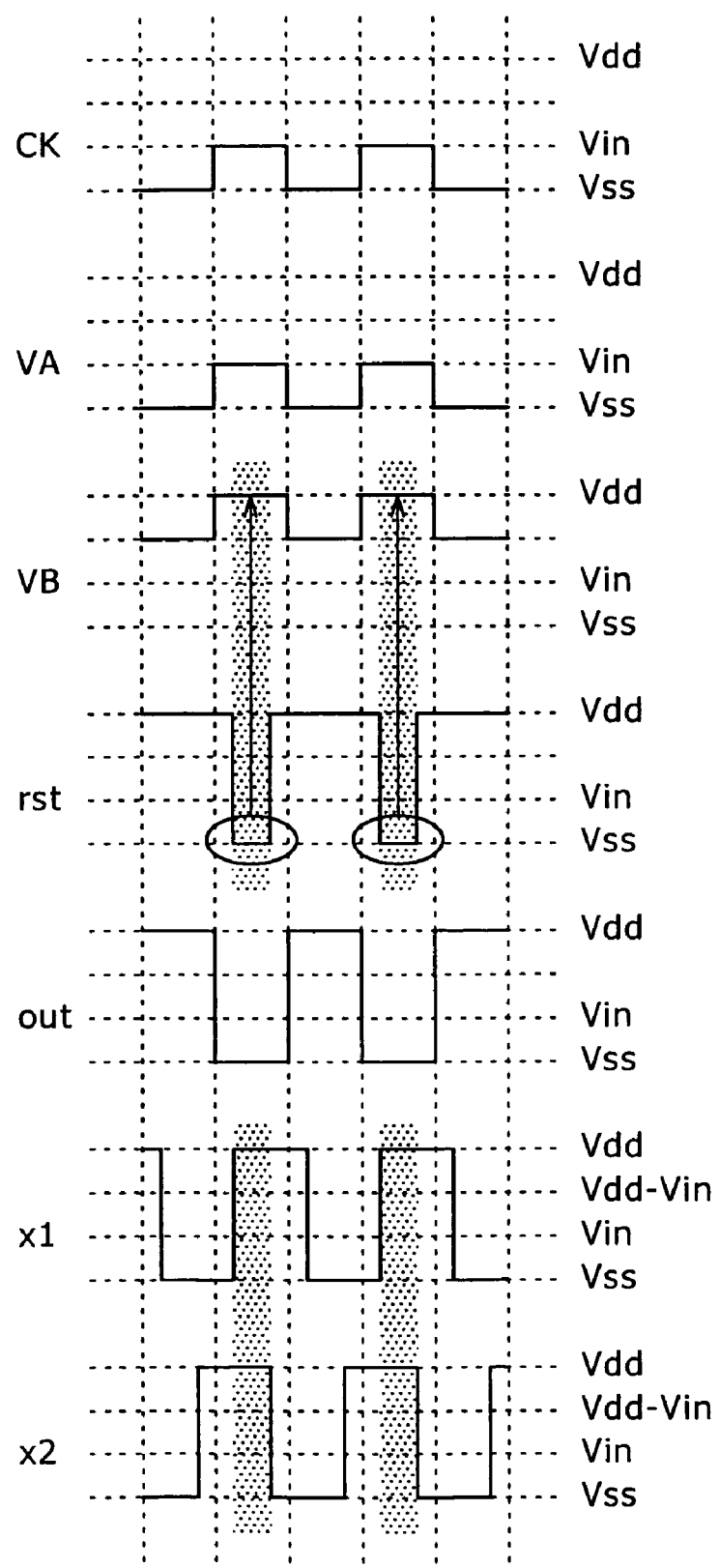
FIG. 13 is a timing chart illustrating a timing relationship where a rest pulse is produced based on outputs of a buffer section shown in FIG. 11.

FIG. 13 illustrates a timing relationship in production of the reset pulse "rst" based on the outputs x1 and x2 of the buffer section 32. As can be seen from FIG. 13, the Low-active reset pulse "rst" can be produced in the power supply voltage generation circuit 40 by performing NANDing operation between the output x1 of the inverter circuit 321 at the first stage and the output x2 of the inverter circuit 322 at the second stage making use of a delay by the power supply voltage generation circuit 30.

Where a greater delay is required in the buffer section 32, a method wherein the number of stages of inverters in the buffer section 32 is increased (the number should be an odd number), another method wherein a circuit constant which may give rise to a further delay is set or the like may be adopted.

Where, in the power supply voltage generation circuit 40, which uses the level conversion circuit 20 according to the second embodiment is used as the level shifting section 31, the Low-active reset pulse "rst" is produced in the inside of the power supply voltage generation circuit 40 making use of a delay in the buffer section 32, the necessity for inputting the reset pulse "rst" from the outside is eliminated. Consequently, the terminal for taking in the reset pulse "rst" can be eliminated.

It is to be noted that, while, in the Applications 1 and 2 described above, the power supply voltage generation circuits 30 and 40 are formed as a negative power supply voltage generation circuit including the negative power supply generation section 33, also a positive power supply voltage generation circuit having a positive power supply section can be applied similarly.

The power supply voltage generation circuits 30 and 40 according to the Applications 1 and 2 can be used widely as a power supply voltage generation circuit performing circuit operation based on a clock pulse. As an example, the power supply voltage generation circuits 30 and 40 can be used as one of peripheral driving circuits for a display apparatus of the type integrated with a driving circuit. In the display apparatus, the peripheral driving circuits, which are used to drive a pixel array section wherein pixels including electro-optical elements are arrayed two-dimensionally in rows and columns, are formed on a board on which the pixel array section is formed.

APPLIED EXAMPLE 1

Figure 14:
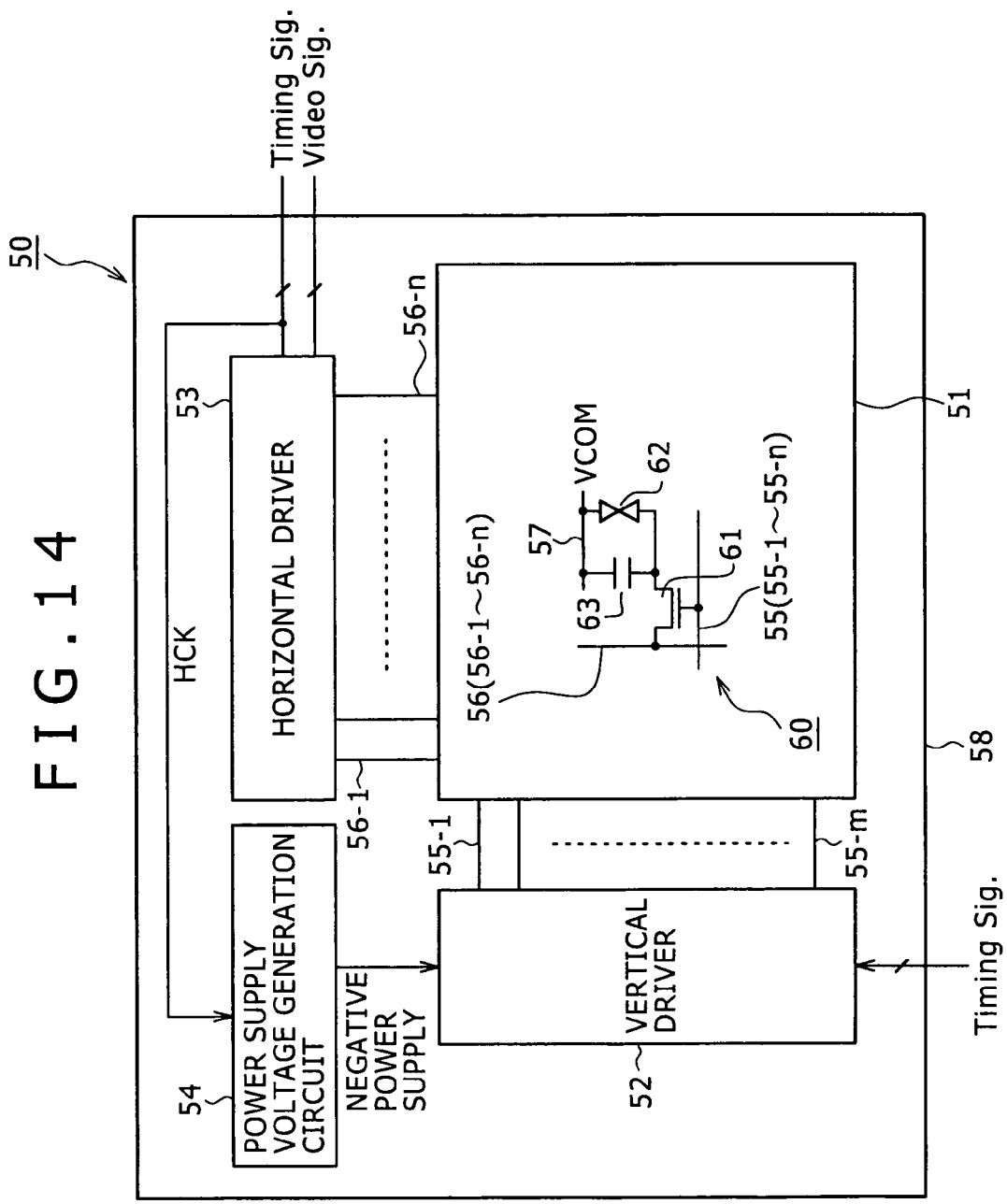
FIG. 14 is a block diagram showing an example of a configuration of an active matrix type liquid crystal display apparatus according to an applied example of the present invention.

FIG. 14 shows an example of a configuration of a display apparatus according to an Applied Example of the present invention. The display apparatus shown in FIG. 14 is formed as an active matrix type liquid crystal display apparatus wherein a liquid crystal cell is used as an electro-optical element of a pixel.

Referring to FIG. 14, the active matrix type liquid crystal display apparatus 50 according to the present Applied Example includes a pixel array section 51, a vertical driver 52, a horizontal driver 53, a power supply voltage generation circuit 54, and so forth. Peripheral driving circuits including the vertical driver 52, horizontal driver 53, and power supply voltage generation circuit 54 are formed on a liquid crystal panel 58 on which the pixel array section 51 is provided. The liquid crystal panel 58 is configured such that two insulating substrates such as, for example, glass substrates are disposed in an opposing relationship with a fixed gap left therebetween, and a liquid crystal material is encapsulated in the gap.

The pixel array section 51 has pixels 60 disposed two-dimensionally in m rows and n columns thereon. Further, on the matrix array of the pixels 60, scanning lines 55-1 to 55-m are wired for the individual rows and signal lines 56-1 to 56-n are wired for the individual columns. Each of the pixels 60 includes a TFT (Thin Film Transistor) 61 as a pixel transistor, a liquid crystal cell 62 having a pixel electrode connected to the drain electrode of the TFT 61, and a retention capacitor 63 connected at one of electrodes thereof to the drain electrode of the TFT 61.

In the pixel structure described, the TFT 61 of each of the pixels 60 is connected at the gate electrode thereof to a scanning line 55 (55-1 to 55-m) and at the source electrode thereof to a signal line 56 (56-1 to 56-n). Meanwhile, an opposing electrode of the liquid crystal cell 62 and the other electrode of the retention capacitor 63 are connected to a common line 57 to which a common voltage VCOM is applied.

The vertical driver 52 is formed from a shift register or the like and selects the pixels 60 of the pixel array section 51 in a unit of a row. The horizontal driver 53 is formed from a shift register, sampling switches, or the like and writes a video signal inputted from the outside of the panel sequentially in a unit of a pixel (dot-sequentially) or simultaneously in a unit of a row (line-sequentially) into the pixels 60 of the row selected by the vertical driver 52.

The power supply voltage generation circuit 54 is a circuit which generates, for example, a negative power supply voltage and is built in a peripheral driving circuit for the pixel array section 51, for example, in the vertical driver 52 in order to supply the negative power supply voltage. As the power supply voltage generation circuit 54, the power supply voltage generation circuit 30 or 40 according to the Application 1 or 2 described hereinabove may be used.

The power supply voltage generation circuit 54 receives, as an input thereto, for example, a clock pulse having a frequency higher than that of a vertical clock pulse VCK, which is inputted as a reference for vertical scanning of the vertical driver 52. For example, the circuit 54 receives a horizontal clock pulse HCK, which is inputted as a reference for horizontal scanning of the horizontal driver 53. The power supply voltage generation circuit 54 thus operates based on the horizontal clock pulse HCK to produce a negative power supply voltage and supplies the negative power supply voltage to the negative power supply lines at the output stage of the vertical driver 52.

In other words, the horizontal clock pulse HCK corresponds to the clock pulse CK inputted to the level shifting section 31 in the power supply voltage generation circuit 30 or 40 according to the Application 1 or 2 described hereinabove. It is to be noted that the input clock pulse to the power supply voltage generation circuit 54 is not limited to the horizontal clock pulse HCK.

The peripheral driving circuits including the vertical driver 52, horizontal driver 53, and power supply voltage generation circuit 54 described above are formed on the liquid crystal panel (insulating substrate) 58 using polycrystalline silicon TFTs together with the pixel array section 51.

Incidentally, in recent years, a request for reduction of the voltage, enhancement in performance such as increase of the contrast, and enhancement of the picture quality of a liquid crystal display apparatus has been and is increasing. Generally, increase of the contrast and reduction of the voltage are demands contrary to each other. In particular, in order to increase the contrast, it is necessary to increase the amplitude of the video signal to be inputted to the liquid crystal display apparatus, and as a result, the driving voltage of the liquid crystal display apparatus becomes higher, resulting in failure to reduce the voltage. On the contrary, in order to reduce the voltage, the amplitude of video signal is decreased, which results in decrease of the contrast.

In order to satisfy both of reduction of the voltage and increase of the contrast, it is considered necessary to adopt a method wherein the level of the low voltage side of the video signal is reduced as low as possible (is reduced so as to approach the ground level) and also the termination value of the video signal is lowered and besides the high voltage side of the video signal is lowered while the dynamic range of the video signal is raised.

However, if the method described is adopted, then there is the possibility that, if the threshold level Vth of the TFT 61, which holds the high voltage side of the video signal, is displaced to the depression, then when the scanning line 55 (55-1 to 55-m) has the 0 V and the signal line 56 (56-1 to 56-n) has the Low level, the TFT 61 may leak to generate a bright point called bright point by leak. However, if the Low level of the scanning line 55 (55-1 to 55-m) can be set to a negative potential, then a sufficient margin to the bright point by leak can be taken sufficiently.

Therefore, as described above, in the liquid crystal display apparatus 50 integrated with a driving circuit, the power supply voltage generation circuit 54 is integrated as one of peripheral driving circuits on the liquid crystal panel 58, and a negative power supply voltage generated by the power supply voltage generation circuit 54 is supplied to the vertical driver 52 so that the Low level of the scanning line 55 (55-1 to 55-m) is set to a negative level. Consequently, since it is possible to reduce the level of the low voltage side of the video signal as low as possible and lower the termination value of the video signal together and besides lower the high voltage side of the video signal while the dynamic range of the video signal is raised, both of reduction of the voltage and increase of the contrast can be achieved simultaneously without allowing appearance of a bright point by leak.

Further, since the power supply voltage generation circuit 54 is formed on the liquid crystal panel 58, there is no necessity to provide a power supply voltage generation circuit outside the liquid crystal panel 58. Besides, since the necessity for a terminal for taking in the negative power supply voltage from the outside of the panel is eliminated, the burden upon set design can be reduced.

Further, where the power supply voltage generation circuit 30 or 40 according to the Application 1 or 2 described hereinabove is used as the power supply voltage generation circuit 54, since the power supply voltage generation circuit 30 or 40 uses the level conversion circuit 10 or circuit 20 as the level shifting section 31, leak current can be prevented. Therefore, the power consumption can be reduced, and consequently, reduction of the power consumption by the active matrix type liquid crystal display apparatus 50 can be achieved.

Particularly where the power supply voltage generation circuit 40 according to the Application 2 is used as the power supply voltage generation circuit 54, circuit operation can be performed with certainty. In addition, since the power supply voltage generation circuit 54 generates the reset pulse "rst" in the inside thereof and there is no necessity to take in the reset pulse "rst" from the outside of the liquid crystal panel 58, there is an advantage that there is no necessity to provide a terminal for exclusive use to take in the reset pulse "rst".

It is to be noted that, while, in the Applied Example described above, a negative power supply voltage generated by the power supply voltage generation circuit 54 is supplied to the vertical driver 52, the object of the supply of the negative power supply voltage is not limited to the vertical driver 52 but may be any of the peripheral driving circuits requiring a negative power supply voltage. Further, the power supply voltage generation circuit 54 is not limited to a circuit generating a negative power supply voltage but may be formed as another circuit alternatively generating a positive power supply voltage.

Further, while, in the Applied Example described above, the power supply voltage generation circuit 30 or 40 is applied to a liquid crystal display apparatus wherein a liquid crystal cell is used as an electro-optical element of a pixel, the application of the power supply voltage generation circuit 30 or 40 is not limited to that to a liquid crystal display apparatus. In particular, the power supply voltage generation circuit 30 or 40 can be applied to general display apparatus wherein a driving circuit, which uses a negative power supply voltage, is formed on a board on which the pixel array section is formed. The example of the apparatus is an EL (Electro Luminescence) display apparatus that an EL element is used as an electro-optical element of a pixel.

Third Embodiment

Figure 15:
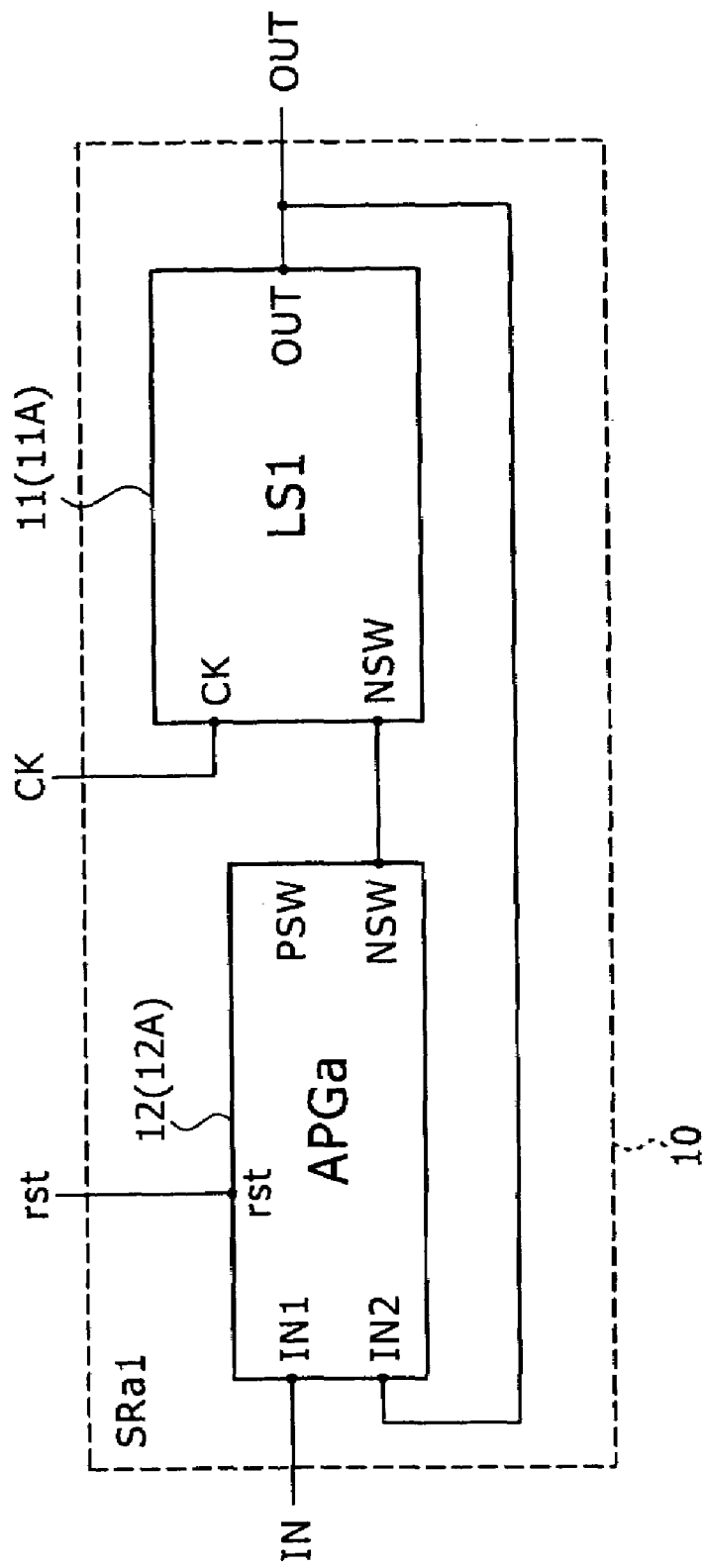
FIG. 15 is a circuit diagram showing a circuit configuration of a shift circuit according to a third embodiment of the present invention.

FIG. 15 shows a circuit configuration of a shift circuit according to a third embodiment of the present invention. Referring to FIG. 15, the shift circuit 10 includes a level shifting section 11 and a control pulse generation section 12.

The level shifting section 11 level shifts, when a control pulse NSW supplied thereto from the control pulse generation section 12 is in an active state, a clock pulse CK from the VSS-Vin amplitude (for example, 0 to 3 V) to the VSS-VDD amplitude (for example, 0 to 8 V) and outputs the level-shifted clock pulse CK as an output pulse OUT. It is to be noted that it is necessary for the High potential Vin of the clock pulse CK to be higher than the threshold level Vth of the transistors (VDD>Vin>Vth). The control pulse generation section 12 generates a pulse exhibiting an active state only for a period of time of one cycle of the clock pulse CK and supplies the pulse as the control pulse NSW to the level shifting section 11.

Figure 16:
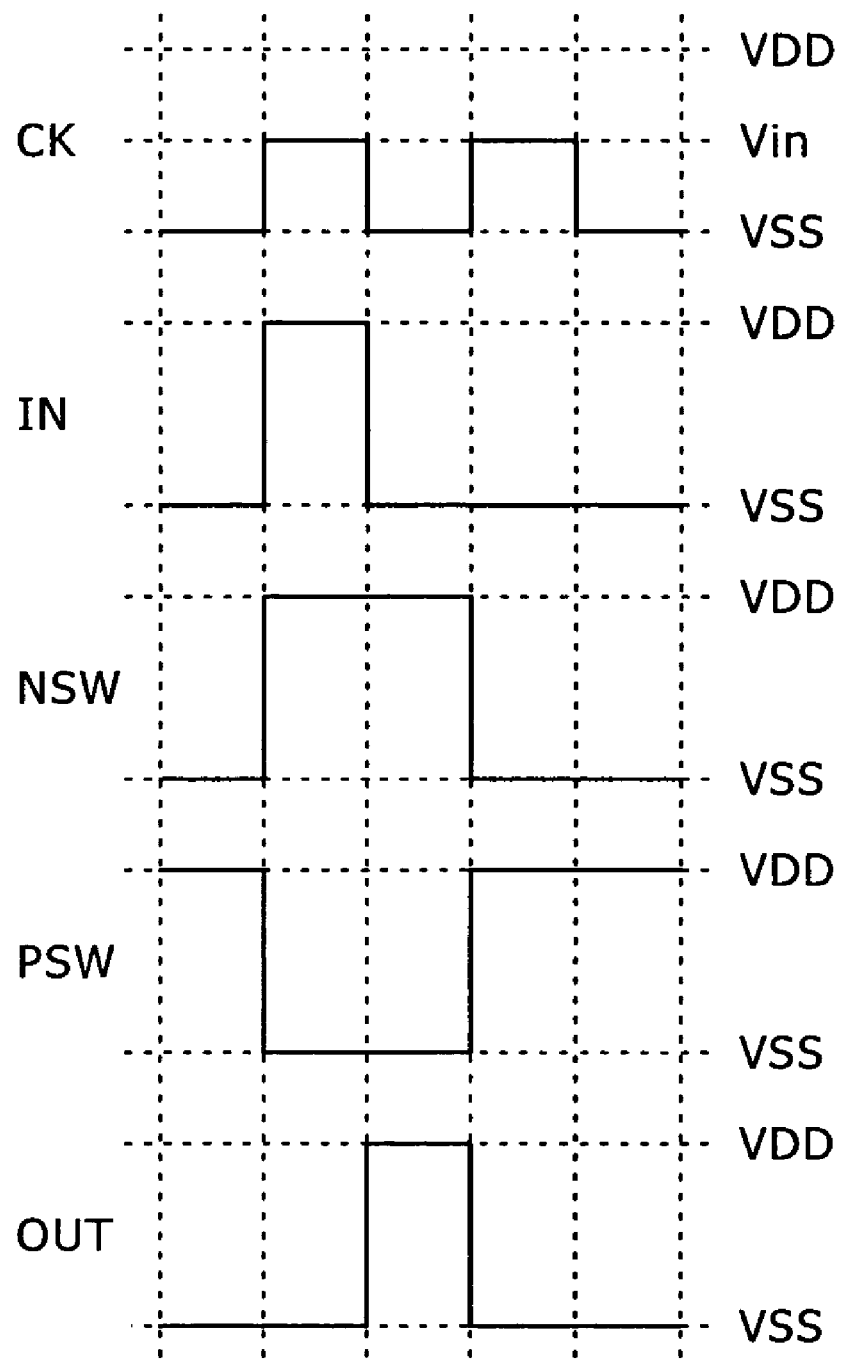
FIG. 16 is a timing chart illustrating a level relationship and a timing relationship of a clock pulse, an input pulse, a control pulse, an opposite phase control pulse, and an output pulse of the shift circuit of FIG. 15.

FIG. 16 illustrates a level relationship and a timing relationship of the clock pulse CK, an input pulse IN to the control pulse generation section 12, the control pulse NSW, an opposite phase control pulse PSW to the control pulse NSW, and the output pulse OUT.

A particular circuit configuration of each of the level shifting section 11 and the control pulse generation section 12 is described. First, the level shifting section 11 is described.

[Form 1 of the Level Shifting Section 11]

Figure 17:
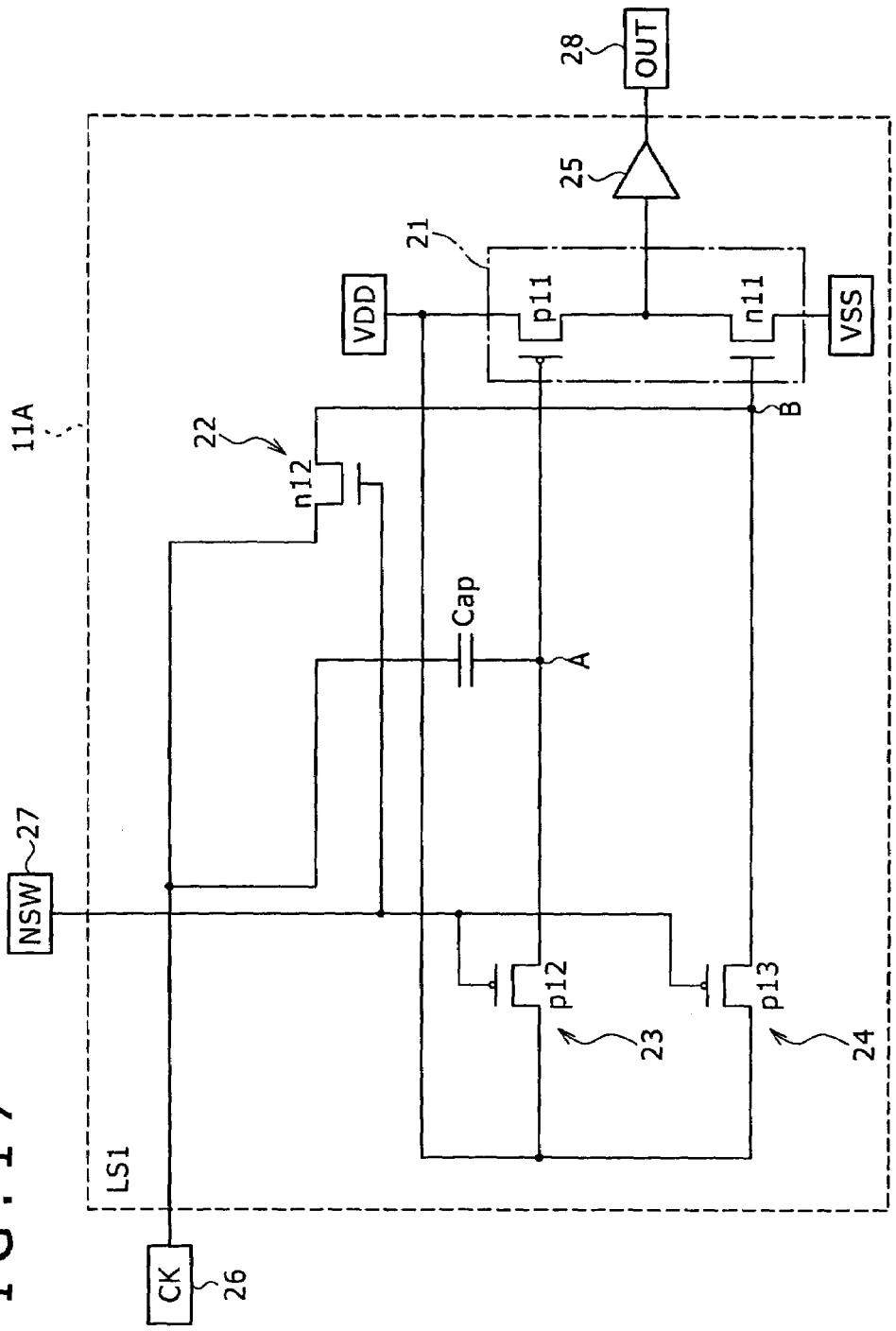
FIG. 17 is a circuit diagram showing a configuration of a level shifting section according to an Example 1.

FIG. 17 shows a configuration of the level shifting section (LS1) 11A according to a Form 1. Referring to FIG. 17, the level shifting section 11A according to the Form 1 includes a complementary circuit 21, first to third switch circuits 22 to 24, a capacitance element Cap, and a buffer 25. The level shifting section 11A has a clock terminal 26, a control terminal 27, and an output terminal 28.

The complementary circuit 21 includes first and second transistors of the opposite conduction types to each other connected in series between the power supply potential VSS and the power supply potential VDD, that is, an NMOS transistor n11 and a PMOS transistor p11. The drains of the NMOS transistor n11 and the PMOS transistor p11 are connected to the circuit output terminal 28 through the buffer 25.

The first switch circuit 22 is formed from an NMOS transistor n12, which is connected at the drain thereof to the clock terminal 26, at the source thereof to the gate of the NMOS transistor n11, and at the gate thereof to the control terminal 27. The clock terminal 26 receives the clock pulse CK of the VSS-Vin amplitude (for example, 0 to 3 V) as an input thereto. The control terminal 27 receives, as an input thereto, a control pulse NSW generated by the control pulse generation section 12 such that it exhibits an active state (High potential=power supply potential VDD) for a period of time of one cycle of the clock pulse CK.

The second switch circuit 23 is formed from a PMOS transistor p12 connected to the power supply potential VDD and the gate of the PMOS transistor p11 and adapted to receive the control pulse NSW as a gate input thereto. When the control pulse NSW has an active state (High potential), the second switch circuit 23 exhibits an off state, in which it interrupts the electric connection between the power supply potential VDD and the gate of the PMOS transistor p11 to place the gate of the PMOS transistor p11 into a floating state.

The third switch circuit 24 is formed from a PMOS transistor p15 connected between the power supply potential VDD and the gate of the NMOS transistor n11 and adapted to receive the control pulse NSW as a gate input thereto. When the control pulse NSW exhibits an active state, the third switch circuit 24 exhibits an off state, in which it interrupts the electric connection between the power supply potential VDD and the gate of the NMOS transistor n11.

The capacitance element Cap is connected between the clock terminal 26 and the gate of the NMOS transistor n11. Consequently, the clock pulse CK is transmitted to the gate of the PMOS transistor p11 through coupling by the capacitance element Cap.

The buffer 25 is formed from, for example, an inverter buffer circuit. However, the buffer 25 is not essentially required, but may be disposed as occasion demands.

Figure 18:
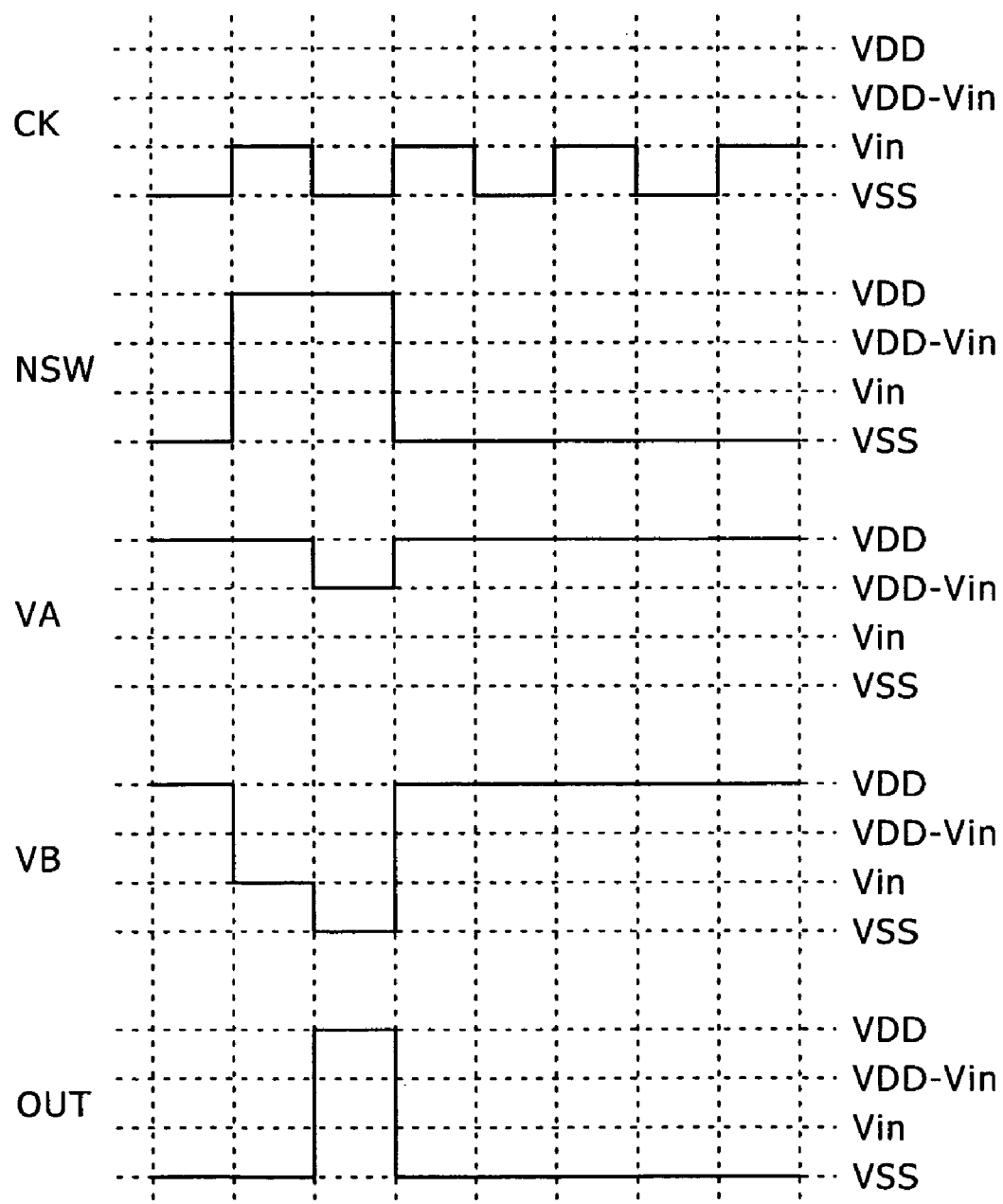
FIG. 18 is a timing chart illustrating circuit operation of the level shifting section of FIG. 17.

Now, circuit operation of the level shifting section 11A according to the Form 1 having the configuration described above is described with reference to FIG. 18.

First, when the control pulse NSW has the Low potential (power supply potential VSS), the NMOS transistor n12 exhibits an off state and the PMOS transistors p12 and p13 exhibit an on state. Consequently, irrespective of the logical state of the clock pulse CK, the potential VA at a node A (gate of the PMOS transistor p11) and the potential VB at another node B (gate of the NMOS transistor n11) are equal to the power supply potential VDD. Accordingly, the PMOS transistor p11 is off and the NMOS transistor n11 is on, and consequently, the output pulse OUT is equal to the power supply potential VSS.

When the control pulse NSW has the High potential (power supply potential VDD), that is, when the level shifting section 11A is in a driven state, the NMOS transistor n12 exhibits an on state and the PMOS transistors p12 and p13 exhibit an off state. Consequently, the node A exhibits a floating state and is coupled to the clock pulse CK through the capacitance element Cap. To the node B, the clock pulse CK is applied through the NMOS transistor n12.

Here, the control pulse NSW exhibits an active state (High potential) only within a period of time of one cycle of the clock pulse CK, and the level shifting section 11A is driven only for the period of time of one cycle of the clock pulse CK. The clock amplified at the node B within the one period is VSS/Vin and the clock amplitude at the node A is VDD−Vin/VDD. Besides, the clocks applied to the nodes A and B have the same phase.

Consequently, at a timing at which the PMOS transistor p11 and the NMOS transistor n11 are to be turned off, they are placed into an off state with certainty from the relationship of the potentials VA and VB at the nodes A and B. Accordingly, the complementary circuit 21 formed from the PMOS transistor p11 and the NMOS transistor n11 can level-shift (level-convert) the clock pulse CK to the output pulse OUT of the VSS-VDD amplitude while leak of the MOS transistors p11 and n11 upon turning off is prevented with certainty.

As described above, the level shifting section 11A, which level-shafts the clock pulse CK of the VSS-Vin (for example, 0 to 3 V) amplitude to the output pulse OUT of the VSS-VDD (for example, 0 to 8 V), uses, as a basic circuit thereof, the complementary circuit 21 formed from the NMOS transistor n11 and the PMOS transistor p11. Further, when the level shifting section 11A is to be driven to perform level shifting, the clock pulse CK is applied to the gate of the NMOS transistor n11 while a clock pulse obtained by relatively shifting the clock pulse CK to the power supply potential VDD side through the coupling by the capacitance element Cap is applied to the gate of the PMOS transistor p11. Consequently, at a timing at which the NMOS transistor n11 and the PMOS transistor p11 are to be turned off, they are placed into an off state with certainty. Therefore, no leak current flows to the complementary circuit 21.

Since leak current does not flow to the level shifting section 11A in this manner, reduction of the power consumption of the shift circuit 10 can be anticipated. Further, since the complementary circuit 21 formed from transistors of the opposite conduction types is used as a basic circuit, no leak current flows and the shift circuit 10 is driven always within a saturation region of the transistors. Consequently, the level shifting section 11A can be implemented such that it is tough against such dispersion in transistor characteristics (threshold level Vth, drain-source current Ids, and so forth) as can be seen in the level shift circuit in related art, which uses a current mirror circuit as a basic circuit. That is, the circuit performance of the level shifting section 11A is not influenced significantly by the dispersion in transistor characteristic. Besides, since no leak appears between the power supply potential VDD and the clock pulse CK, the burden on the clock pulse CK can be reduced.

However, with the circuit configuration of the level shifting section 11A according to the Form 1, there is the possibility that, also when the control pulse NSW has the Low potential and the node A is fixed to the power supply potential VDD, the coupling of the clock pulse CK may have an influence on the node A through the capacitance element Cap. There is the possibility that the potential VA at the node A may be fluctuated by the influence of the coupling, and the fluctuation of the potential may appear, for example, as whisker-like noise on the output pulse OUT. A circuit configuration improved in this regard is a level shifting section 11B according to a Form 2 described below.

[Form 2 of the Level Shifting Section 11]

Figure 19:
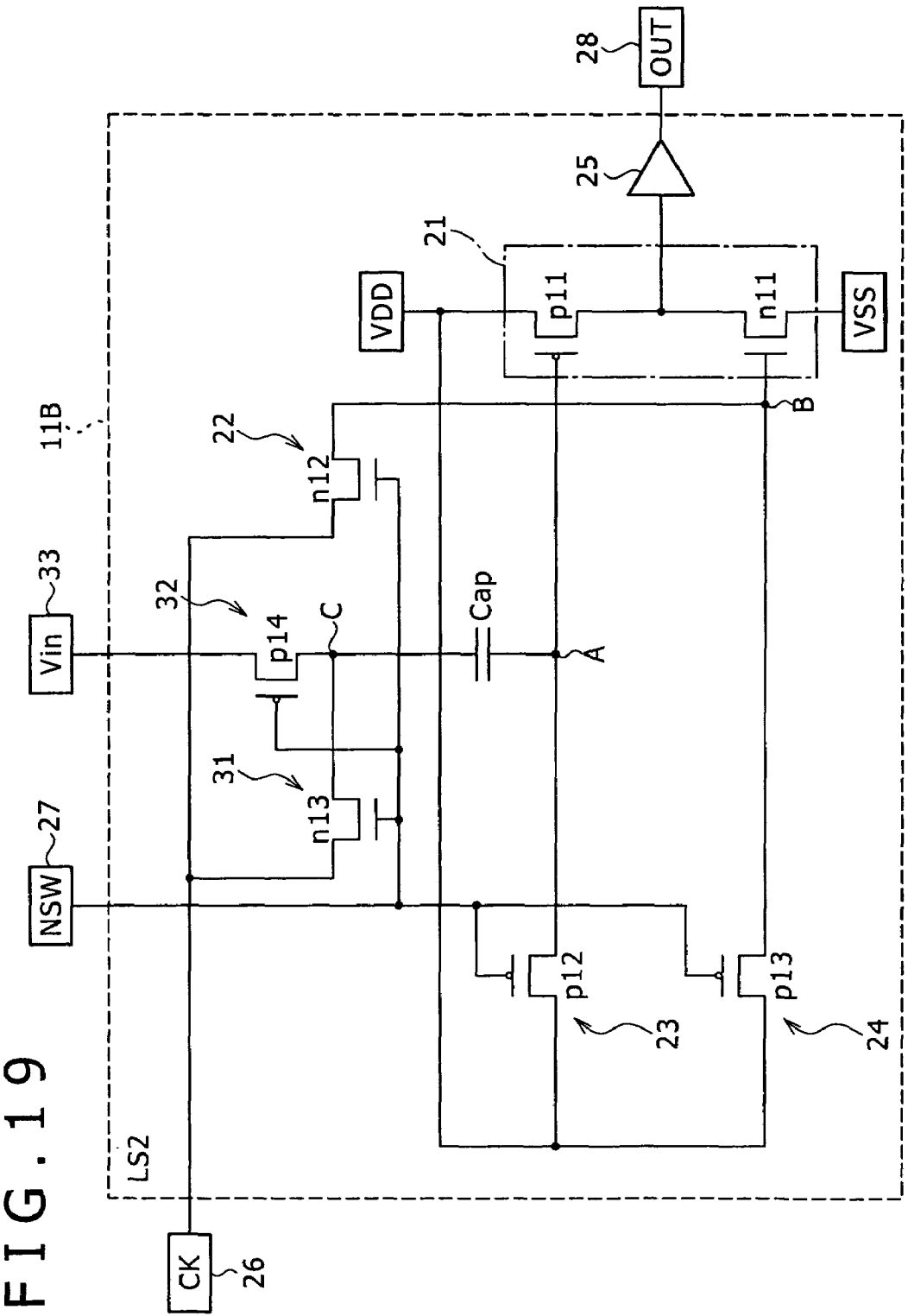
FIG. 19 is a circuit diagram showing a configuration of the level shifting section according to an Example 2.

FIG. 19 shows a configuration of the level shifting section (LS2) 11B according to the Form 2.

Referring to FIG. 19, the level shifting section 11B according to the present Form 2 includes a fourth switch circuit 31 and a fifth switch circuit 32 in addition to the components of the level shifting section 11A according to the Form 1. The fourth switch circuit 31 is formed from an NMOS transistor n13 connected between the clock terminal 26 and one end of the capacitance element Cap and adapted to receive the control pulse NSW as a gate input thereto. The fifth switch circuit 32 is formed from a PMOS transistor p14 connected between a voltage terminal 33 and the one end of the capacitance element Cap and adapted to receive the control pulse NSW as a gate input thereto. The voltage terminal 33 receives a fixed voltage Vin as an input thereto.

Figure 20:
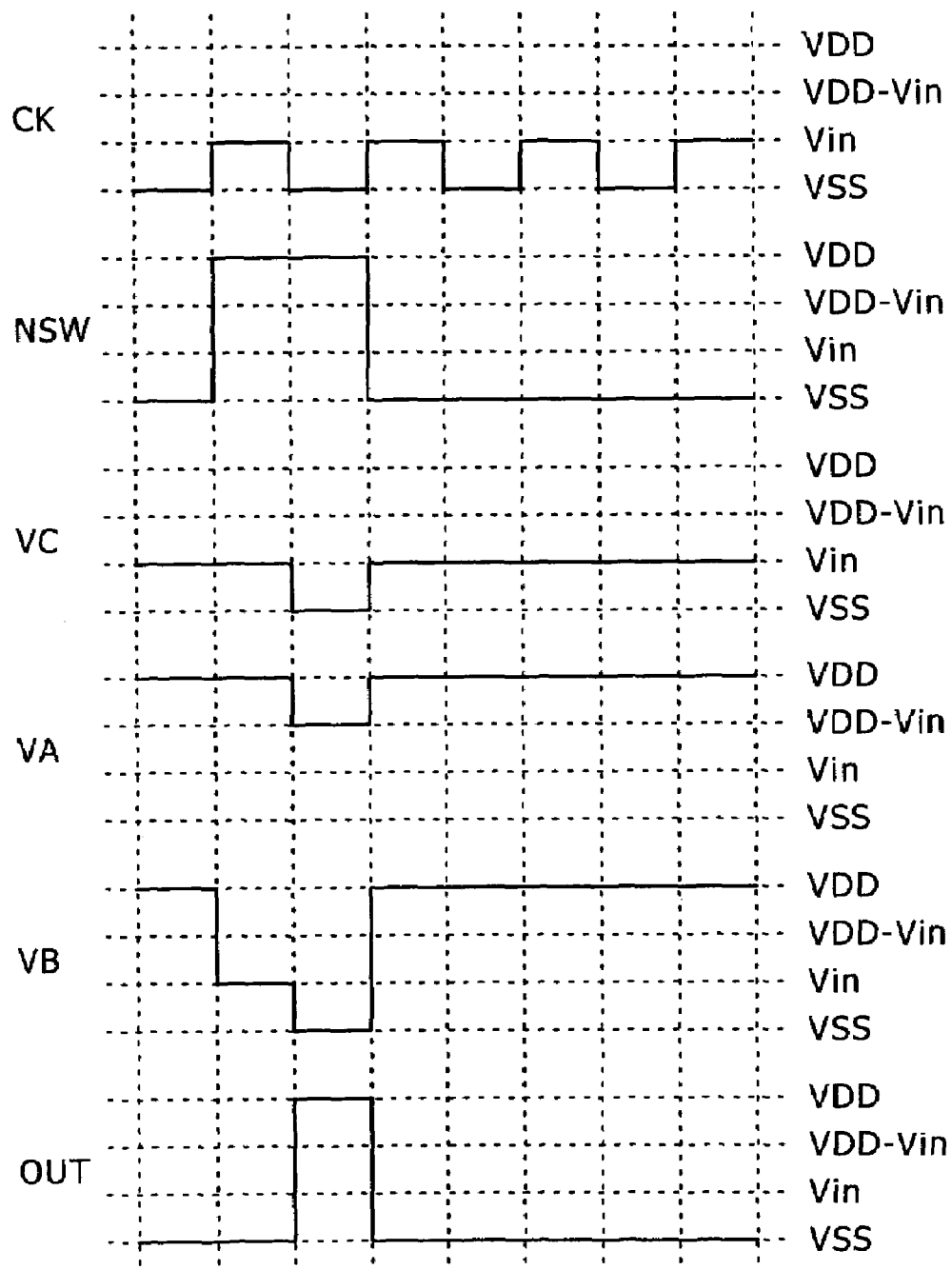
FIG. 20 is a timing chart illustrating circuit operation of the level shifting section of FIG. 19.

Now, circuit operation of the level shifting section 11B according to the Form 2 having the configuration described above is described with reference to FIG. 20. Basic circuit operation of the level shifting section 11B is same as that of the level shifting section 11A according to the Form 1. Therefore, operation principally of the newly added fourth and fifth switch circuits 31 and 32 is described.

In the fourth switch circuit 31, the NMOS transistor n13 exhibits an on state and supplies the clock pulse CK to a node C (one end of the capacitance element Cap) when the control pulse NSW is in an active state (High potential=power supply potential VDD). However, when the control pulse NSW is in an inactive state (Low potential=power supply potential VSS), the NMOS transistor n13 exhibits an off state and interrupts the electric connection between the clock terminal 26 and the capacitance element Cap so that the clock pulse CK may not have an influence on the node A.

On the other hand, in the fifth switch circuit 32, the PMOS transistor p14 exhibits an off state and interrupts the electric connection between the voltage terminal 33 and the node C when the control pulse NSW is in an active state. On the other hand, when the control pulse NSW is in an inactive state, the fifth switch circuit 32 exhibits an on state to electrically connect the voltage terminal 33 and the node C to fix the potential VC at the node C to the fixed voltage Vin.

As described hereinabove, in the level shifting section 11B according to the Form 2, when the control pulse NSW is in an inactive state, the electric connection between the clock terminal 26 and the node C is interrupted and the potential VC is fixed to the fixed voltage Vin. Consequently, it is possible to prevent the coupling of the clock pulse CK from having an influence on the node A through the capacitance element Cap. Therefore, whisker-shaped noise, which arises from a fluctuation of the potential VA at the node A, can be prevented from appearing on the output pulse OUT.

Here, the on-resistance of the NMOS transistors n12 and n13 is examined. The NMOS transistors n12 and n13 are switches for allowing the clock pulse CK to be supplied to the nodes B and C when the control pulse NSW is in an active state. Since the supplying period of the clock pulse CK corresponds to one cycle of the clock pulse CK, it is necessary for the switch circuits 22 and 31 to have a capacity sufficient to supply the High side potential Vin and the Low side potential VSS of the clock pulse CK. However, if the switch circuits 22 and 31 are each formed from the NMOS transistor n12 or n13 by itself, then the on-resistance of the NMOS transistor n12 or n13 is higher at the High side potential Vin of the clock pulse CK with respect to the power supply potential VDD in an on state.

Now, gate-drain or gate-source coupling is examined. When the state of the control pulse NSW changes from the active state (power supply potential VDD) to the inactive state (power supply potential VSS), gate-drain coupling or gate-source coupling acts. There is the possibility that noise entering through the coupling may cause a malfunction.

Such circuit configuration, which is improved in regard to the possibility of the on-resistance and the gate-drain or gate-source coupling of the NMOS transistors n12 and n13, is a level shifting section 11C according to a Form 3.

Figure 21:
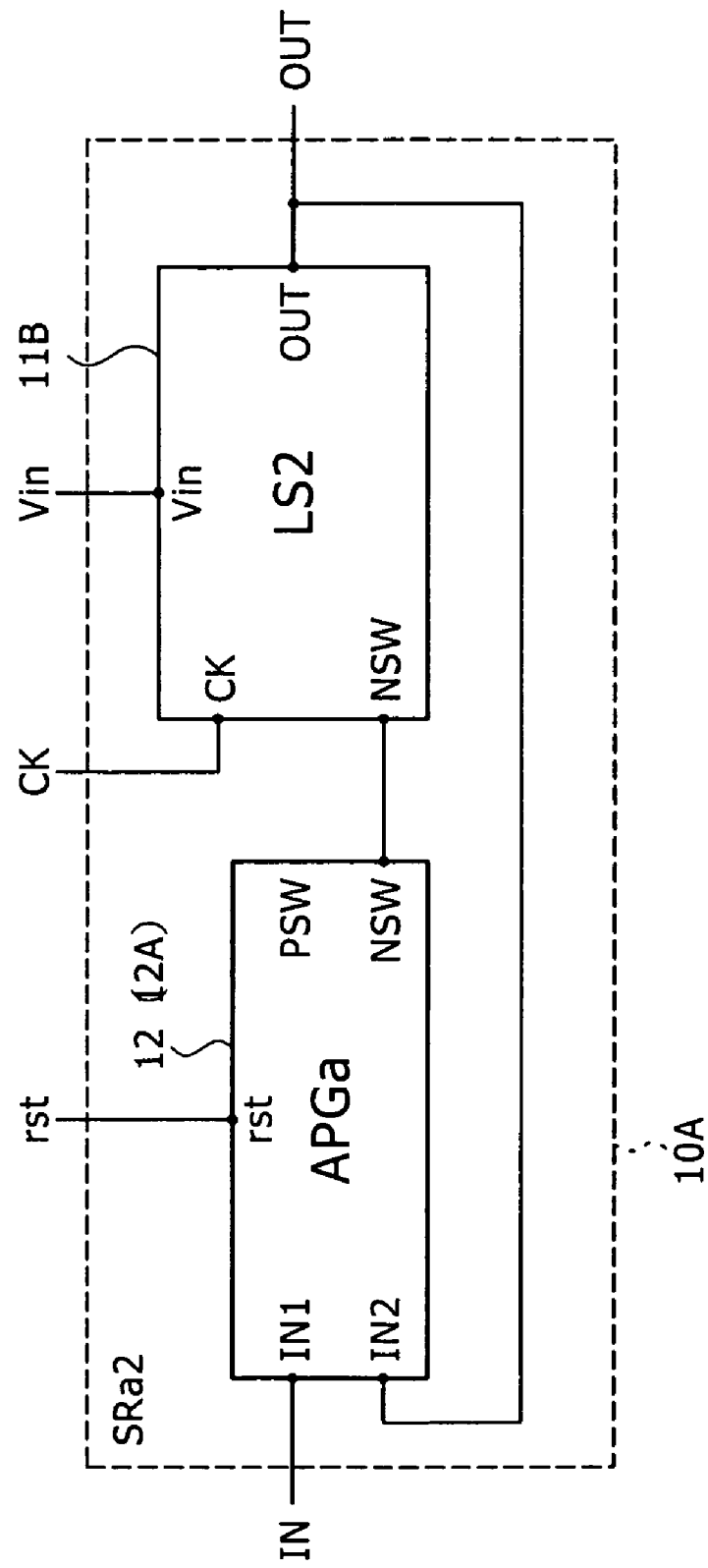
FIG. 21 is a block diagram showing a circuit configuration of a shift circuit according to a Modification 1 to the third embodiment.

A configuration of the shift circuit 10 wherein the level shifting section 11B according to the Form 2 is used as the level shifting section 11 is shown as a shift circuit 10A according to a Modification 1 to the third embodiment in FIG. 21.

[Form 3 of the Level Shifting Section 11]

Figure 22:
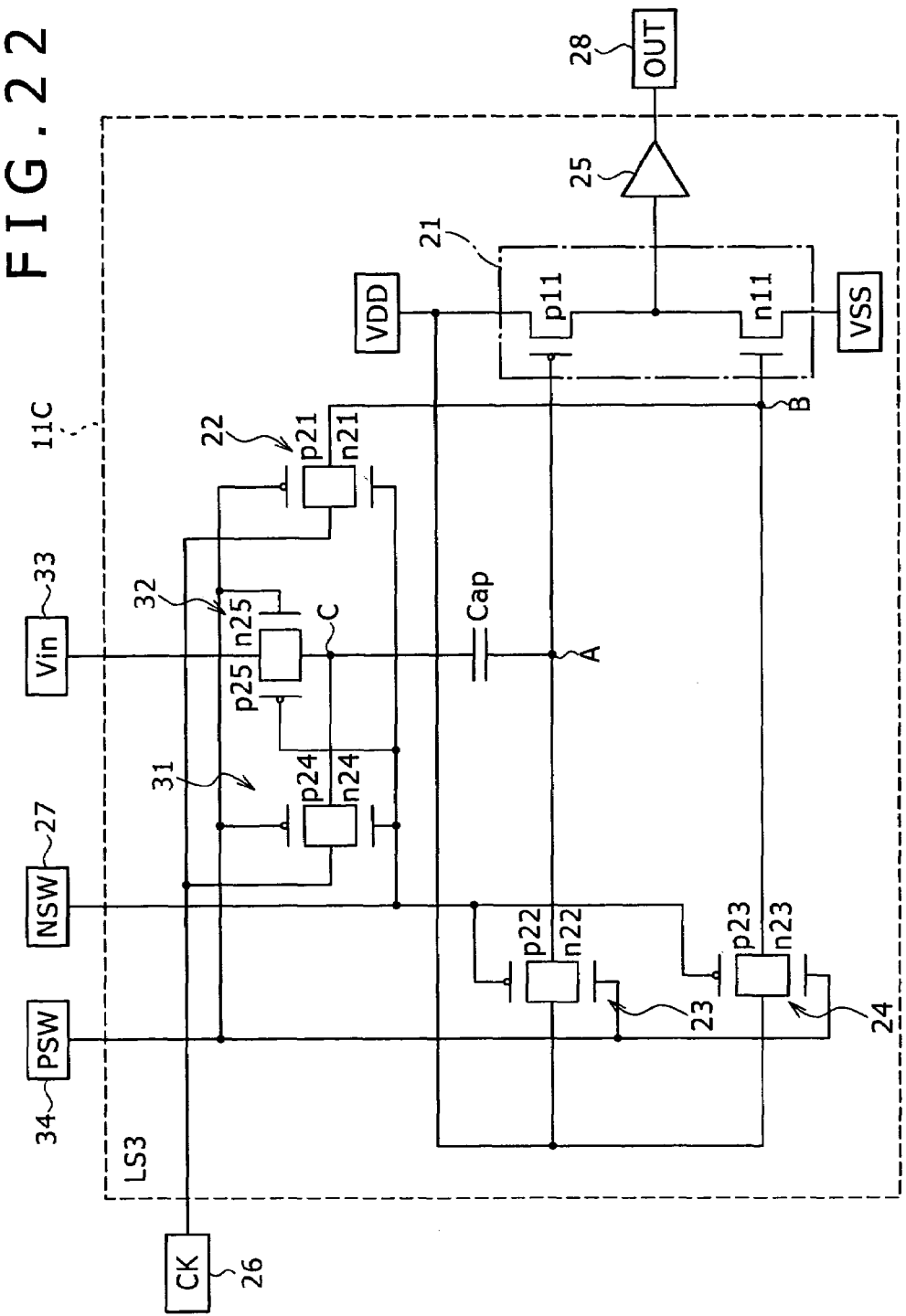
FIG. 22 is a circuit diagram showing a configuration of a level shifting section according to an Example 3.

FIG. 22 shows a configuration of the level shifting section (LS3) 11C according to the Form 3.

Referring to FIG. 22, the level shifting section 11C according to the Form 3 is different from the level shifting section 11B according to the Form 2 in that a CMOS switch is used for the switch circuits 22, 23, 24, 31, and 32. In particular, the switch circuit 22 is formed from the NMOS transistor n21 and the PMOS transistor p21 connected in parallel to each other, and the control pulse NSW inputted through the control terminal 27 is applied to the gate of the NMOS transistor n21 while the opposite phase control pulse PSW inputted through a control terminal 34 and having a phase opposite to that of the control pulse NSW is applied to the gate of the PMOS transistor p21.

The second switch circuit 23 is formed from an NMOS transistor n22 and a PMOS transistor p22 connected in parallel to each other, and the opposite phase control pulse PSW is applied to the gate of the NMOS transistor n22 while the control pulse NSW of the forward phase is applied to the gate of the PMOS transistor p22. The third switch circuit 24 is formed from an NMOS transistor n23 and a PMOS transistor p23 connected in parallel to each other, and the opposite phase control pulse PSW is applied to the gate of the NMOS transistor n23 while the control pulse NSW of the forward phase is applied to the gate of the PMOS transistor p23.

The fourth switch circuit 31 is formed from an NMOS transistor n24 and a PMOS transistor p24 connected in parallel to each other, and the control pulse NSW of the forward phase is applied to the gate of the NMOS transistor n24 while the opposite phase control pulse PSW is applied to the gate of the PMOS transistor p24. The switch circuit 32 is formed from an NMOS transistor n25 and a PMOS transistor p25 connected in parallel to each other, and the opposite phase control pulse PSW is applied to the gate of the NMOS transistor n25 while the control pulse NSW of the reverse phase is applied to the gate of the PMOS transistor p25.

Figure 23:
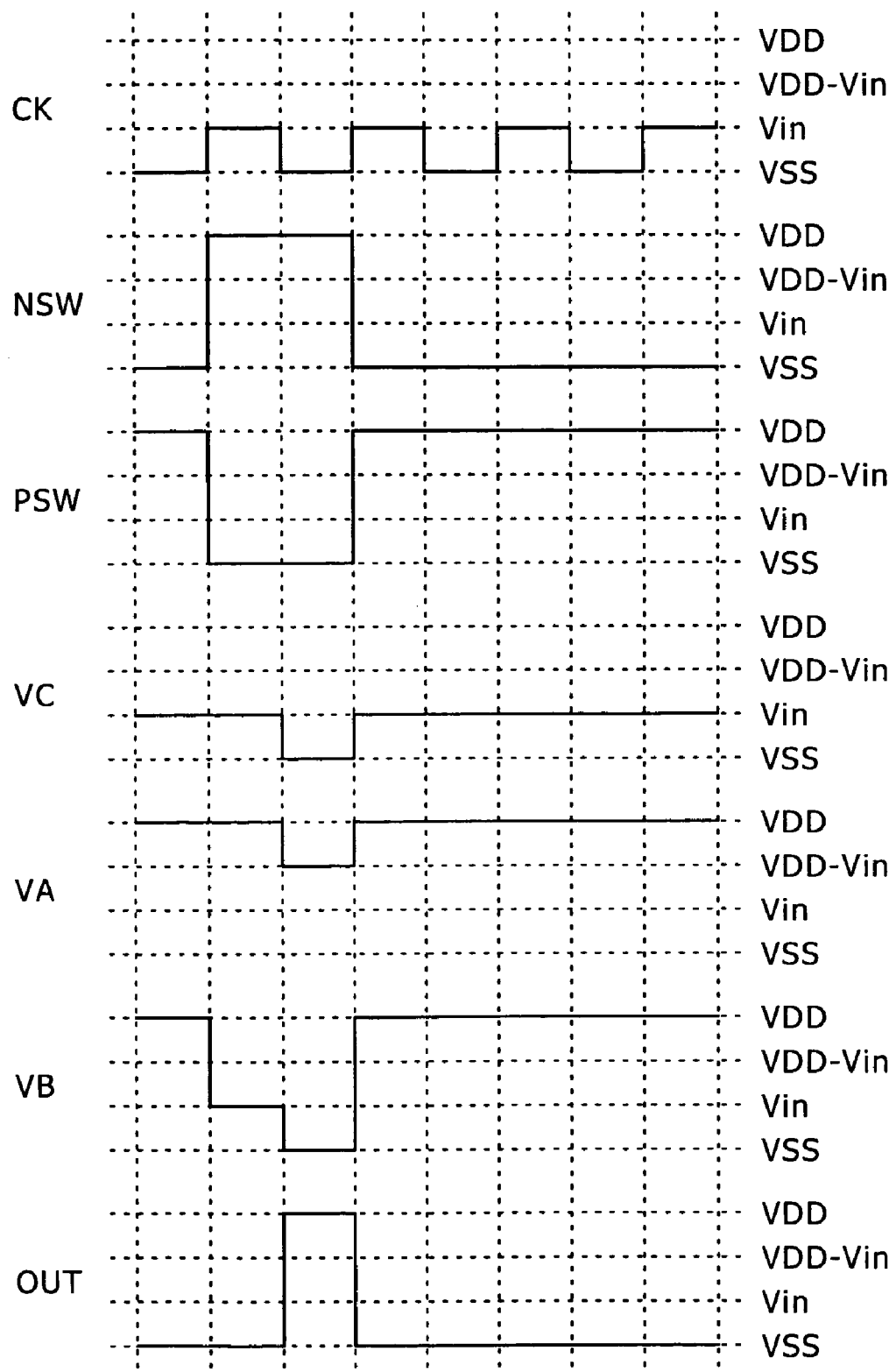
FIG. 23 is a timing chart illustrating circuit operation of the level shifting section of FIG. 22.

FIG. 23 illustrates circuit operation of the level shifting section 11C according to the Form 3. To the level shifting section 11C of the present Form 3, the control pulse NSW and the opposite phase control pulse PSW of the reverse phase are applied.

As described hereinabove, in the level shifting section 11C according to the Form 3, a CMOS switch is used to form the switch circuits 22 and 31, the possibility regarding the on-resistance of the NMOS transistors where a single NMOS transistor is used to form the switch circuits 22 and 31. That is, the possibility that the on-resistance is higher at the High side potential Vi of the clock pulse CK than at the power supply potential VDD in an on state of the transistors can be eliminated by the action of the PMOS transistors p21 and p24.

Further, since the switch circuits 23, 24, and 32 are each formed from a CMOS switch, the possibility arising from the gate-drain coupling or the gate-source coupling where the switch circuits 23, 24, and 32 are each formed from a single NMOS transistor, that is, the possibility that the circuit may malfunction because of admission of noise through the coupling, can be eliminated by the action of the PMOS transistors p22, p23, and 25.

It is to be noted that, while, in the Form 3, the switch circuits 22, 23, 24, 31, and 32 are each formed from a CMOS switch to eliminate the possibilities described above, the countermeasure for the elimination is not necessarily required, and it is possible to select whether or not a countermeasure should be taken through examination of the necessity for countermeasures against the possibilities depending upon the circuit constants and driving conditions (various voltage setting values).

Figure 24:
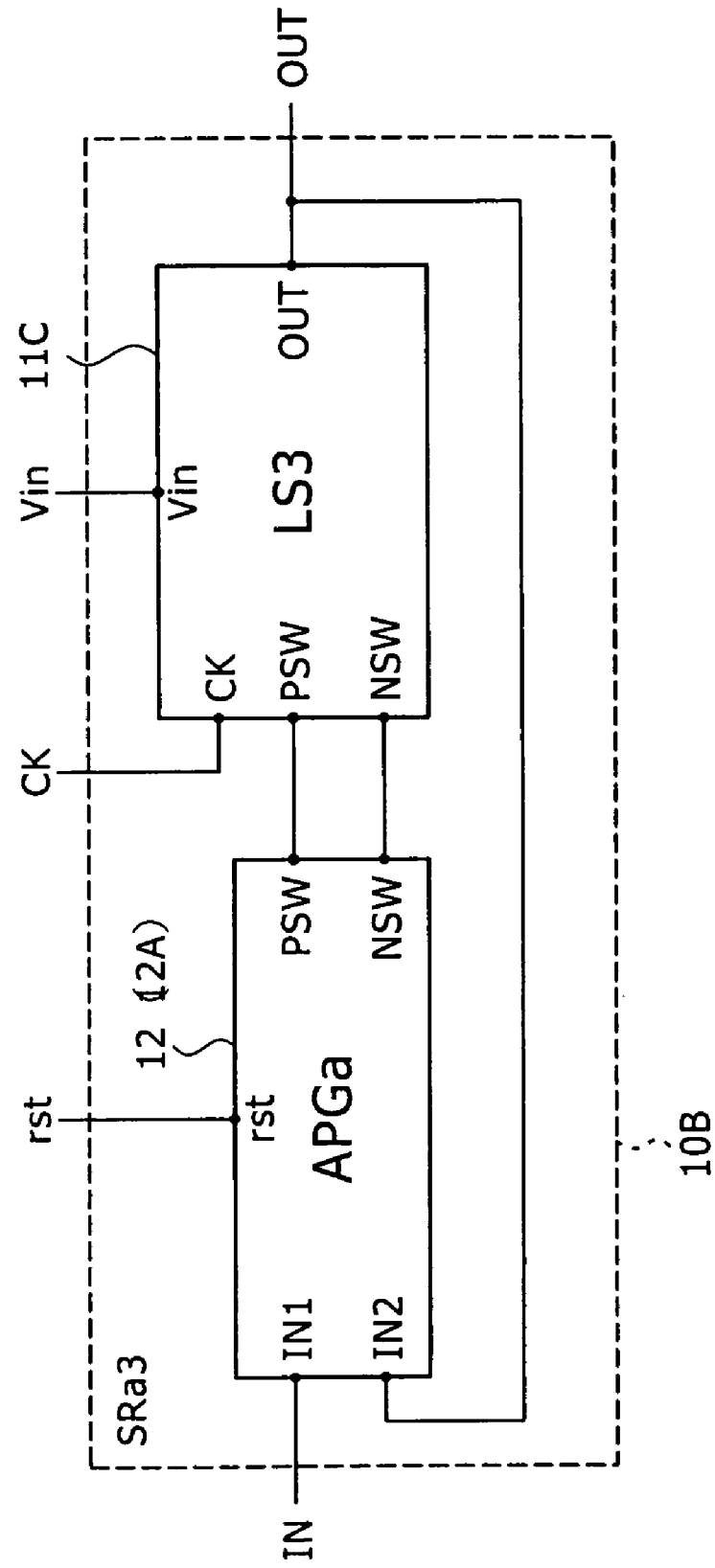
FIG. 24 is a block diagram showing a circuit configuration of a shift circuit according to a Modification 2 to the third embodiment.

A configuration of the shift circuit 10 where the level shifting section 11C according to the Form 3 is used as the level shifting section 11 is shown as a shift circuit 10B according to a Modification 2 to the third embodiment in FIG. 24.

Now, the control pulse generation section 12, which generates the control pulse NSW (opposite phase control pulse PSW), is described.

The control pulse NSW is a pulse signal exhibiting an active state (High potential) for a period of time of one cycle of the clock pulse CK described hereinabove. Such two methods as described below are available as a method of producing the control pulse NSW.

In the following description of the methods, it is presupposed that the shift circuit 10 according to the present embodiment is used, for example, for each shifting stages (transfer stages) of a shift register circuit. The first method utilizes an input and an output of each stage of the shift register circuit. This is described as an Example 1. The second method utilizes an input to each stage and an output of a next stage of the shift register circuit. The second method is described as Examples 2, 3, and 4.

[Example 1 of the Control Pulse Generation Section 12]

Figure 25:
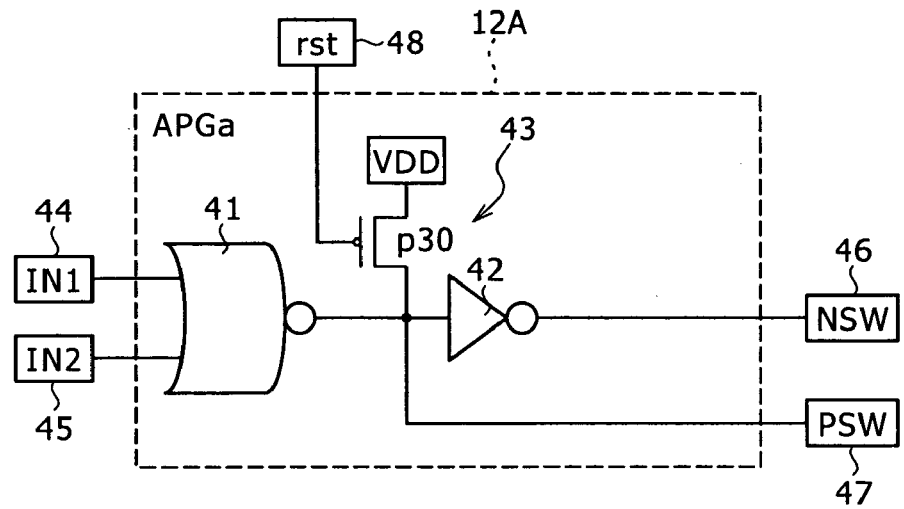
FIG. 25 is a block diagram showing a configuration of a control pulse generation section according to an Example 1.

FIG. 25 shows a configuration of a control pulse generation section 12A (APga) according to the Example 1.

Referring to FIG. 25, the control pulse generation section 12A in the Example 1 includes a NOR circuit 41, an inverter circuit 42, a reset circuit 43, two input terminals 44 and 45, two output terminals 46 and 47, and a reset terminal 48. The input terminal 44 receives an input pulse IN1 of a pulse width equal to that of the clock pulse CK as an input thereto. The input pulse IN1 corresponds to the input pulse to the self stage in the shift register. The input terminal 45 receives, as an input thereto, an input pulse IN2 having a phase displaced by a ½ cycle of the clock pulse CK from the input pulse IN1. The input pulse IN2 corresponds to the output pulse of the self stage in the shift register.

Figure 26:
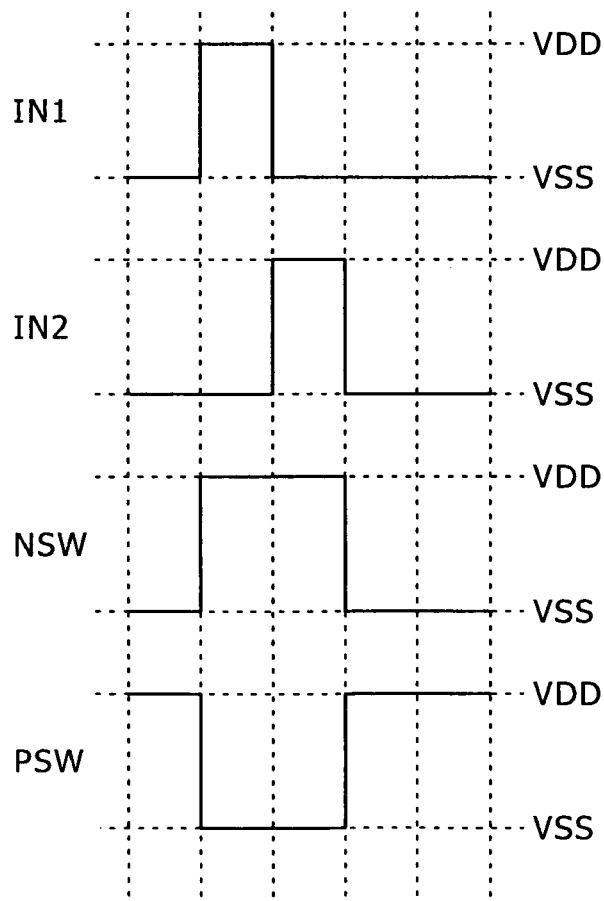
FIG. 26 is a timing chart illustrating circuit operation of the control pulse generation section of FIG. 25.

The NOR circuit 41 logically NORs the input pulse IN1 and the input pulse IN2. The inverter circuit 42 inverts the output pulse of the NOR circuit 41 to produce a control pulse NSW of the positive phase and outputs the control pulse NSW through the output terminal 46. The output pulse of the NOR circuit 41 is outputted as it is as a control pulse PSW of the opposite phase through the output terminal 47. The opposite phase control pulse PSW is required where the level shifting section 11 is the level shifting section 11C according to the Example 3. FIG. 26 illustrates a timing relationship of the input pulses IN1 and IN2 and the control pulses NSW and PSW.

The reset circuit 43 is formed from a PMOS transistor p30 connected between the power supply potential VDD and the output terminal of the NOR circuit 41 (input terminal of the inverter circuit 42) and adapted to receive a reset pulse "rest" inputted through the reset terminal 48 as a gate input thereto. In the reset circuit 43, when the reset pulse "rest" has the Low potential, the PMOS transistor p30 is placed into an on state to perform a resetting operation of setting the output terminal potential of the NOR circuit 41 (input terminal potential of the inverter circuit 42) to the power supply potential VDD.

Figure 27:
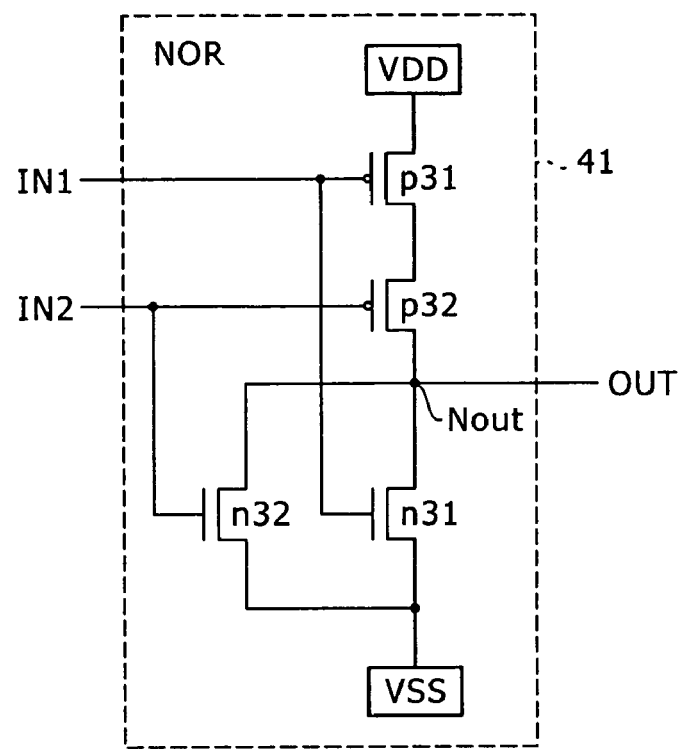
FIG. 27 is a circuit diagram showing an example of a configuration of a NOR circuit shown in FIG. 25.

FIG. 27 shows an example of a configuration of the NOR circuit 41. Referring to FIG. 27, the NOR circuit 41 in the present example is formed from PMOS transistors p31 and p32 and NMOS transistors n31 and n32. The PMOS transistors p31 and p32 are connected in series between the power supply potential VDD and an output node "Nout" and adapted to receive the input pulses IN1 and IN2 as gate inputs thereto, respectively. The NMOS transistors n31 and n32 are connected in parallel between the output node "Nout" and the power supply potential VSS and adapted to receive the input pulses IN1 and IN2 as gate inputs thereto, respectively. However, the configuration of the NOR circuit 41 is not limited that just described.

Figure 28:
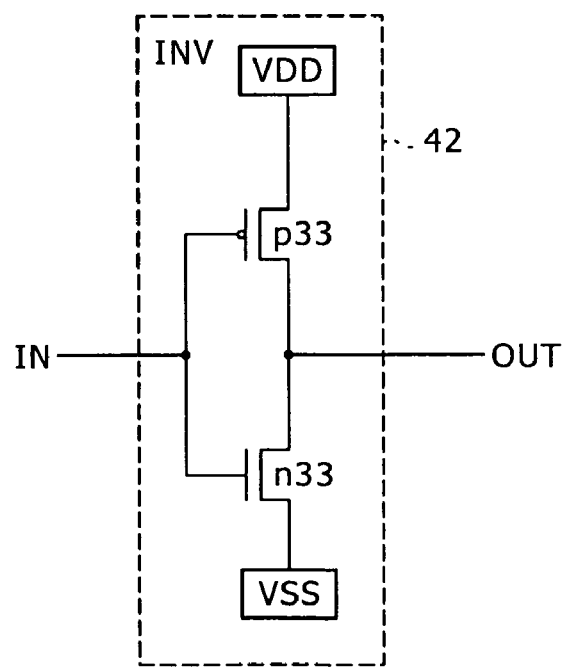
FIG. 28 is a circuit diagram showing an example of a configuration of an inverter circuit shown in FIG. 25.

FIG. 28 shows an example of a configuration of the inverter circuit 42. Referring to FIG. 28, the inverter circuit 42 has a CMOS inverter configuration. The configuration includes a PMOS transistor p33 and an NMOS transistor n33 connected in series between the power supply potential VDD and the power supply potential VSS and connected at the gate electrodes and the drain electrodes thereof commonly to each other. However, the configuration of the inverter circuit 42 is not limited to that just described.

The control pulse generation section 12A in the Example 1 is used as the control pulse generation section 12 in the shift circuit 10 according to the third embodiment (FIG. 15), the shift circuit 10A according to the Modification 1 (FIG. 21), and the shift circuit 10B according to the Modification 2 (FIG. 24).

[Example 2 of the Control Pulse Generation Section 12]

Figure 29:
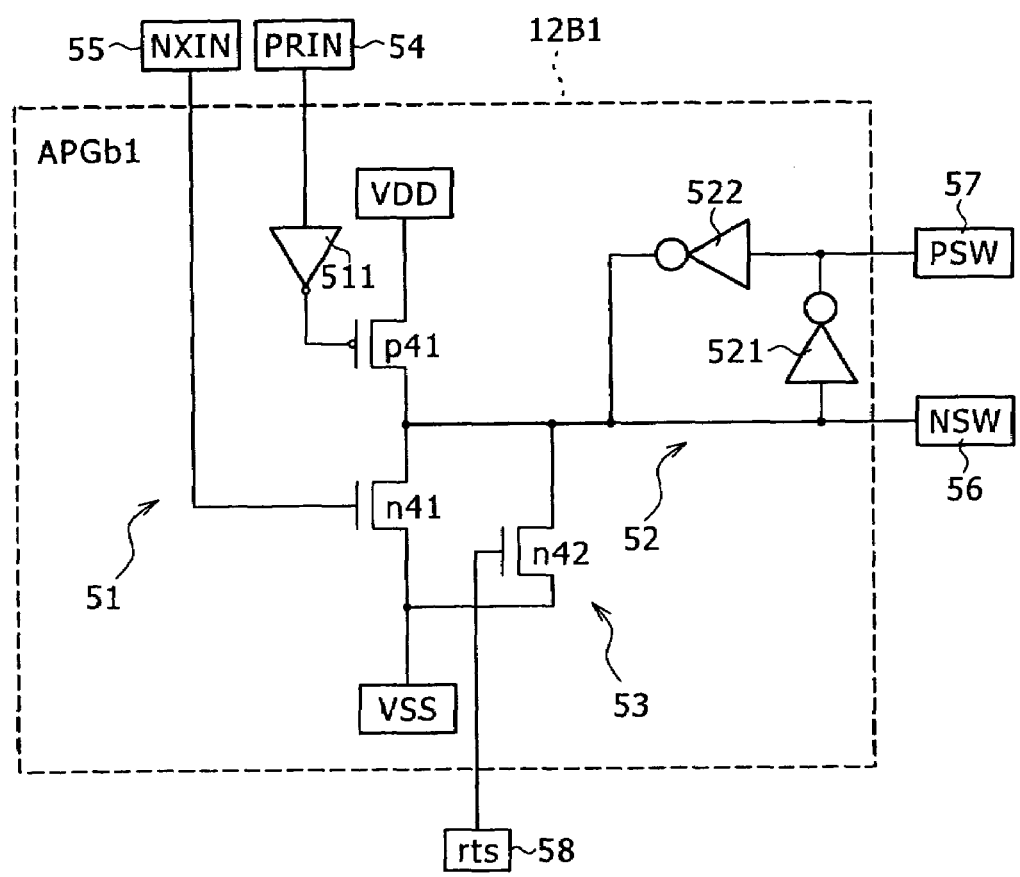
FIG. 29 is a block diagram showing a configuration of a control pulse generation section according to an Example 2.

FIG. 29 shows a configuration of the control pulse generation section (APGb1) 12B1 according to the Example 2.

Referring to FIG. 29, the control pulse generation section 12B1 according to the Example 2 includes a changeover circuit 51, a latch circuit 52, a reset circuit 53, two input terminals 54 and 55, two output terminals 56 and 57, and a reset terminal 58. The input terminal 54 receives an input pulse PRIN having a pulse width equal to that of the clock pulse CK as an input thereto. The input pulse PRIN corresponds to the input pulse to the self stage in the shift register circuit. The input terminal 55 receives an input pulse NXIN having a phase displaced by one cycle of the clock pulse CK from that of the input pulse IN1 (PRIN). The input pulse NXIN corresponds to the output pulse of the next stage in the shift register circuit.

The changeover circuit 51 includes a PMOS transistor p41 and an NMOS transistor n41 connected in series between the power supply potential VDD and the power supply potential VSS, and an inverter circuit 511. The input pulse PRIN is applied to the gate of the PMOS transistor p41 after it is inverted by the inverter circuit 511. The input pulse NXIN is applied directly to the gate of the NMOS transistor n41. The changeover circuit 51 performs changeover between the Low side potential VSS and the High side potential VDD of the control pulse NSW in response to the input pulse PRIN/NXIN.

The latch circuit 52 includes an inverter circuit 521 and another inverter circuit 522. The inverter circuit 521 is connected at an input terminal thereof to the output terminal 56 (output terminal of the changeover circuit 51) and is connected at an output terminal thereof to the other output terminal 57. The other inverter circuit 522 is connected in parallel in the opposite direction to the inverter circuit 521. The latch circuit 52 latches the output terminal potential of the changeover circuit 51 to maintain the Low side potential VSS/High side potential VDD.

Figure 30:
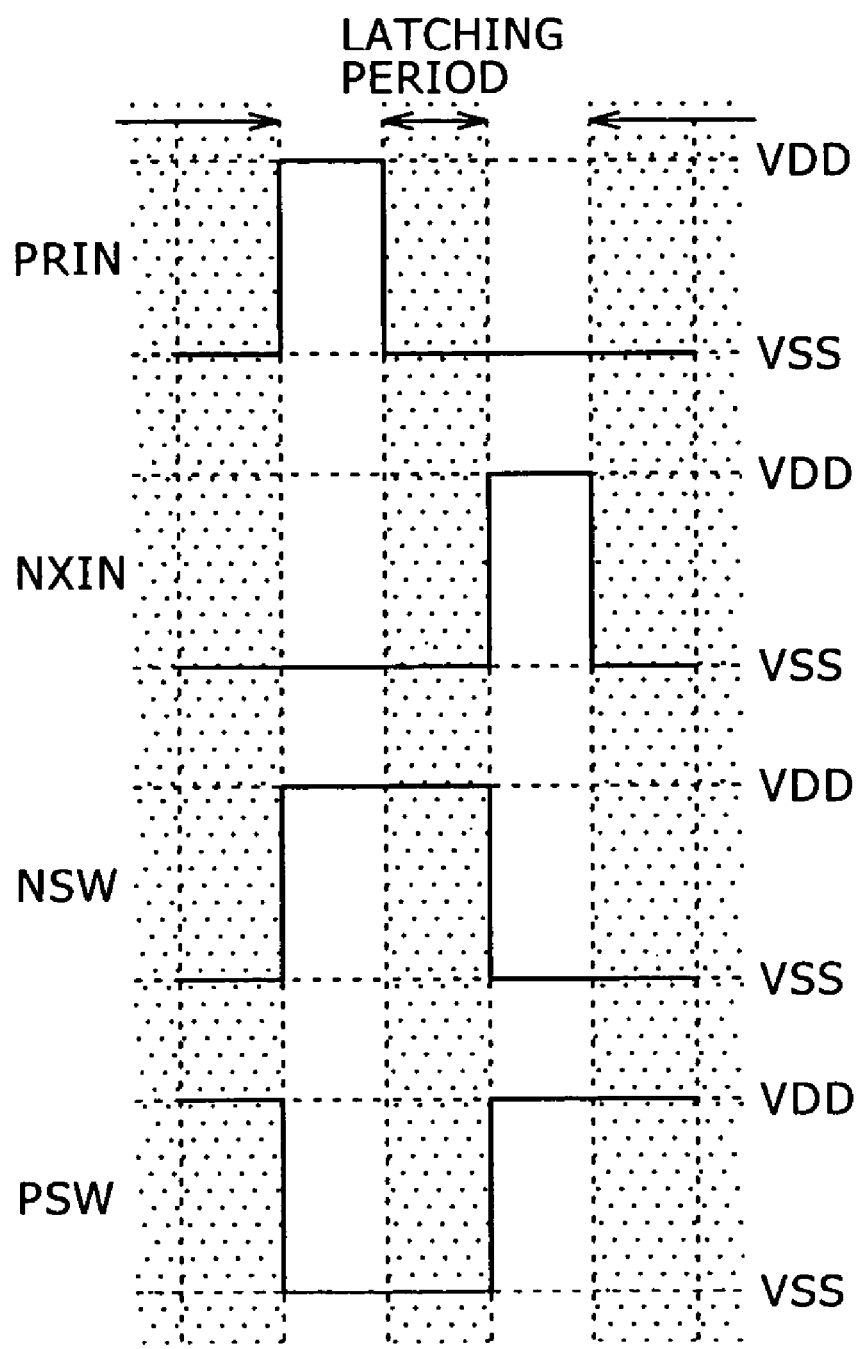
FIG. 30 is a timing chart illustrating circuit operation of the control pulse generation section of FIG. 29.

The output terminal potential of the changeover circuit 51 is outputted as it is as a control pulse NSW of the positive phase from the output terminal 56 and outputted as a control pulse PSW of the opposite phase from the output terminal 57 through the latch circuit 52. The opposite phase control pulse PSW is required where the level shifting section 11 is the level shifting section 11C according to the Example 3. A timing relationship of the input pulses PRIN and NXIN and the control pulses NSW and PSW is illustrated in FIG. 30.

The reset circuit 53 is formed from an NMOS transistor n42 connected between the output terminal of the changeover circuit 51 and the power supply potential VSS and adapted to receive the reset pulse "rest" inputted through the reset terminal 58 as a gate input thereto. In the reset circuit 53, when the reset pulse "rest" exhibits the High potential, the NMOS transistor n42 is placed into an on state to perform a resetting operation of setting the output terminal potential of the changeover circuit 51 to the power supply potential VSS.

In the control pulse generation section 12B1 according to the Example 2 described above, since it has a configuration using the latch circuit 52, every time changeover between the Low side potential VSS and the High side potential VDD of the control pulse NSW occurs, collision occurs between the output of the changeover circuit 51 and the output of the latch circuit 52 on a signal line between the output terminal of the changeover circuit 51 and the output terminal 56. From this, in order to achieve smooth changeover, it is necessary for the output of the changeover circuit 51 to be higher than the output of the latch circuit 52. Accordingly, in design of the control pulse generation section 12B1, it is necessary to determine circuit constants taking the necessity described above into consideration.

In order to implement stabilized driving of the control pulse generation section 12, preferably the collision between the output of the changeover circuit 51 and the output of the latch circuit 52 is avoided. A circuit configuration avoiding such collision between the output of the changeover circuit 51 and the output of the latch circuit 52 is included in control pulse generation sections 12B2 and 12B3 according to Examples 3 and 4.

[Example 3 of the Control Pulse Generation Section 12]

Figure 31:
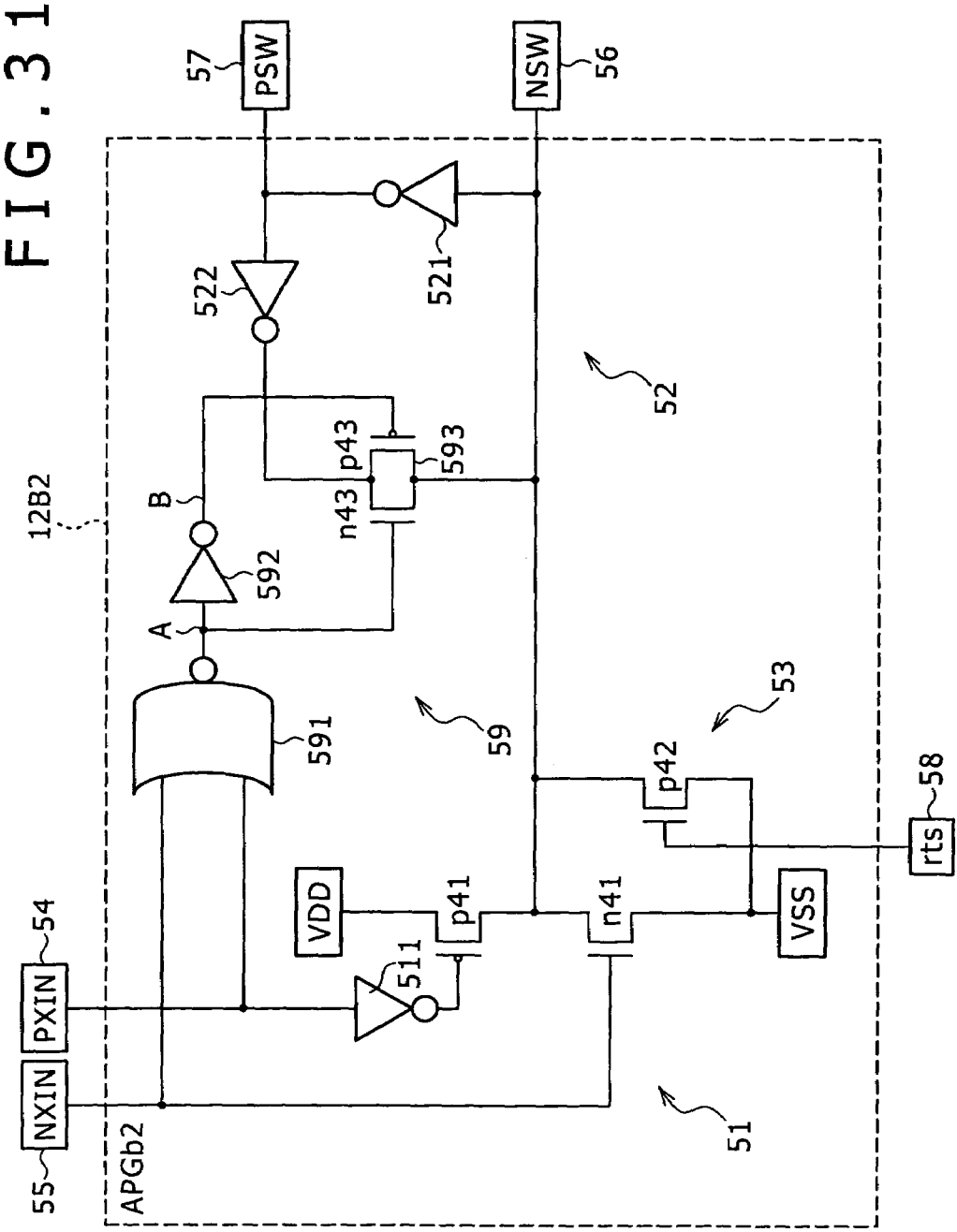
FIG. 31 is a block diagram showing a configuration of a control pulse generation section according to an Example 3.

FIG. 31 shows a configuration of the control pulse generation section (APGb2) 12B2 according to the Example 3.

Referring to FIG. 31, the control pulse generation section 12B2 according to the Example 3 includes, in addition to the components of the control pulse generation section 12B1 according to the Example 2, a switch circuit 59 interposed between the output terminal of the changeover circuit 51 and the output terminal of the latch circuit 52.

The switch circuit 59 includes a NOR circuit 591 having two inputs to which the input pulses PRIN and NXIN are inputted, an inverter circuit 592 for inverting an output of the NOR circuit 591, and a switch element 593 connected between the output terminal of the changeover circuit 51 and the output terminal of the latch circuit 52. The switch element 593 has a CMOS switch configuration formed from an NMOS transistor n43 and a PMOS transistor p43, which receive an output of the NOR circuit 591 and an output of the inverter circuit 592 as gate inputs thereof, respectively.

Figure 32:
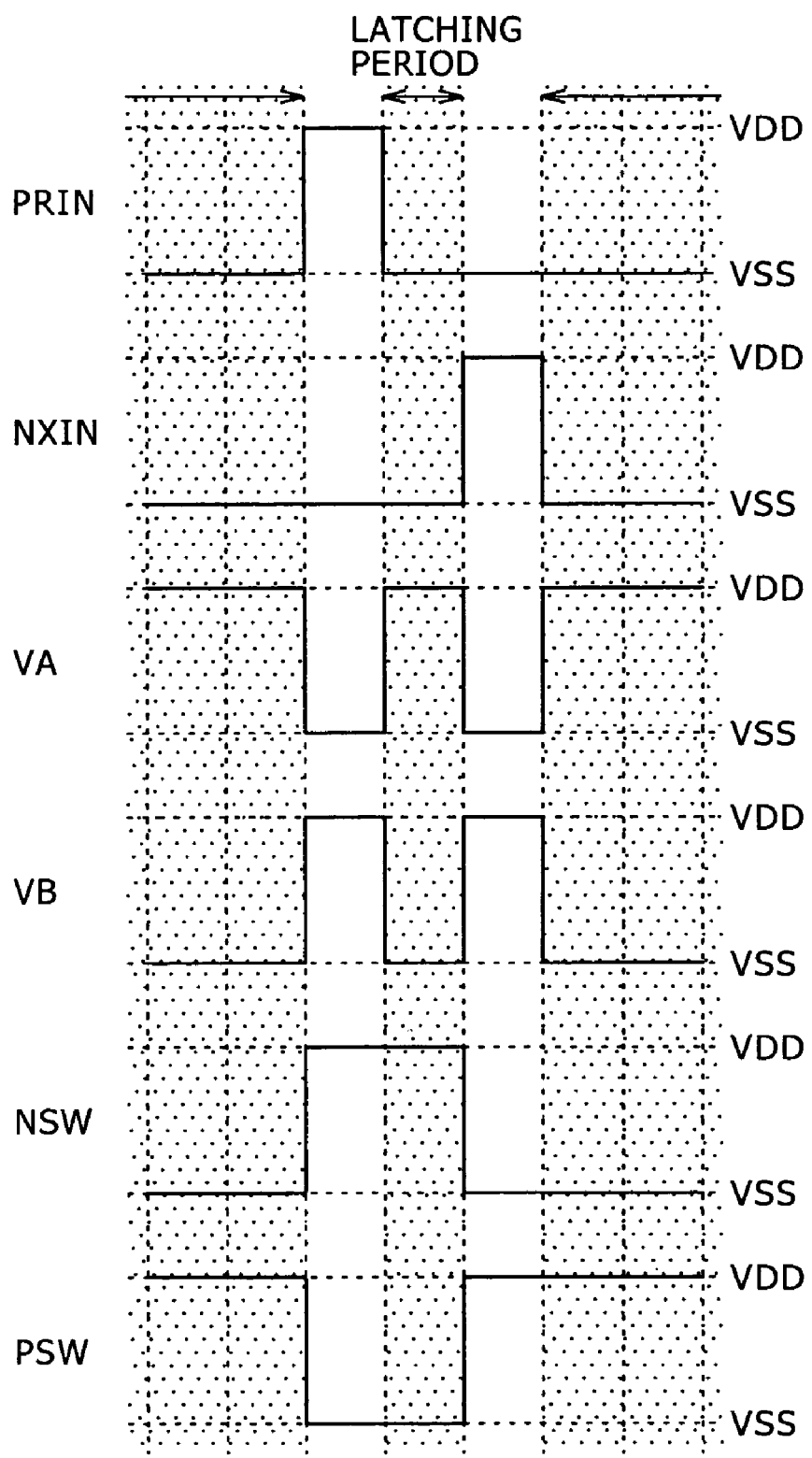
FIG. 32 is a timing chart illustrating circuit operation of the control pulse generation section of FIG. 31.

In the control pulse generation section 12B2 according to the Example 3 having the configuration described above, the input pulses PRIN and NXIN are logically NORed by the NOR circuit 591, and the output terminal of the changeover circuit 51 and the output terminal of the latch circuit 52 are electrically controlled so as to be connected and disconnected to and from each other based on a result of the logical NORing. By the control, upon changeover between the Low side potential VSS and the High side potential VDD of the control pulse NSW, otherwise possible collision between the output of the changeover circuit 51 and the output of the latch circuit 52 can be prevented. FIG. 32 illustrates a timing relationship of the input pulses PRIN and NXIN, potentials VA and VB at nodes A and B, and control pulses NSW and PSW.

[Example 4 of the Control Pulse Generation Section 12]

Figure 33:
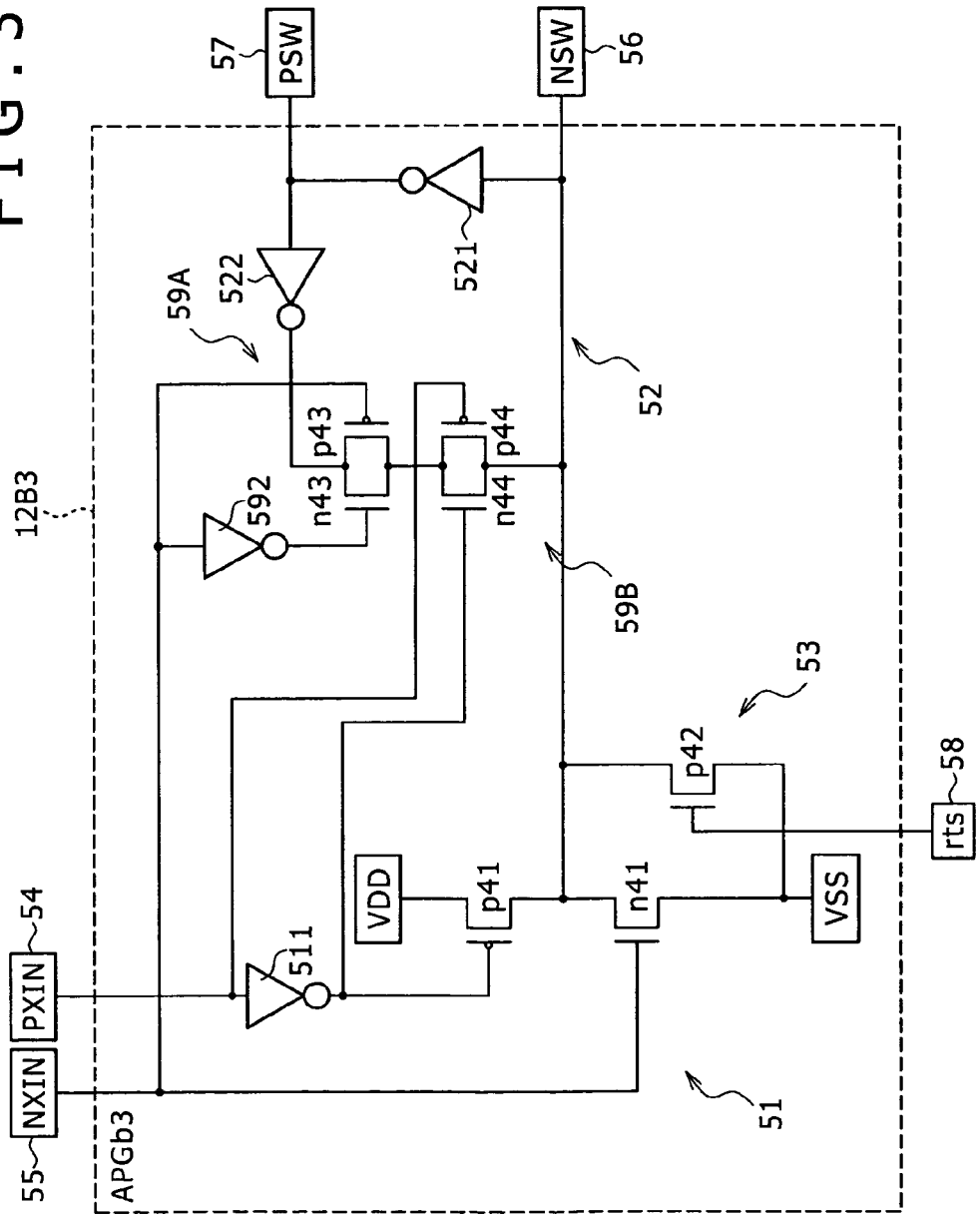
FIG. 33 is a block diagram showing a configuration of a control pulse generation section according to an Example 4.

FIG. 33 shows a configuration of the control pulse generation section (APGb3) 12B3 according to the Example 4.

Referring to FIG. 33, the control pulse generation section 12B3 according to the Example 4 is configured such that it includes, in place of the switch circuit 59 of the control pulse generation section 12B2 according to the Example 3, two switch circuits 59A and 59B connected in series between the output terminal of the changeover circuit 51 and the output terminal of the latch circuit 52.

The switch circuit 59A is formed from a CMOS switch including an NMOS transistor n43 and a PMOS transistor p43 connected in parallel to each other. The input pulse NXIN is applied to the gate of the NMOS transistor n43 after it is inverted by the inverter circuit 592. Further, the input pulse NXIN is inputted directly to the gate of the PMOS transistor p43.

The switch circuit 59B is formed from a CMOS switch including an NMOS transistor n44 and a PMOS transistor p44 connected in parallel to each other. An input pulse PXIN is applied to the gate of the NMOS transistor n44 after it is inverted by the inverter circuit 511. Further, the input pulse PXIN is applied directly to the gate of the PMOS transistor p44.

In the control pulse generation section 12B3 according to the Example 4 having the configuration described above, the two switch circuits 59A and 59B are connected in series between the output terminal of the changeover circuit 51 and the output terminal of the latch circuit 52 and are on/off controlled with an input pulse NRIN and the input pulse PXIN. Consequently, upon changeover between the Low side potential VSS and the High side potential VDD of the control pulse NSW, otherwise possible collision between the output of the changeover circuit 51 and the output of the latch circuit 52 can be prevented.

Also the control pulse generation sections 12B (control pulse generation sections 12B1, 12B2, and 12B3 according to the Examples 2, 3, and 4), which adopt the method of utilizing an input of the self stage and an output of the next stage in the shift register circuit described above, can be utilized as the control pulse generation section 12 in the shift circuit 10 similarly to the control pulse generation section 12A, which adopts the method of utilizing an input to the self stage and an output of the self stage in the shift register.

Figure 34:
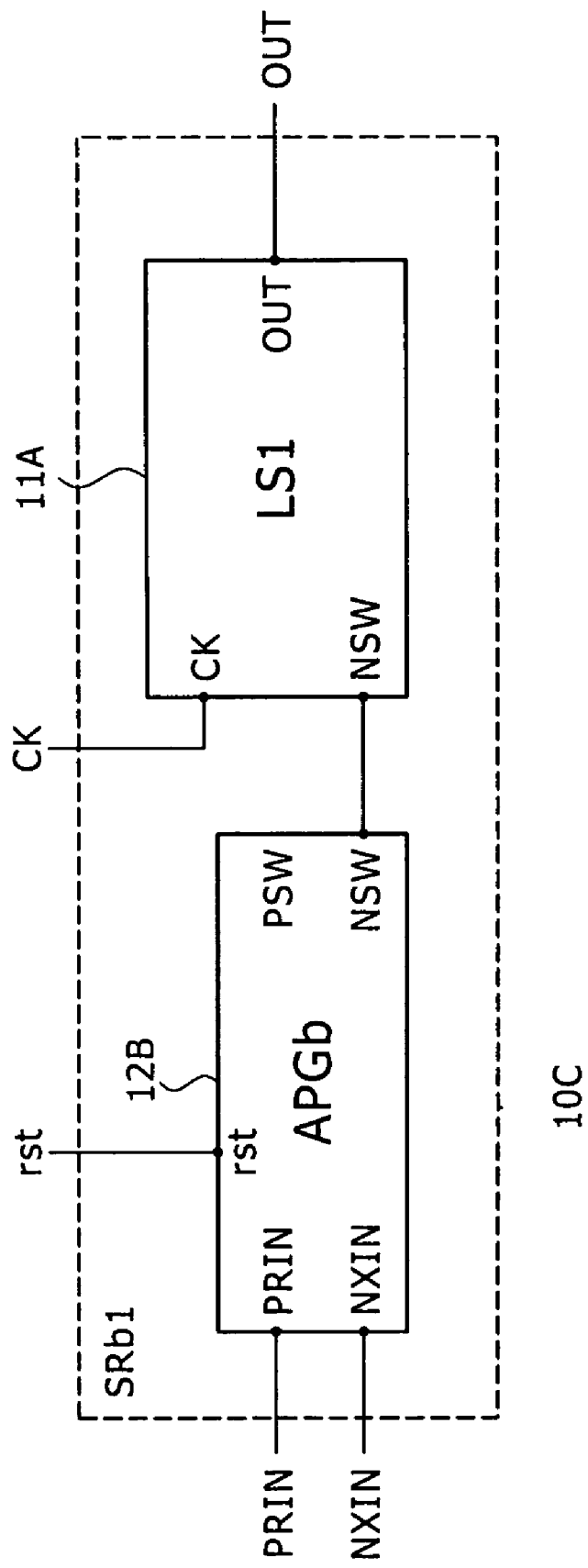
FIG. 34 is a block diagram showing a circuit configuration of a shift circuit according to a Modification 3 to the third embodiment.
Figure 35:
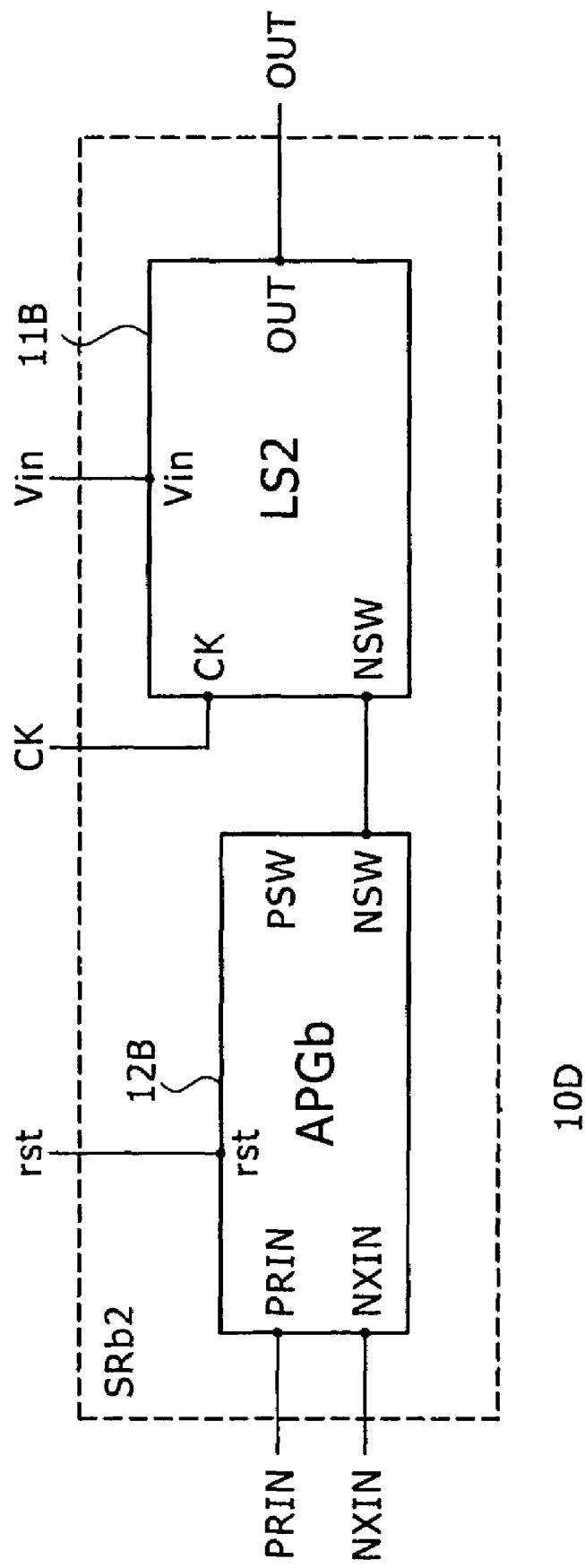
FIG. 35 is a block diagram showing a circuit configuration of a shift circuit according to a Modification 4 to the third embodiment.
Figure 36:
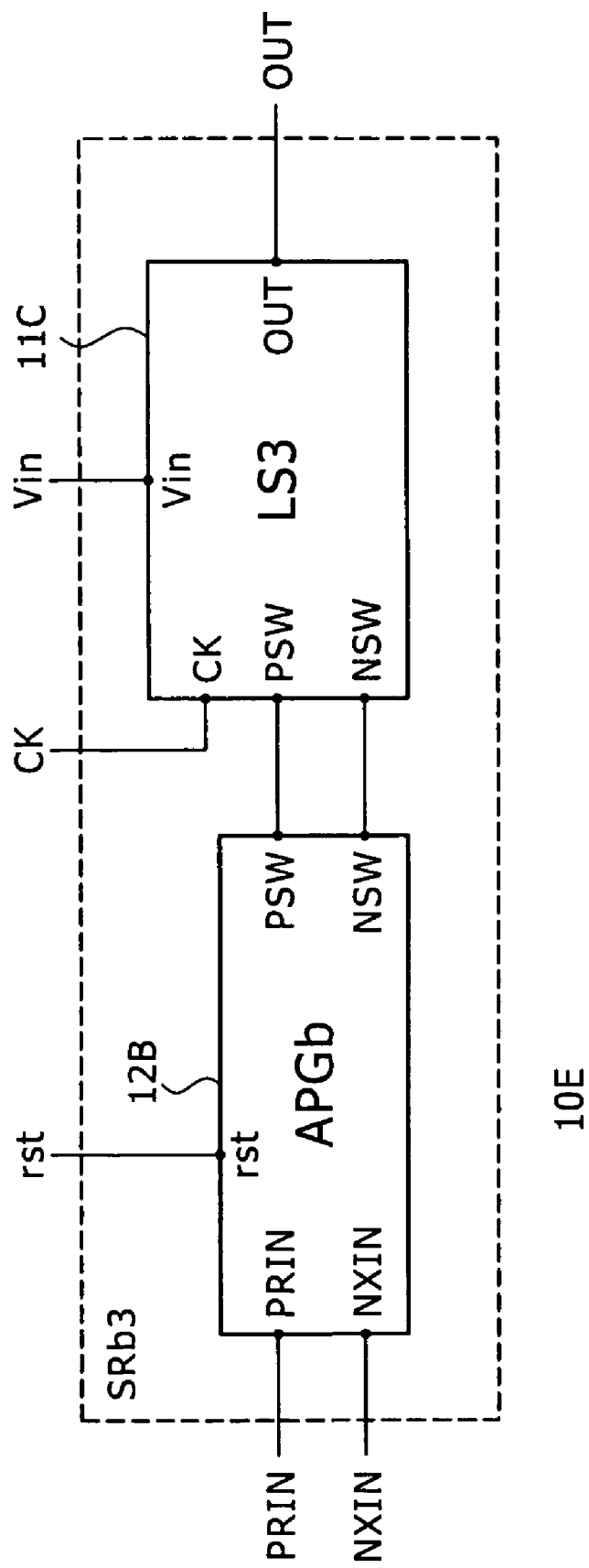
FIG. 36 is a block diagram showing a circuit configuration of a shift circuit according to a Modification 5 to the third embodiment.

Shift circuits where the control pulse generation section 12B is used as the control pulse generation section 12 are described below. In particular, a configuration of the shift circuit 10 wherein the level shifting section 11A according to the Example 1 is used as the level shifting section 11 is shown as a shift circuit 10C according to a Modification 3 to the third embodiment in FIG. 34; a configuration of the shift circuit 10 wherein the level sifting section 11B according to the Example 2 is used as the level shifting section 11 is shown as a shift circuit 10D according to a Modification 4 to the third embodiment in FIG. 35; and a configuration of the shift circuit 10 wherein the level shifting section 11C according to the Example 3 is used as the level shifting section 11 is shown as a shift circuit 10E according to a Modification 5 to the third embodiment in FIG. 36.

Figure 37:
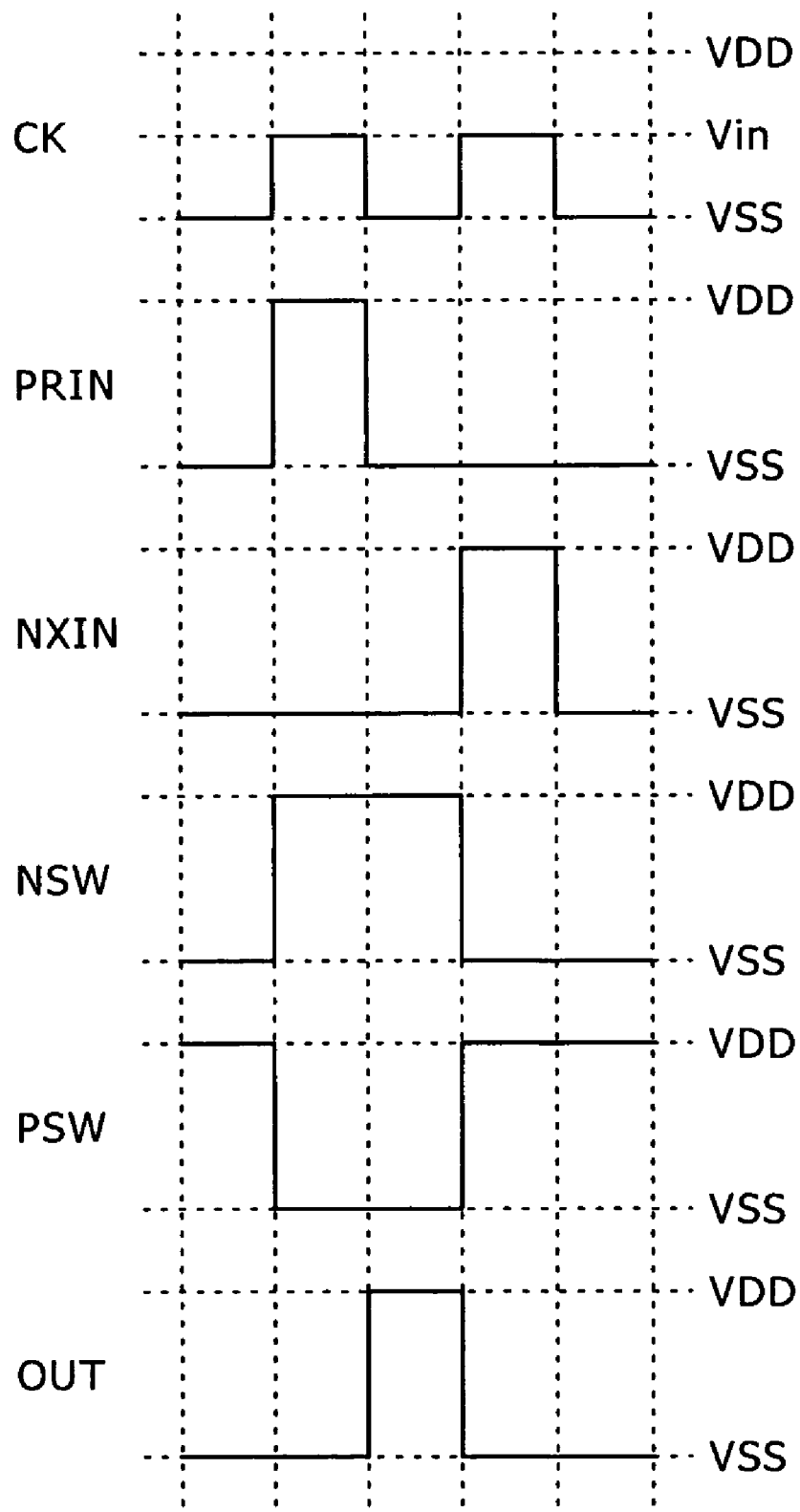
FIG. 37 is a timing chart illustrating circuit operation of the shift circuits of FIGS. 34, 35, and 36.

A timing relationship of the clock pulse CK, input pulses PRIN and NXIN, control pulses NSW and PSW, and output pulse OUT used in the shift circuits 10C, 10D, and 10E according to the Modifications 3, 4, and 5 is illustrated in FIG. 37.

It is to be noted that, while the shift circuits 10D and 10E according to the Modifications 4 and 5 are different from the shift circuit 10C according to the Modification 3 in that a fixed voltage Vin is applied to the level shifting sections 11B and 11C, the significance of the application of the fixed voltage Vin is such as described hereinabove in connection with the level sifting section 11B according to the Example 2, and the shift circuits 10C, 10D, and 10E perform the same basic operation.

Further, while the three control pulse generation sections 12B1, 12B2, and 12B3 according to the Examples 2, 3, and 4 are available as the control pulse generation section 12B, since the basic operations of them are the same as one another, the three patterns in combination of the control pulse generation section 12B and the level shifting sections 11A, 11B, and 11C according to the Examples 2, 3, and 4 are described above. Actually, however, the control pulse generation sections 12B1, 12B2, and 12B3 according to the Examples 2, 3, and 4 and the level shifting sections 11A, 11B, and 11C according to the Examples 1, 2, and 3 can be combined with each other, and consequently, totaling nine combination patterns are possible.

The shift circuits 10 (10A, 10B, 10C, 10D, and 10E) formed from various combination patterns of the level shifting sections 11 (11A, 11B, and 11C) and the control pulse generation sections 12 (12A, 12B1, 12B2, and 12B3) can be used as a popular shift circuit with a level shifting function and further as each transfer stage (shifting stage) of a shift register circuit. In the following, applications wherein the shift circuit 10 (10A, 10B, 10C, 10D, or 10E) according to the first embodiment is used for each shifting stage of a shift register are described.

[Application 3]

Figure 38:
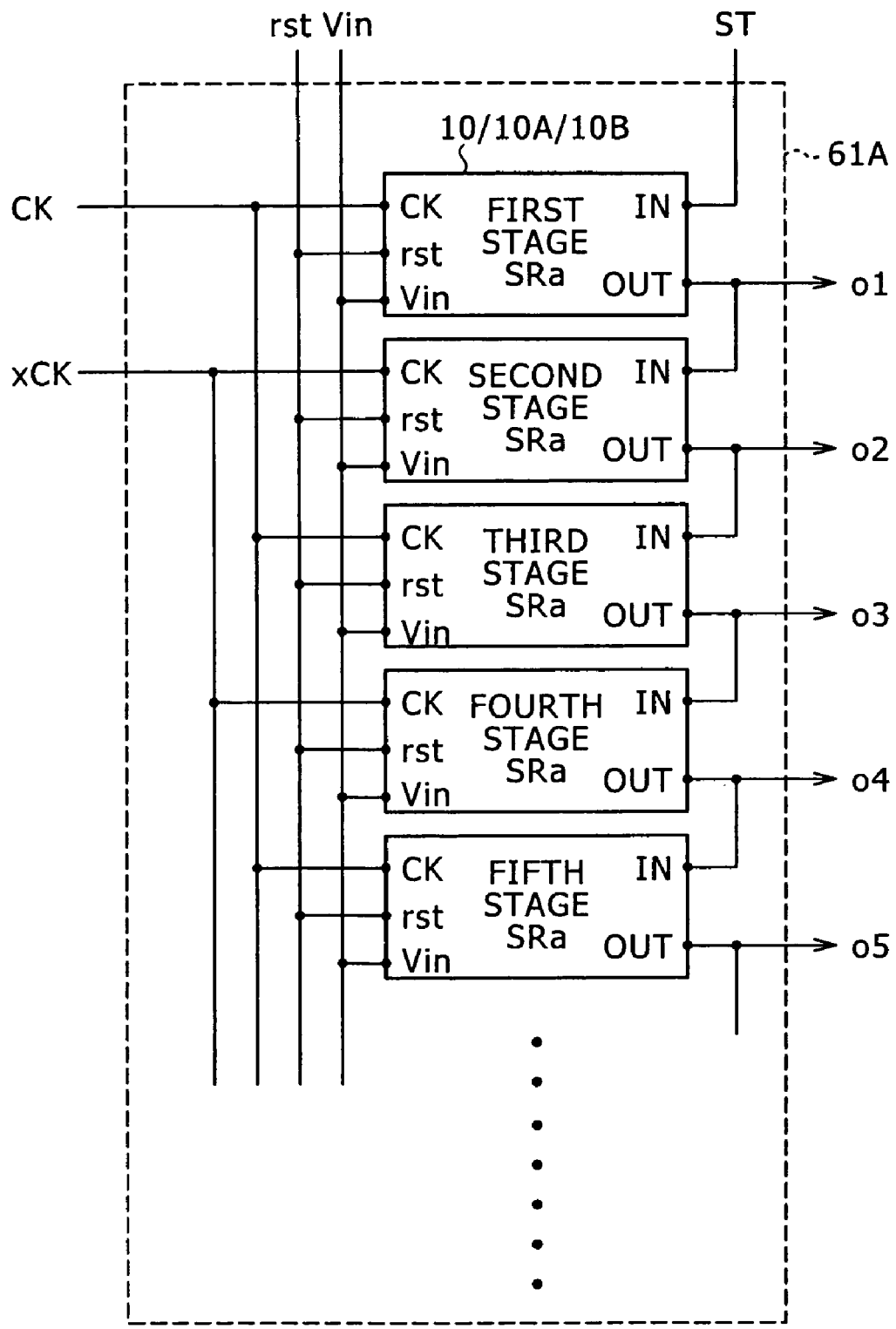
FIG. 38 is a block diagram showing a configuration of a shift register circuit according to an Application 3 of the present invention.

FIG. 38 shows a configuration of a shift register circuit according to an Application 3 of the present invention. Referring to FIG. 38, the shift register circuit 61A according to the Application 3 includes a plurality of shift circuits 10 according to the third embodiment or shift circuits 10A or 10B according to the Modification 1 or 2 to the third embodiment connected as shifting stages in cascade connection. The clock pulse CK and the opposite phase clock pulse xCK are applied alternatively to the transfer stages, and a start pulse ST for triggering a shifting operation is applied as the input pulse IN to the first shift stage. Further, the output pulse OUT of each transfer stage is used as the input pulse IN to the next stage, and such output pulses OUT are led out as transfer pulses o1, o2, o3, . . . .

Figure 39:
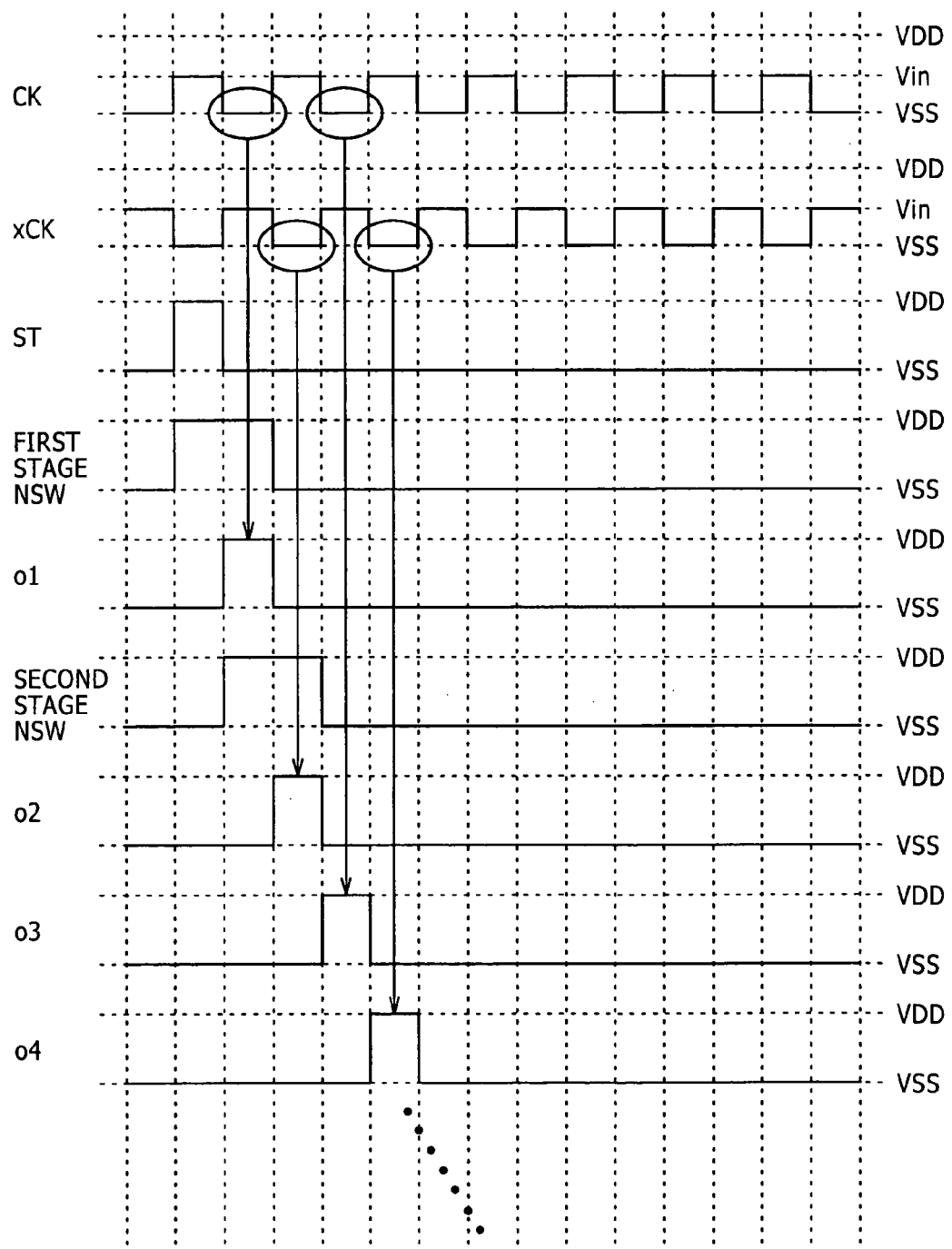
FIG. 39 is a timing chart illustrating operation of the shift register circuit of FIG. 38.

Further, to the transfer stages, the reset pulse "rest" always exhibiting the High potential (power supply potential VDD) during driving and a fixed voltage Vin are applied commonly. However, where the shift circuit 10 according to the first embodiment is used for each transfer stage, there is no necessity to apply the fixed voltage Vin. FIG. 39 illustrates a timing relationship of the clock pulses CK and xCK, start pulse ST, control pulses NSW at the first and second stages, and transfer pulses o1, o2, o3, o4, . . . at the transfer stages.

[Application 4]

Figure 40:
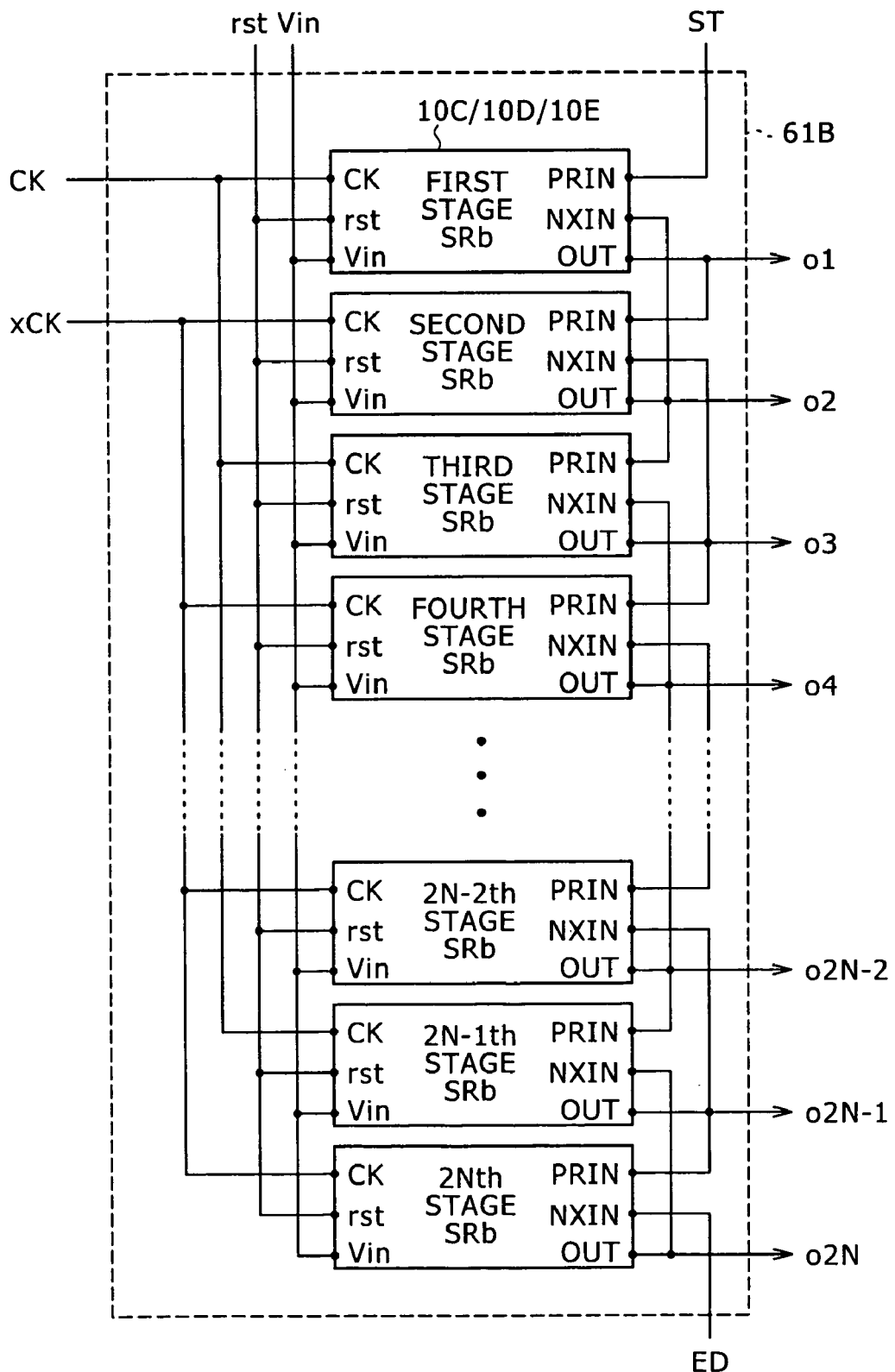
FIG. 40 is a block diagram showing a configuration of a shift register circuit according to an Application 4 of the present invention.

FIG. 40 shows a configuration of a shift register circuit according to an Application 4 of the present invention. Referring to FIG. 40, the shift register circuit 61B according to the present Application 4 includes 2N (N is a natural number) stages (even number stages) of shift circuits 10C to 10E according to the Modification 3 to 5 to the third embodiment connected in cascade connection. The clock pulse CK and the opposite phase clock pulse xCK are applied alternately to the transfer stages, and the input pulse PRIN and the start pulse ST are applied to the first shift stage. Further, at each transfer stage, the output pulse OUT of the self stage is used as the input pulse PRIN to the next stage and, such output pulses OUT are led out as transfer pulses o1, o2, o3, . . . .

Further, to the transfer stages, the reset pulse "rest" normally exhibiting the Low potential (power supply potential VSS) during driving and the fixed voltage Vin are applied commonly. However, where the shift circuit 10C according to the Modification 3 is used for the transfer stages, there is no necessity to apply the fixed voltage Vin.

The shift circuits 10C to 10E according to the Modifications 3 to 5 are circuits in which it is necessary to use the output pulse OUT of the next stage as the input pulse NXIN to the self stage. However, where the last stage (2Nth stage) is the transfer stage, since it has no next transfer stage, an end pulse ED corresponding to the output pulse of the next stage from the outside is applied to the last transfer stage in place of the output pulse of the next stage.

Figure 41:
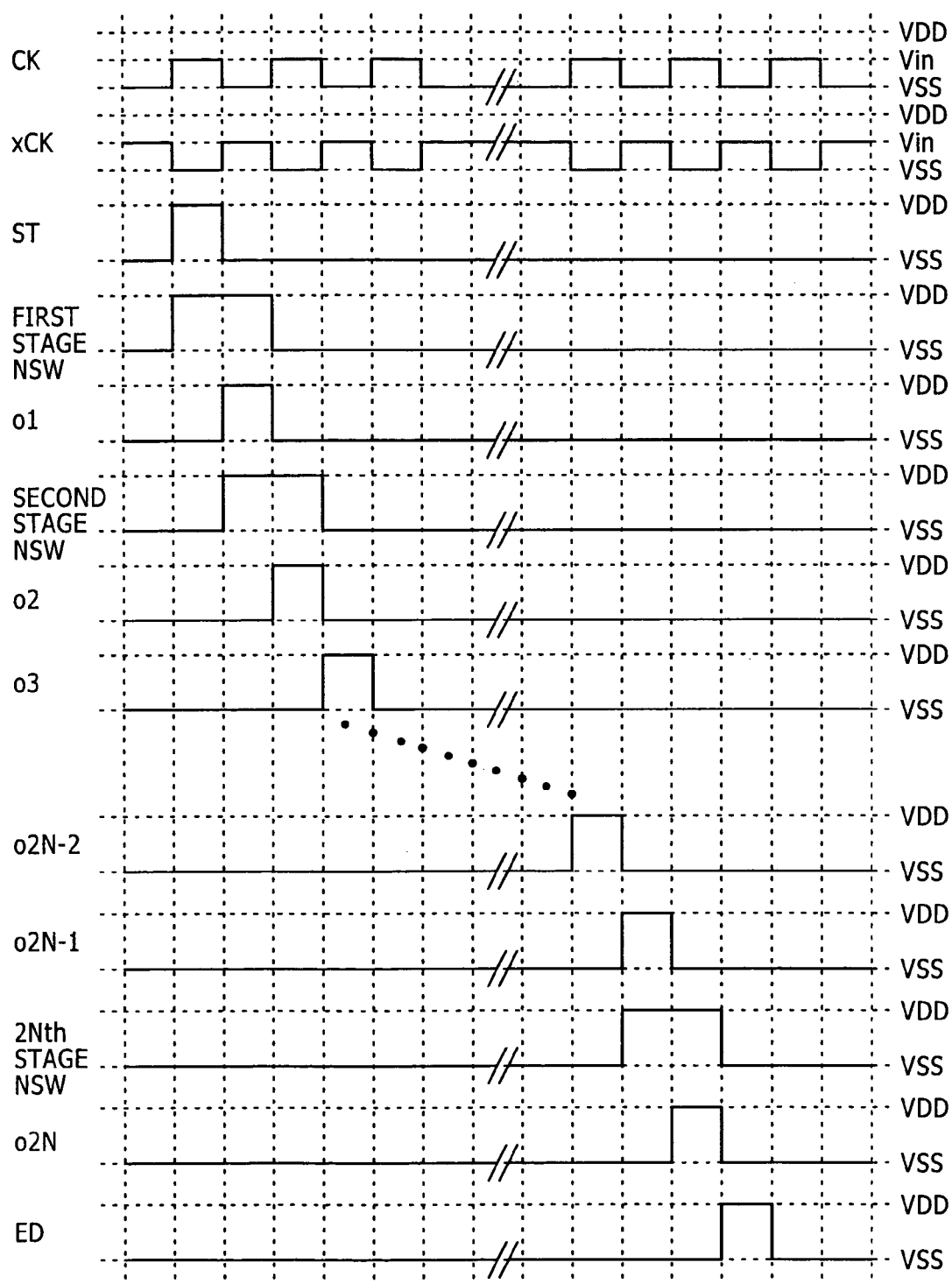
FIG. 41 is a timing chart illustrating operation of the shift register circuit of FIG. 40.

FIG. 41 illustrates a timing relationship of the clock pulses CK and xCK, start pulse ST, control pulses NSW at the first, second, and 2Nth stages, output pulses (transfer pulses) o1, o2, o3, . . . , and o2N of the transfer stages, and end pulse ED.

[Application 5]

Figure 42:
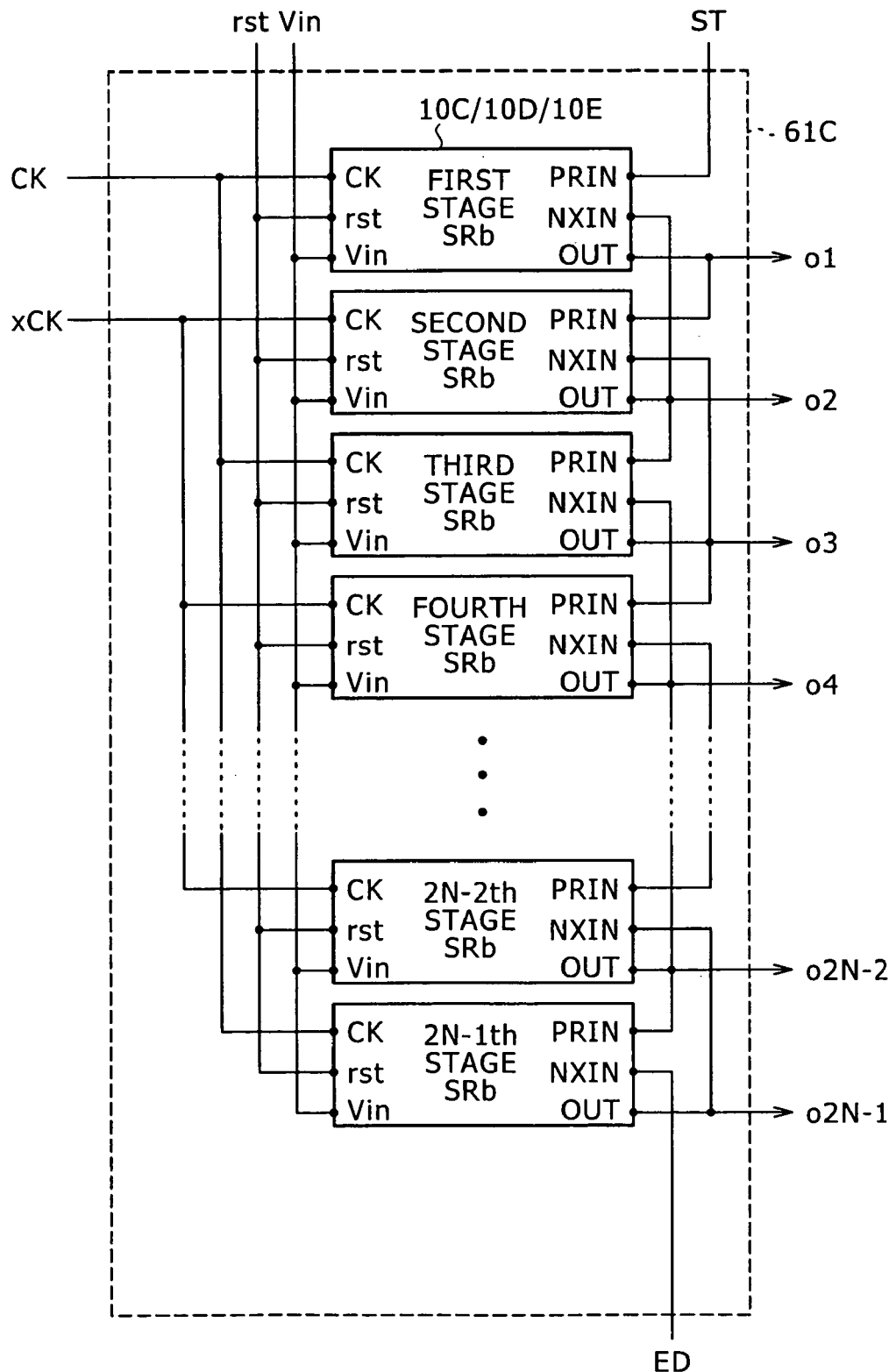
FIG. 42 is a block diagram showing a configuration of a shift register circuit according to an Application 5 of the present invention.

FIG. 42 shows a configuration of a shift register circuit according to an Application 5 of the present invention. Referring to FIG. 42, the shift register circuit 61C according to the Application 5 includes 2N-1 (odd number of) shift circuits 10C to 10E according to the Modifications 3 to 5 to the third embodiment connected in cascade connection and is different from the shift register circuit 61B according to the Application 4 in that the number of transfer stages is an odd number while the number of transfer stages of the shift register circuit 61B is an even number.

Figure 43:
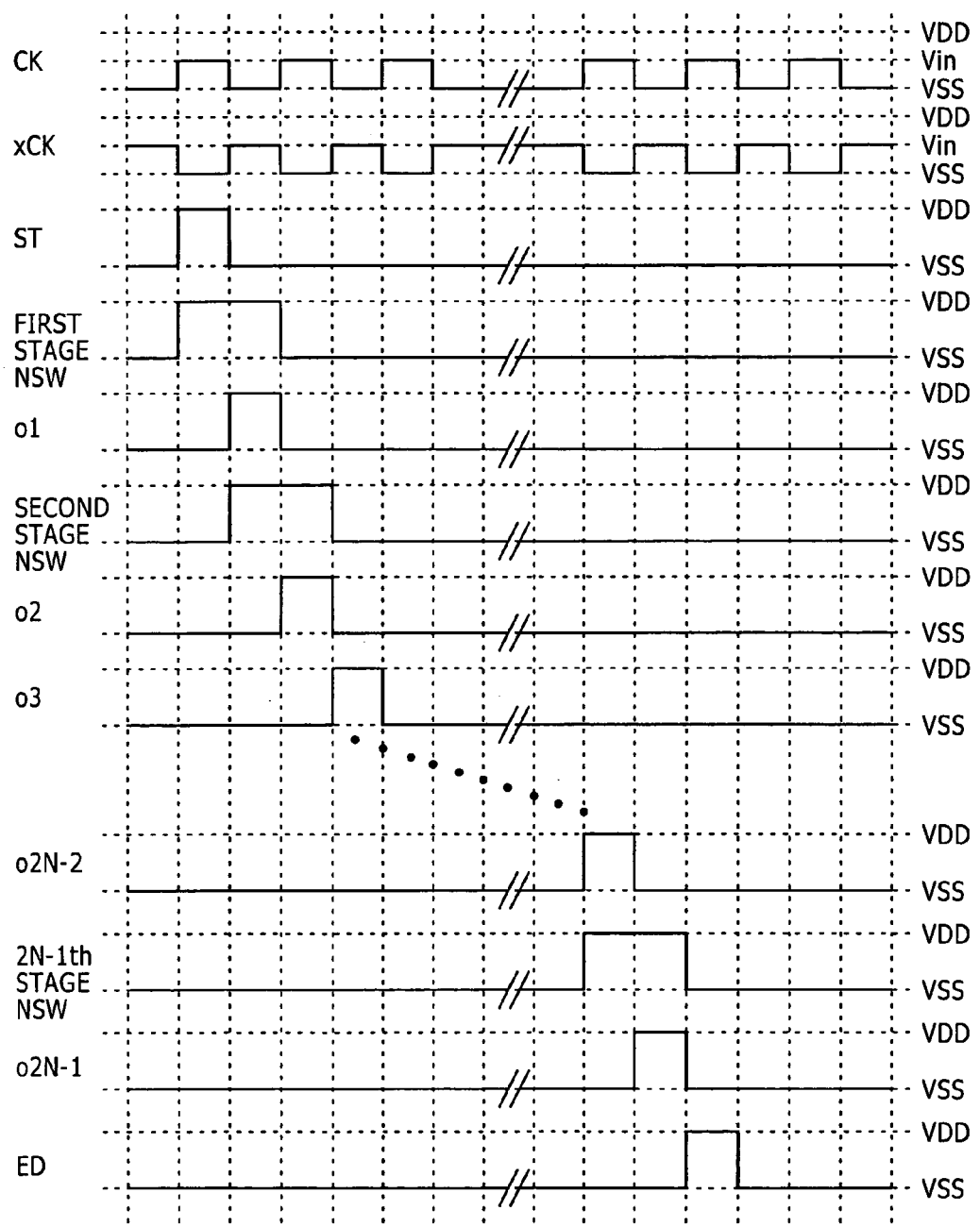
FIG. 43 is a timing chart illustrating operation of the shift register circuit of FIG. 42.

FIG. 43 illustrates a timing relationship of the clock pulses CK and xCK, start pulse ST, control pulses NSW at the first, second, and 2N-1th stages, output pulses (transfer pulses) o1, o2, o3, . . . , and o2N-1 at the transfer stages, and end pulse ED.

[Application 6]

Figure 44:
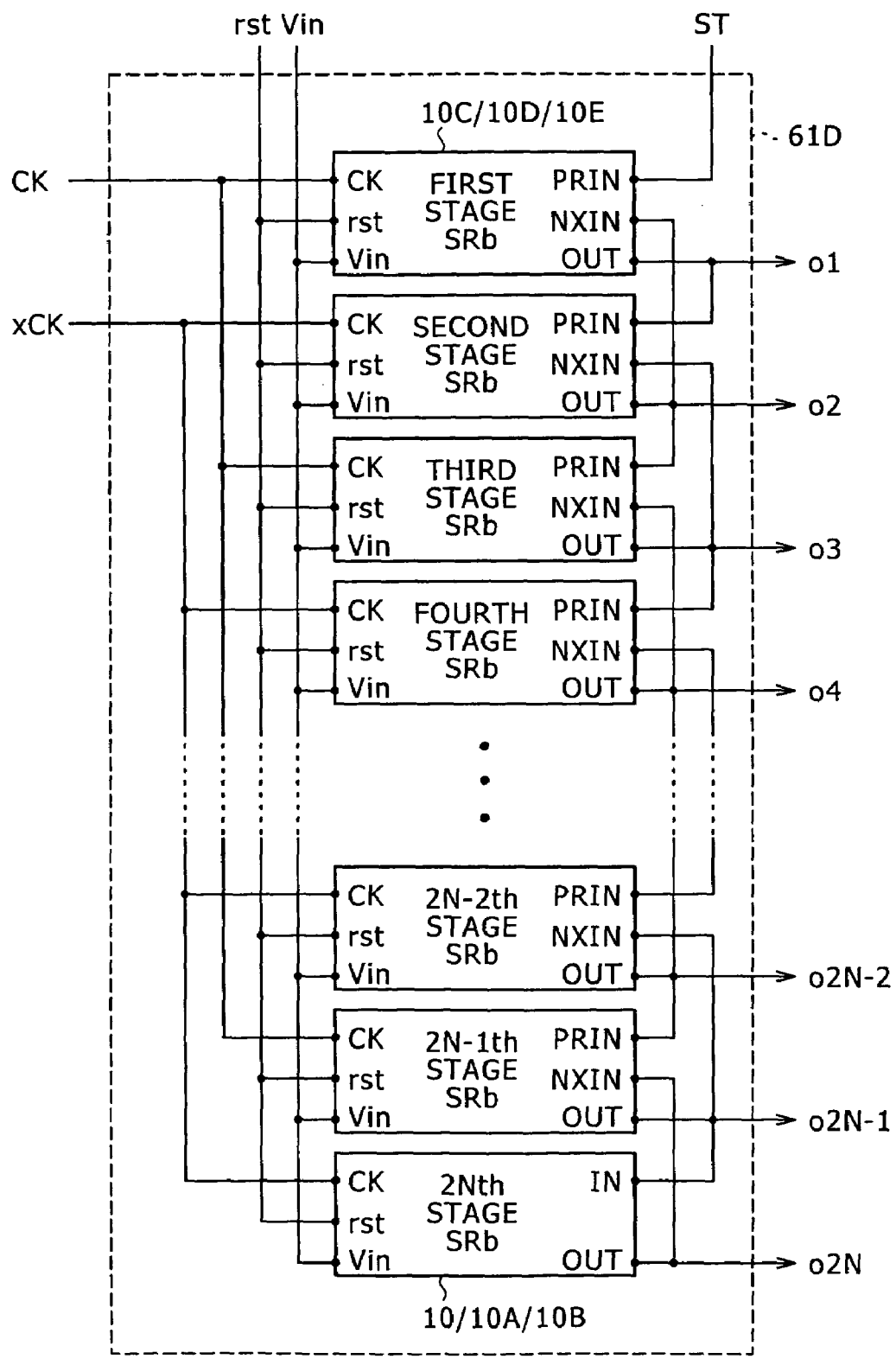
FIG. 44 is a block diagram showing a configuration of a shift register circuit according to an Application 6 of the present invention.

FIG. 44 shows a configuration of a shift register circuit according to an Application 6 of the present invention. Referring to FIG. 44, the shift register circuit 61D according to the present Application 6 includes 2N transfer stages (even number stages) and uses the shift circuits 10C to 10E according to the Modification 3 to 5 to the third embodiment as the first to 2N-1th transfer stages but uses the shift circuits 10 according to the third embodiment or shift circuits 10A or 10B according to the Modification 1 or 2 to the shift circuit 10 as the last transfer stage (2Nth stage).

Since the shift circuit 10 according to the third embodiment or the shift circuit 10A or 10B according to the Modification 1 or 2 to the third embodiment is arranged as the last transfer stage, there is an advantage that the necessity to provide the end pulse ED to the last transfer stage from the outside is eliminated. While the example described here includes an even number of transfer stages, also where the number of transfer stages is an odd number (FIG. 42), it is possible to dispose the shift circuit 10 according to the third embodiment or the shift circuit 10A or 10B according to the Modification 1 or 2 to the third embodiment as the last transfer stage.

[Application 7]

Figure 45:
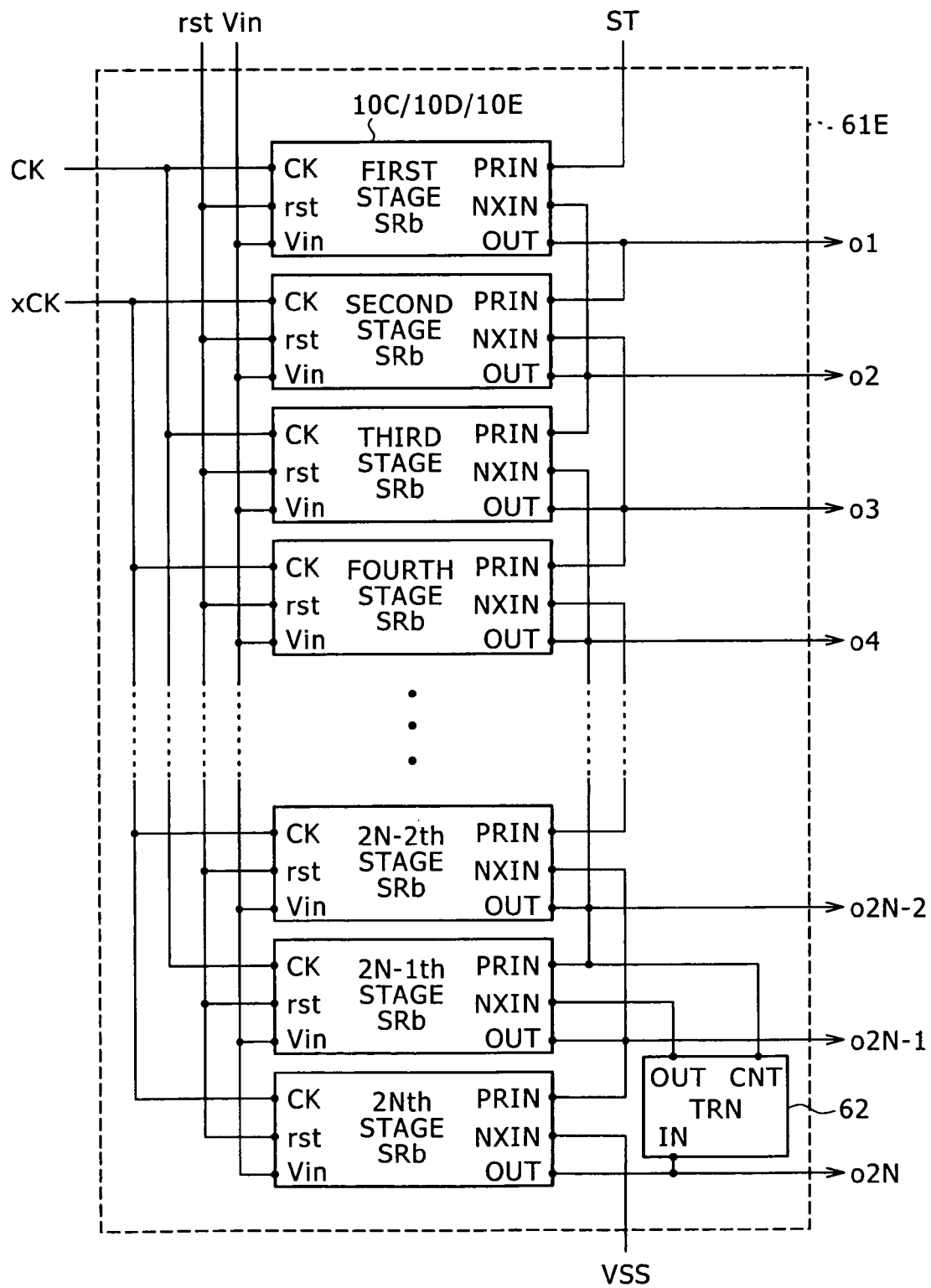
FIG. 45 is a block diagram showing a configuration of a shift register circuit according to an Application 7 of the present invention.

FIG. 45 shows a configuration of a shift register circuit according to an Application 7 of the present invention. Referring to FIG. 45, the shift register circuit 61E according to the Application 7 is configured such that 2N stages (even number stages) of shift circuits 10C to 10E according to the Modification 3, 4, or 5 to the third embodiment are connected in cascade connection and the power supply potential VSS is applied to the last transfer stage in place of the end pulse ED. Further, the shift register circuit 61E additionally includes a TRN circuit 62.

The TRN circuit 62 receives the output pulse OUT of the 2Nth transfer stage as an input pulse IN thereto and receives the input pulse PRIN of the 2N-1th transfer stage as a control pulse CNT. When the control pulse CNT has the High potential VDD, the TRN circuit 62 outputs the Low potential VSS, but when the control pulse CNT has the Low potential VSS, the TRN circuit 62 passes the input pulse IN therethrough, that is, the output pulse OUT of the 2Nth transfer stage therethrough. The output pulse OUT of the TRN circuit 62 is applied as an input pulse NXIN to the 2N-1th transfer stage.

If the power supply potential VSS is inputted in place of the end pulse ED to the last transfer stage, then once the control pulse NSW at the transfer stages formed from the shift circuits 10C to 10E according to the Modifications 3 to 5 to the third embodiment becomes the High potential, the transfer stages act as a level shifting circuit until they are reset. Accordingly, the output o2N at the last stage has a waveform level-shifted from that of the clock pulse CK. Therefore, it is significant to provide the TRN circuit 62 in order to produce the control pulse NSW for the 2N-1th stage of a normal waveform. Further, where the start pulse ST is used in place of the end pulse ED, the last stage can be reset every time the start pulse ST becomes ST=High (the last stage functions as a level shifter only within a period of time from o2N-1=High to ST=High). In this instance, the TRN circuit 62 is not required.

Figure 46:
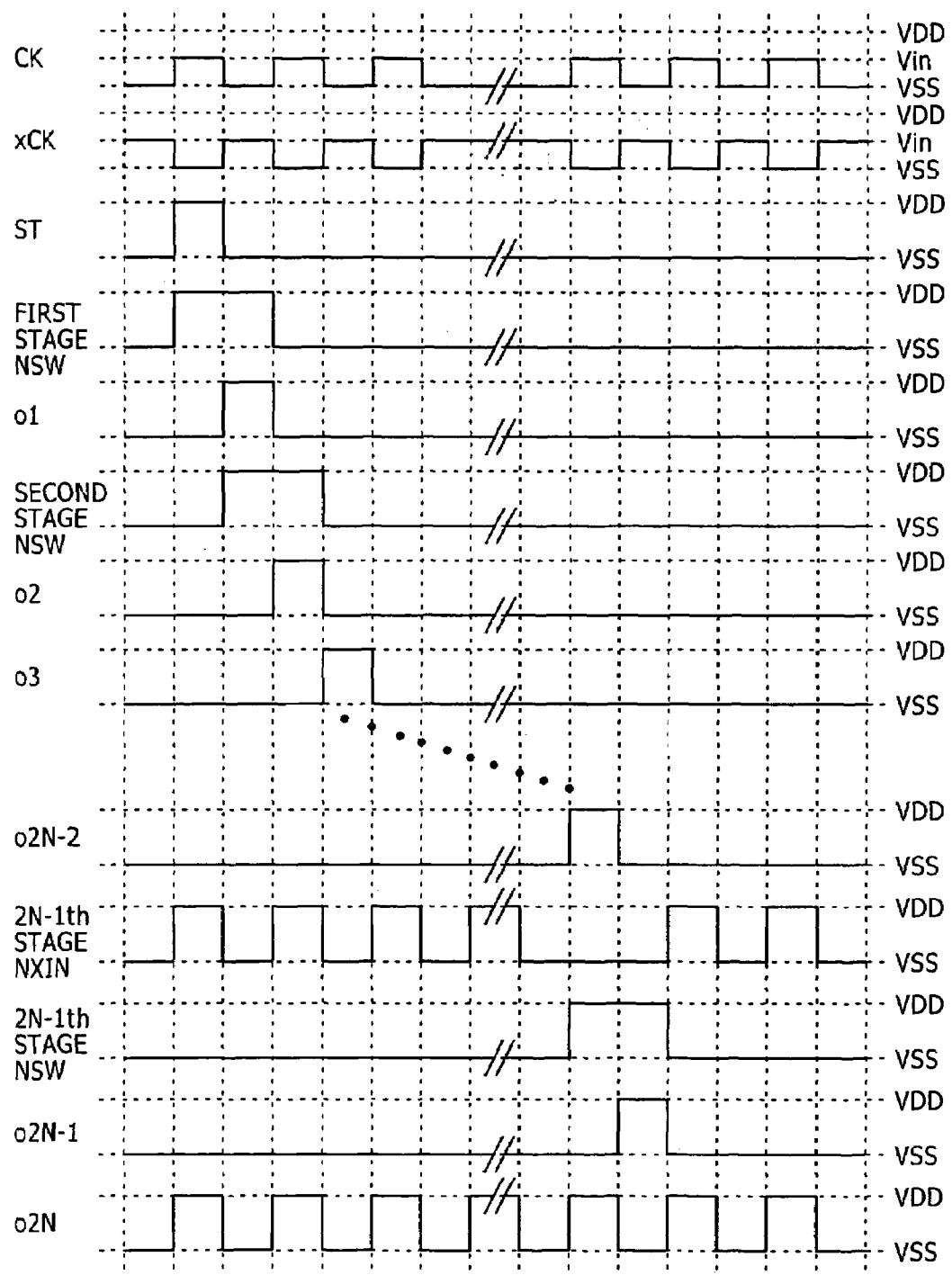
FIG. 46 is a timing chart illustrating operation of the shift register circuit of FIG. 45.

FIG. 46 illustrates a timing relationship of the clock pulses CK and xCK, start pulse ST, control pulses NSW at the first, second, and 2N-1th stages, and output pulses (transfer pulses) o1, o2, o3, . . . , and o2N-1 at the transfer stages.

Figure 47:
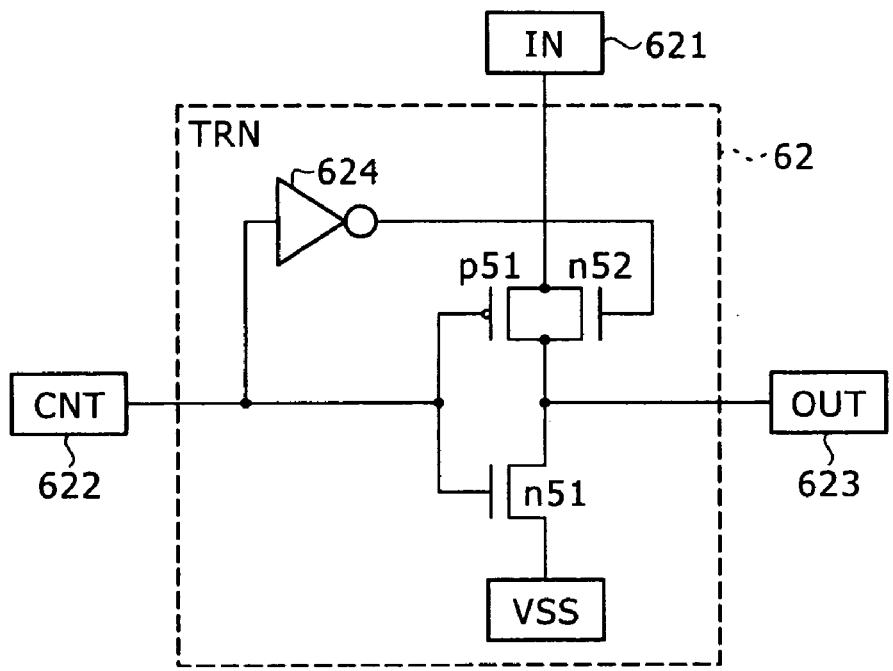
FIG. 47 is a circuit diagram showing an example of a configuration of a TRN circuit shown in FIG. 45.
Figure 48:
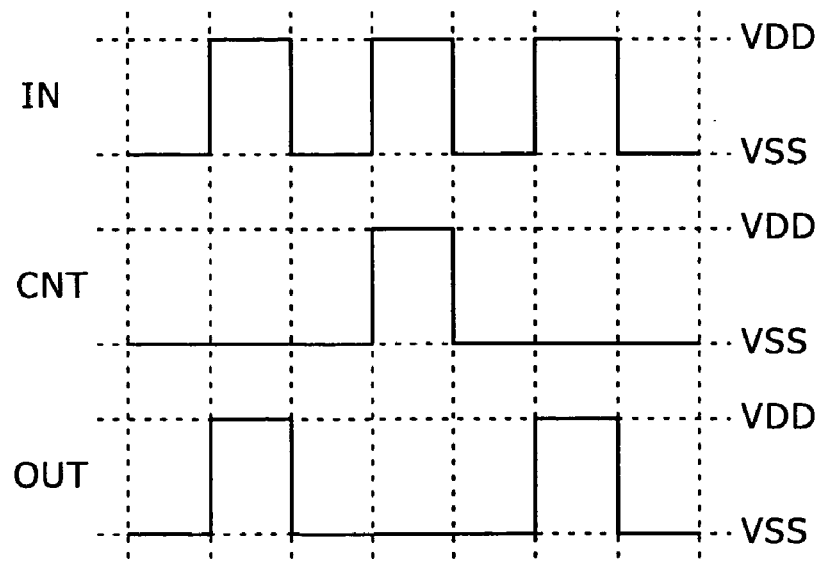
FIG. 48 is a timing chart illustrating operation of the TRN circuit of FIG. 47.

FIG. 47 shows an example of a configuration of the TRN circuit 62. FIG. 48 illustrates a timing relationship of the input pulse IN, control pulse CNT, and output pulse OUT.

Referring to FIG. 47, the TRN circuit 62 of the example shown includes a PMOS transistor p51 and an NMOS transistor n51 connected in series between an input terminal 621 and the power supply potential VSS. The gates of the PMOS transistor p51 and the NMOS transistor n51 are connected commonly and connected to a control terminal 622, and the drains of the PMOS transistor p51 and the NMOS transistor n51 are connected commonly and connected to an output terminal 623. The TRN circuit 62 further includes an NMOS transistor n52 connected in parallel to the PMOS transistor p51, and an inverter circuit 624 for inverting and applying the control pulse CNT to the gate of the NMOS transistor n52.

Thus, in the shift register circuit 61E, the shift circuits 10C to 10E according to the Modifications 3 to 5 to the third embodiment are connected in cascade connection at 2N stages (even number stages). The TRN circuit 62 is provided in the proximity of the last transfer stage and the power supply potential VSS is applied to the last transfer stage in this manner. There is an advantage that the necessity for applying the end pulse ED to the last transfer stage is eliminated.

It is to be noted here that, while the example described here includes an even number of transfer stages, also where the number of transfer stages is an odd number, similar action and advantages can be anticipated if a configuration is adopted wherein the TRN circuit 62 is provided in the proximity of the last transfer stage (2N-1th stage) and the power supply voltage VSS is applied to the last transfer stage.

Figure 49:
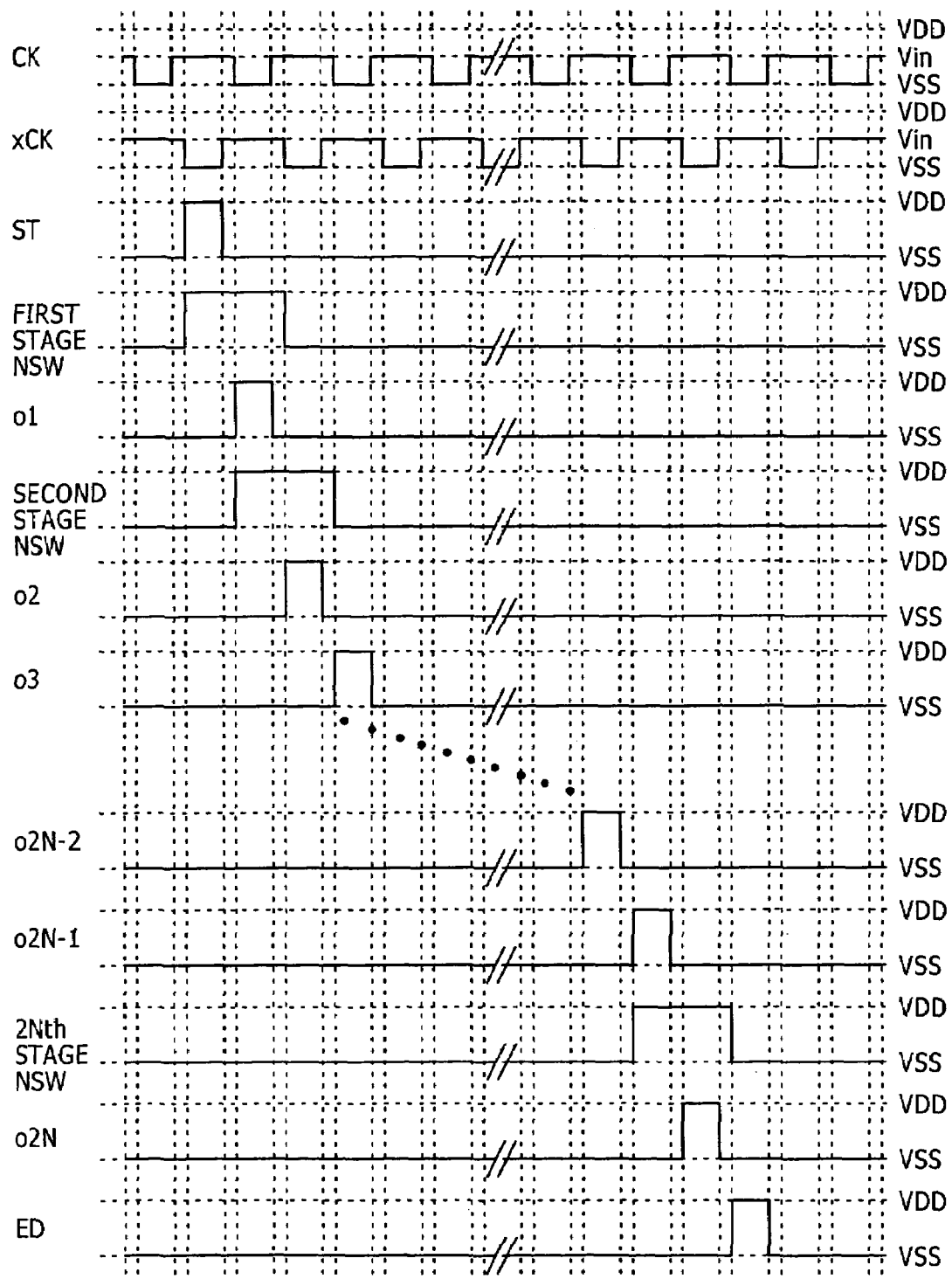
FIGS. 49 and 50 are timing charts illustrating timing relationships where a blanking period is provided between transfer pulses.
Figure 50:
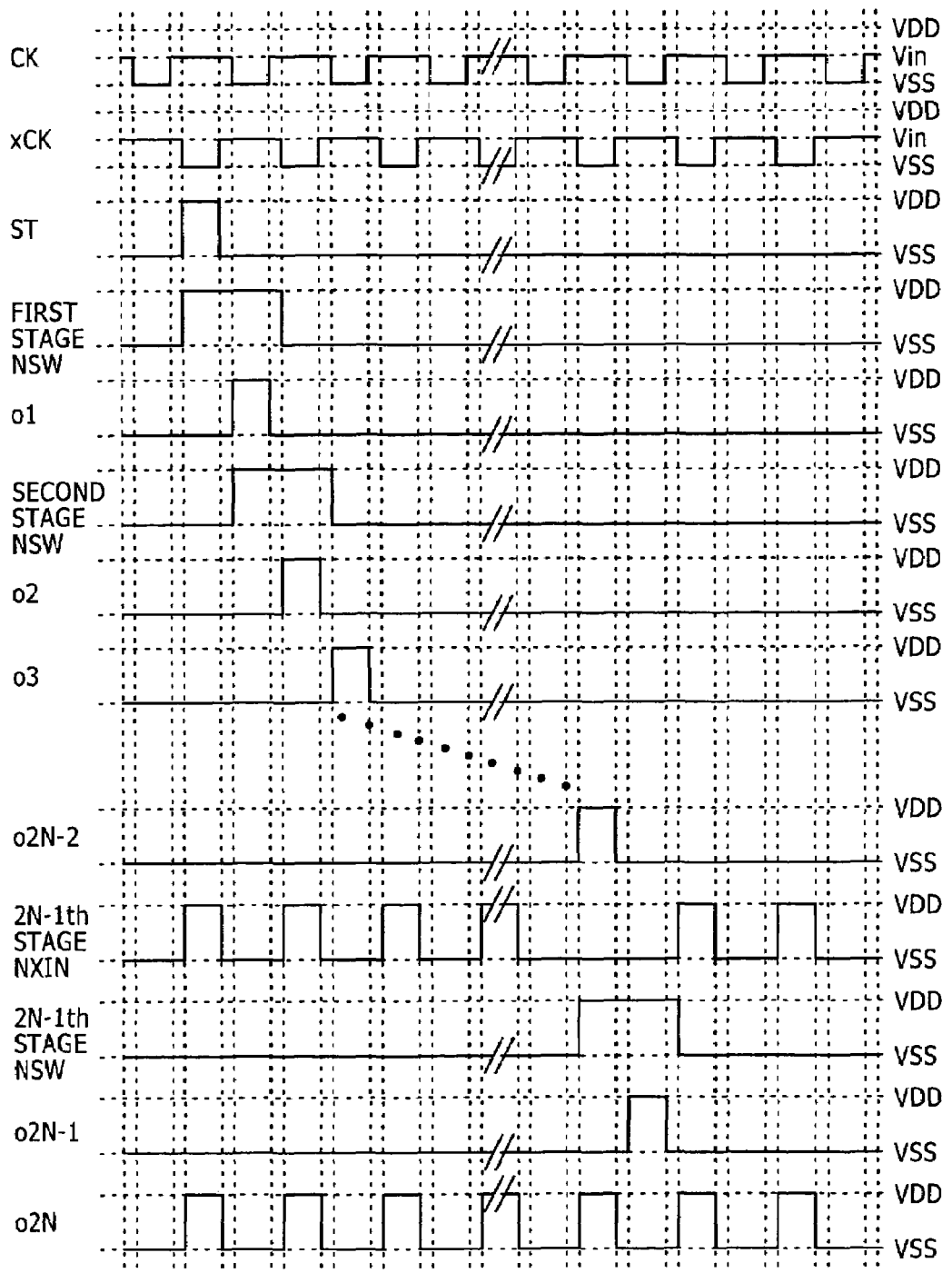

Further, it is described that the shift register circuits 61A to 61E according to the applications described above produce transfer pulses o1, o2, o3, . . . that do not have a blanking period therebetween. However, the shift register circuits, which uses the shift circuits 10C to 10E according to the Modifications 3 to 5 to the third embodiment as transfer stages, that is, the shift register circuit 61B according to the Application 4 of FIG. 40 and the shift register circuit 61E according to the Application 5 of FIG. 45 can provide a blanking period. The blanking period is provided between transfer pulses by forming a blanking period at the timings of the clock pulses CK and xCK as seen in the timing charts of FIGS. 49 and 50.

Here, a Vin potential generation circuit for generating the fixed voltage Vin used by the shift register circuits 61A to 61E according to the Applications 3 to 7 is described.

Figure 51:
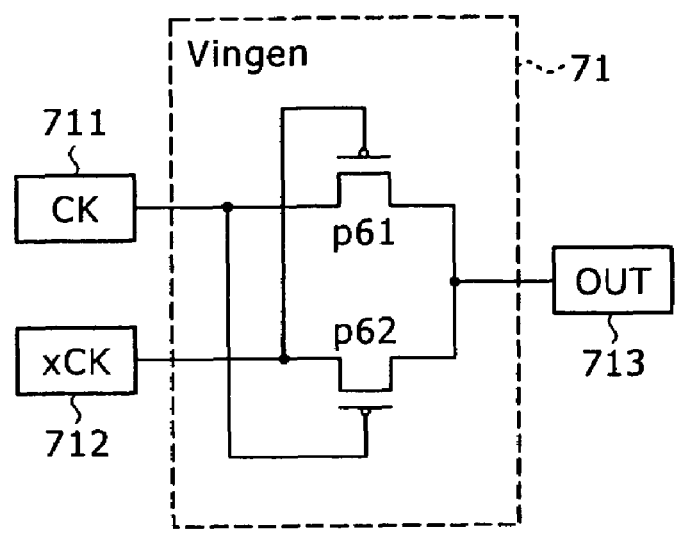
FIG. 51 is a circuit diagram showing an example of a configuration of a Vin potential generation circuit.

Although the fixed voltage Vin to be applied to the transfer stages of the shift register circuits 61A to 61E according to the Applications 3 to 7 may be inputted from the outside, since the fixed voltage Vin is the High potential of the clock pulses CK and xCK, the fixed voltage Vin can be generated by a Vin potential generation circuit 71 having a configuration shown in FIG. 51.

Referring to FIG. 51, the Vin potential generation circuit 71 includes a PMOS transistor p61 connected between a clock terminal 711 to which the clock pulse CK is inputted and an output terminal 713, and another PMOS transistor p62 connected between another clock terminal 712 to which the clock pulse xCK is inputted and the output terminal 713. The clock pulse xCK is applied to the gate of the PMOS transistor p61, and the clock pulse CK is applied to the gate of the PMOS transistor p62.

Figure 52:
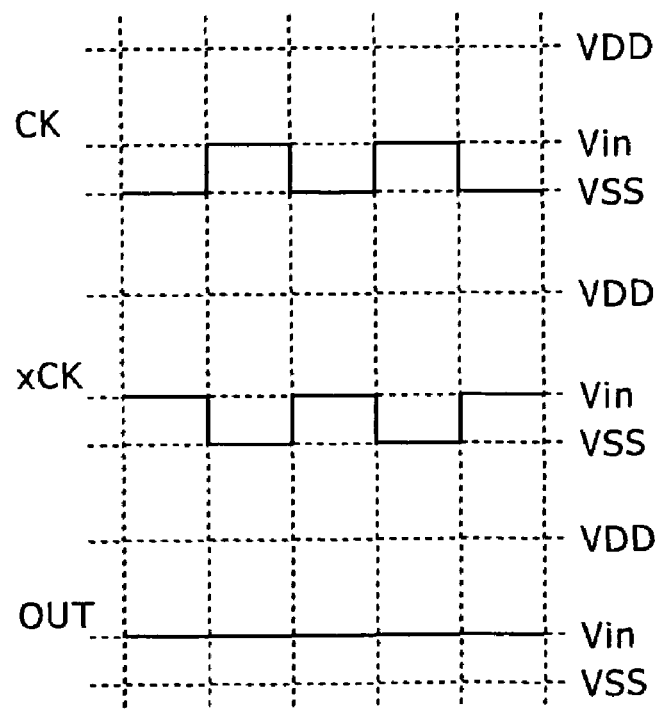
FIGS. 52 and 53 are timing charts illustrating different operations of the Vin potential generation circuit of FIG. 51.
Figure 53:
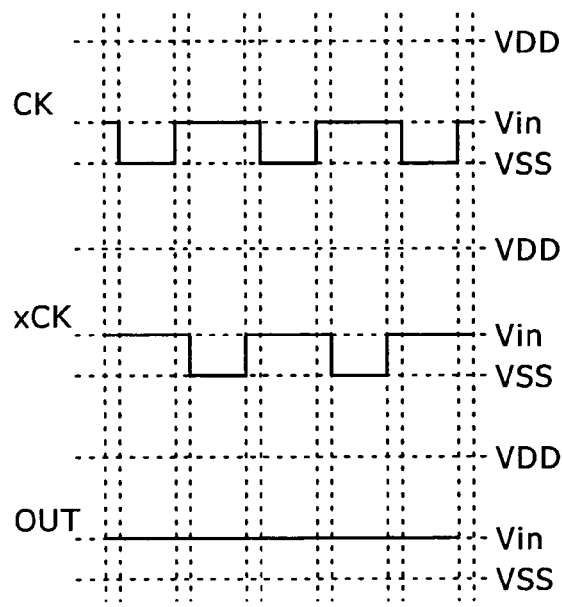

A timing relationship of the clock pulses CK and xCK and the output OUT of the fixed voltage Vin is illustrated in FIG. 52. Further, a timing relationship where a blanking period is provided between the clock pulses CK and xCK is illustrated in FIG. 53. Where a blanking period is provided between the clock pulses CK and xCK, the fixed voltage Vin can be supplied except within the blanking periods.

Where a shift register circuit wherein a plurality of transfer stages (shift stages) are connected in cascade connection uses, for each transfer stage, the shift circuit 10 (10A, 10B, 10C, 10D, or 10E) formed from a combination pattern of the level shifting section 11 (11A, 11B, or 11C) and the control pulse generation section 12 (12A, 12B1, 12B2, or 12B3), no leak current flows to the level shifting section 11 (11A, 11B, or 11C) and the power consumption decreases. Consequently, reduction of the power consumption by the shift register circuit can be anticipated.

The shift register circuits 61A to 61E according to the Applications 3 to 7 can be used as a popular shift register circuit with a level shifting function. Further, as an example, the shift register circuits 61A to 61E can be used as a shift register circuit forming a scanner for a vertical driver or a horizontal driver in a display apparatus of the type integrated with a drive circuit. In the display apparatus, peripheral drive circuits for driving a pixel array section wherein pixels each including an electro-optical element are arranged two-dimensionally in rows and columns are formed on a board on which the pixel array section is disposed.

APPLIED EXAMPLE 2

Figure 54:
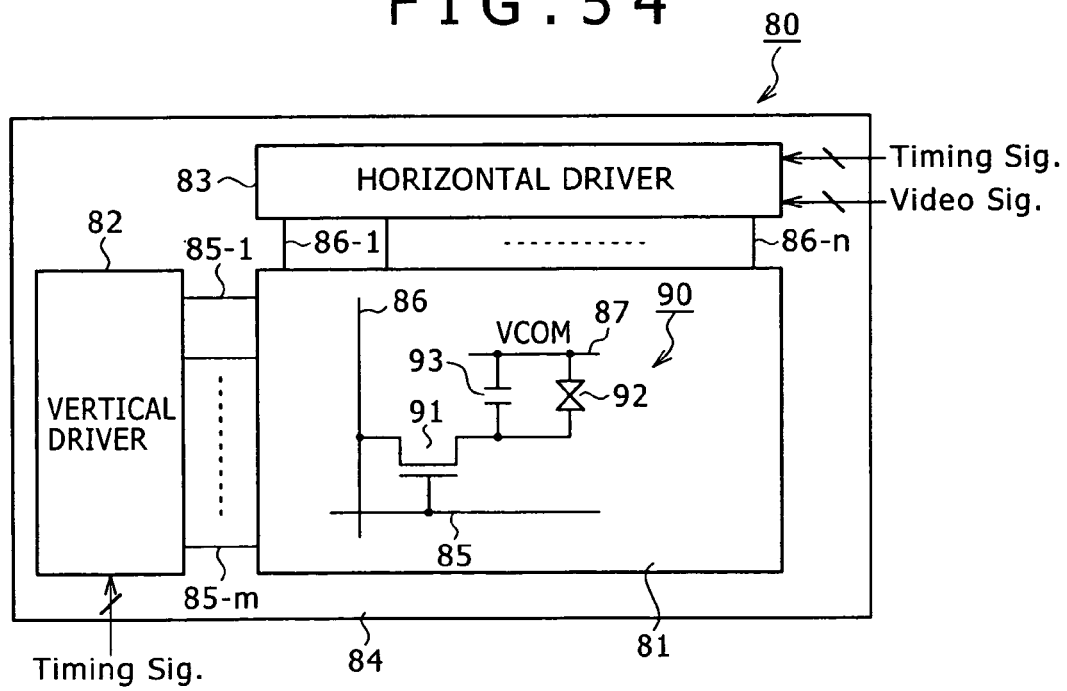
FIG. 54 is a block diagram showing an example of a configuration of an active matrix type liquid crystal display apparatus according to another applied example of the present invention.

FIG. 54 shows an example of a configuration of a display apparatus according to an Applied Example of the present invention. The display apparatus shown in FIG. 54 is formed as an active matrix type liquid crystal display apparatus. A liquid crystal cell is used as an electro-optical element of a pixel.

Referring to FIG. 54, the active matrix type liquid crystal display apparatus 80 according to the present Applied Example includes a pixel array section 81, a vertical driver 82, a horizontal driver 83, and so forth. Peripheral driving circuits including the vertical driver 82 and the horizontal driver 83 are formed on a liquid crystal panel 84 on which the pixel array section 81 is provided. The liquid crystal panel 84 is configured such that two insulating substrates such as, for example, glass substrates are disposed in an opposing relationship with a fixed gap left therebetween, and a liquid crystal material is encapsulated in the gap.

The pixel array section 81 has pixels 90 disposed two-dimensionally in m rows and n columns thereon. Further, on the matrix array of the pixels 90, scanning lines 85-1 to 85-m are wired for the individual rows and signal lines 86-1 to 86-n are wired for the individual columns. Each of the pixels 90 includes a TFT (Thin Film Transistor) 91 as a pixel transistor, a liquid crystal cell 92 having a pixel electrode connected to the drain electrode of the TFT 91, and a retention capacitor 93 connected at one of electrodes thereof to the drain electrode of the TFT 91.

In the pixel structure described, the TFT 91 of each of the pixels 90 is connected at the gate electrode thereof to a scanning line 85 (85-1 to 85-m) and at the source electrode thereof to a signal line 86 (86-1 to 86-n). Meanwhile, an opposing electrode of the liquid crystal cell 92 and the other electrode of the retention capacitor 93 are connected to a common line 87 to which a common voltage VCOM is applied.

The vertical driver 82 is formed from a shift register circuit or the like and selects the pixels 90 of the pixel array section 81 in a unit of a row. The horizontal driver 83 is formed from a shift register circuit, sampling switches, or the like and writes a video signal inputted from the outside of the panel sequentially in a unit of a pixel (dot-sequentially) or simultaneously in a unit of a row (line-sequentially) into the pixels 90 of the row selected by the vertical driver 82.

In the active matrix type liquid crystal display apparatus 80 having the configuration described above, the shift register circuits 61A to 61E according to the Applications 1 to 5 described hereinabove are used as a shift register circuit forming at least one of the vertical driver 82 and the horizontal driver 83.

Where the shift register circuits 61A to 61E are used as a shift register circuit forming the vertical driver 82 or the horizontal driver 83 in this manner, since the shift register circuits 61A to 61E use, for each transfer stage, the shift circuit 10 including the level shifting section 11 (11A, 11B, or 11C), which does not involve leak current and exhibits low current consumption, the power consumption by the shift register circuits 61A to 61E is low. As a result, reduction in power consumption of the liquid crystal display apparatus 80 can be achieved.

In the Applied Example described above, the present invention is applied to a liquid crystal display apparatus wherein a liquid crystal cell is used as an electro-optical element of a pixel. The application of the present invention is not limited to the liquid crystal display apparatus, but the present invention can be applied also to various display apparatus. For example, a vertical driver or a horizontal driver formed using a shift register circuit is formed on a board on which the pixel array section is formed such as an EL display apparatus wherein an EL (Electro Luminescence) element is used as an electro-optical element of a pixel. Further, it is applicable to other various apparatus incorporating a scanner formed using a shift register circuit.

Fourth Embodiment

Figure 55:
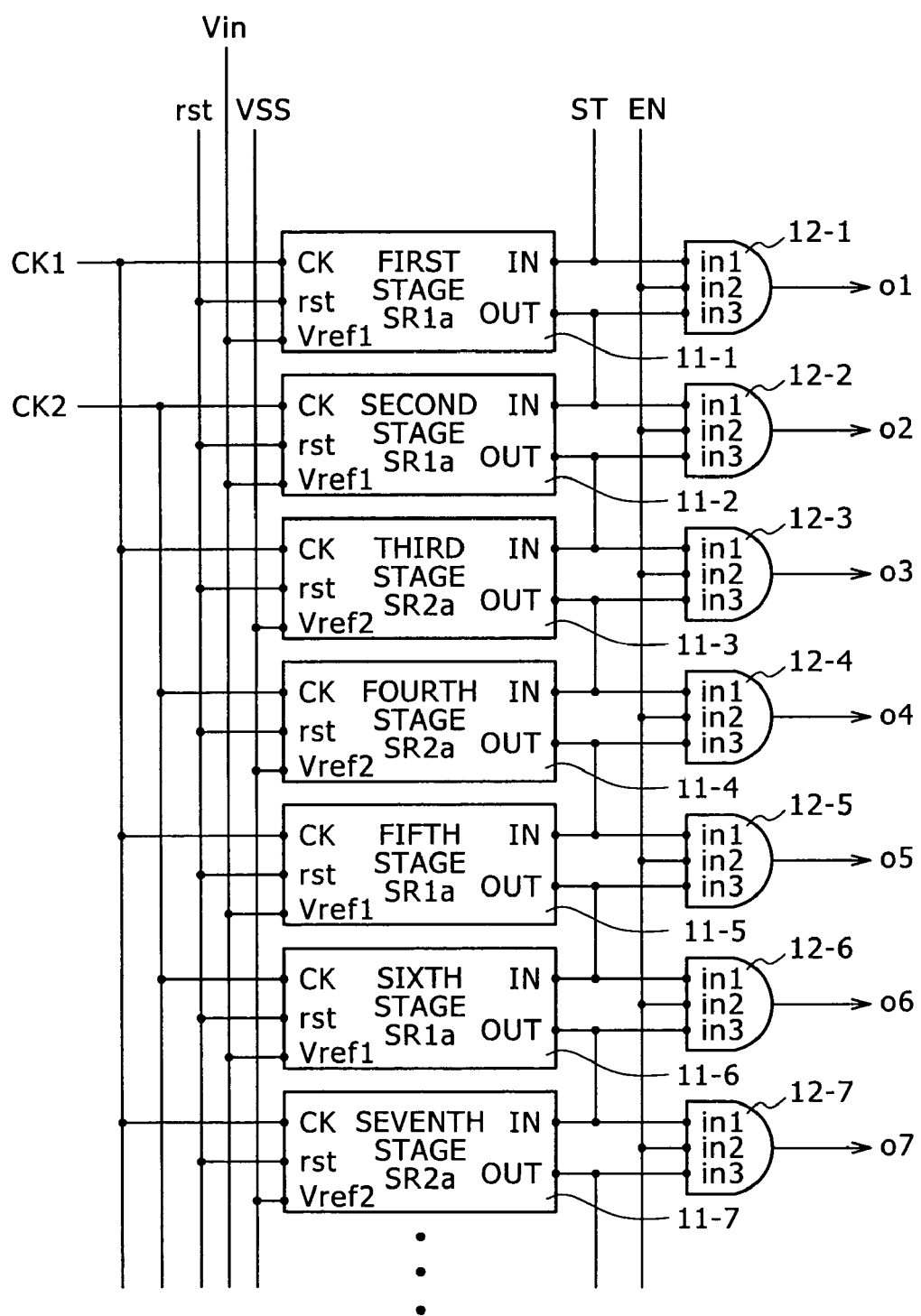
FIG. 55 is a block diagram showing a configuration of a shift register circuit according to a fourth embodiment of the present invention.

FIG. 55 shows a configuration of a shift register circuit according to a fourth embodiment of the present invention. Referring to FIG. 55, the shift register circuit 10 according to the present embodiment includes a first shift circuit 11-1 and a second shift circuit 11-2 paired with each other and connected in cascade connection, and a third shift circuit 11-3 and a fourth shift circuit 11-4 paired with each other and connected in cascade connection. The two shift circuit pairs are connected alternately in cascade connection. In other words, the shift circuits 11-1 to 11-4 are connected as shift register units (transfer stages/shift stages) in cascade connection, and a plurality of such sets of four shift circuits 11-1 to 11-4 are disposed repetitively and connected in cascade connection.

As hereinafter described in detail, the first shift circuit 11-1 and the second shift circuit 11-2 have a same circuit configuration, and the third shift circuit 11-3 and the fourth shift circuit 11-4 have another circuit configuration. A first clock pulse CK1 is applied to the first and third shift circuits 11-1 and 11-3 while a second clock pulse CK2 having a frequency equal to that of the first clock pulse CK1 and having a phase displaced by a ¼ cycle from the first clock pulse CK1 is applied to the second and fourth shift circuits 11-2 and 11-4.

The first stage first shift circuit 11-1 receives a High-active start pulse ST as a control pulse IN thereto. When the control pulse IN is in an active state (High potential), the shift circuit 11-1 extracts a Low potential side pulse (active Low) of the first clock pulse CK1, level-shifts the Low potential side pulse from a first amplitude to a second amplitude, and outputs the level-shifted Low potential side pulse. The High-active output pulse OUT of the shift circuit 11-1 is applied as the control pulse IN to the second stage shift circuit 11-2.

When the control pulse IN is in an active state, the second stage shift circuit 11-2 extracts a Low potential side pulse of the second clock pulse CK2, level-shifts the Low potential side pulse from the first amplitude to the second amplitude, and outputs the level-shifted Low potential side pulse. The High-active output pulse OUT of the shift circuit 11-2 is applied as the control pulse IN to the third stage shift circuit 11-3.

When the control pulse IN is in an active state, the third stage shift circuit 11-3 extracts a High potential side pulse (active High) of the first clock pulse CK1, level-shifts the High potential side pulse from the first amplitude to the second amplitude, and outputs the level-shifted High potential side pulse. The High-active output pulse OUT of the shift circuit 11-3 is applied as the control pulse IN to the fourth stage shift circuit 11-4.

When the control pulse IN is in an active state, the fourth stage shift circuit 11-4 extracts a High potential side pulse of the second clock pulse CK2, level-shifts the High potential side pulse from the first amplitude to the second amplitude, and outputs the level-shifted High potential side pulse. The High-active output pulse OUT of the shift circuit 11-4 is applied as the control pulse IN to the fifth stage shift circuit 11-5.

Thereafter, the circuit operations of the set of the four shift circuits 11-1 to 11-4 are repeated similarly.

In the shift circuits (transfer stages) 11-1, 11-2, . . . , the input pulse (control pulse) IN to the self stage and the output pulse OUT of the self stage are used as two inputs to 3-input AND circuits 12-1, 12-2, . . . . To the AND circuits 12-1, 12-2, . . . , a Low-active enable pulse EN of a very small pulse width when compared with the pulse width of the clock pulses CK1 and CK2 is applied as the remaining one input. Then, the High-active output pulses of the AND circuits 12-1, 12-2, . . . are led out as transfer pulses o1, o2, . . . of the individual transfer stages. It is to be noted that the enable pulse EN may be used only when it is intended to provide a blanking period between transfer pulses.

Figure 56:
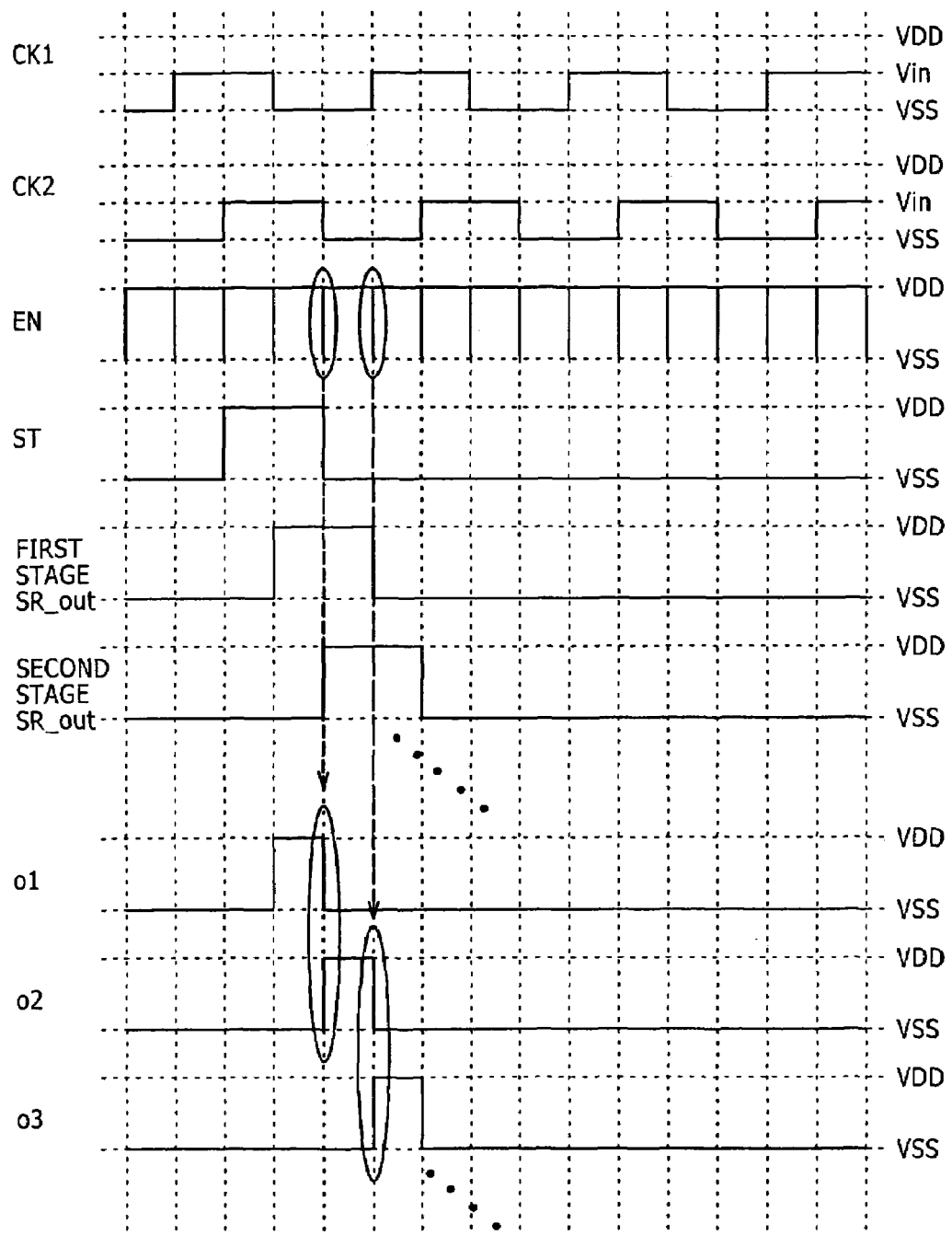
FIG. 56 is a timing chart illustrating operation of the shift register circuit of FIG. 55.

FIG. 56 illustrates a timing relationship of the clock pulses CK1 and CK2, enable pulse EN, start pulse ST, output pulses SR_out at the first and second stages, and transfer pulses o1, o2, o3, . . . . As can be seen apparently from the timing chart of FIG. 56, the shift circuits 11-1, 11-2, . . . extract the clock pulses CK1 and CK2 of the first amplitude (VSS-Vin) and level-shift (level-convert) the clock pulses CK1 and CK2 to the transfer pulses o1, o2, o3, . . . of the second amplitude (VSS-VDD).

As described hereinabove, in the shift register circuit 10 according to the fourth embodiment, the first shift circuit 11-1 and the second shift circuit 11-2 are paired with each other and connected in cascade connection while the third shift circuit 11-3 and the fourth shift circuit 11-4 are paired with each other and connected in cascade connection. Then, such two shift circuit pairs are connected alternately in cascade connection, and the first clock pulse CK1 and the second clock pulse CK2 having phases displaced by a ¼ cycle from each other are applied alternately to the repetitive arrangement of such shift register units (transfer stages). Thus, the frequency of the clock pulses CK1 and CK2 can be used for driving that is reduced to ½ that of the clock pulses CK and xCK used in the shift register circuit in related art wherein shift register units of the same circuit configuration are disposed repetitively.

Consequently, the burden on a clock generation circuit (not shown) for generating the clock pulses CK1 and CK2 can be reduced to one half. Further, since the driving frequency can be reduced to one half, the power consumption by the shift register circuit 10 itself can be reduced.

Now, a particular configuration of the first to fourth shift circuits (shift register units) 11-1 to 11-4 is described.

Figure 57:
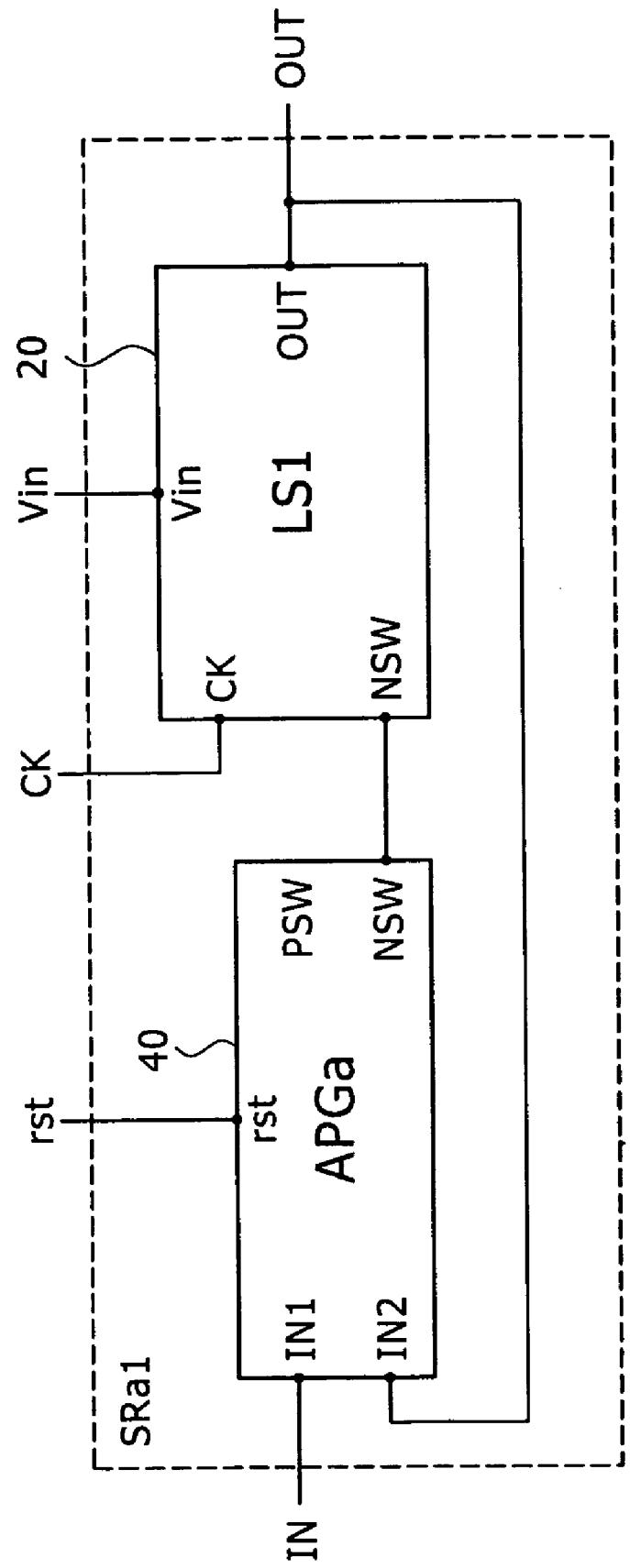
FIG. 57 is a block diagram showing an example of a configuration of first and second shift circuits shown in FIG. 55.

FIG. 57 shows an example of a configuration of the shift circuits 11-1 and 11-2. Referring to FIG. 57, each of the shift circuits 11-1 and 11-2 according to the present examples is configured such that it includes a level shifting section 20 and a control pulse generation section 40.

The level shifting section 20 level-shifts, when the control pulse NSW applied thereto from the control pulse generation section 40 is in an active state, the clock pulse CK from the VSS-Vin amplitude (for example, 0 to 3 V amplitude) to the VSS-VDD amplitude (for example, 0 to 8 V amplitude) and outputs the level-shifted clock pulse CK as the output pulse OUT. The control pulse generation section 40 receives an input pulse to the self stage as one input IN1 thereto and receives the output pulse OUT of the self stage as the other input thereof. Then, the control pulse generation section 40 generates control pulses NSW and PSW of the opposite phases to each other for controlling the driving condition of the level shifting section 20 based on the input pulses IN1 and IN2.

Here, a particular circuit configuration of each of the level shifting section 20 and the control pulse generation section 40 is described. First, a circuit configuration of the level shifting section 20 is described.

Figure 58:
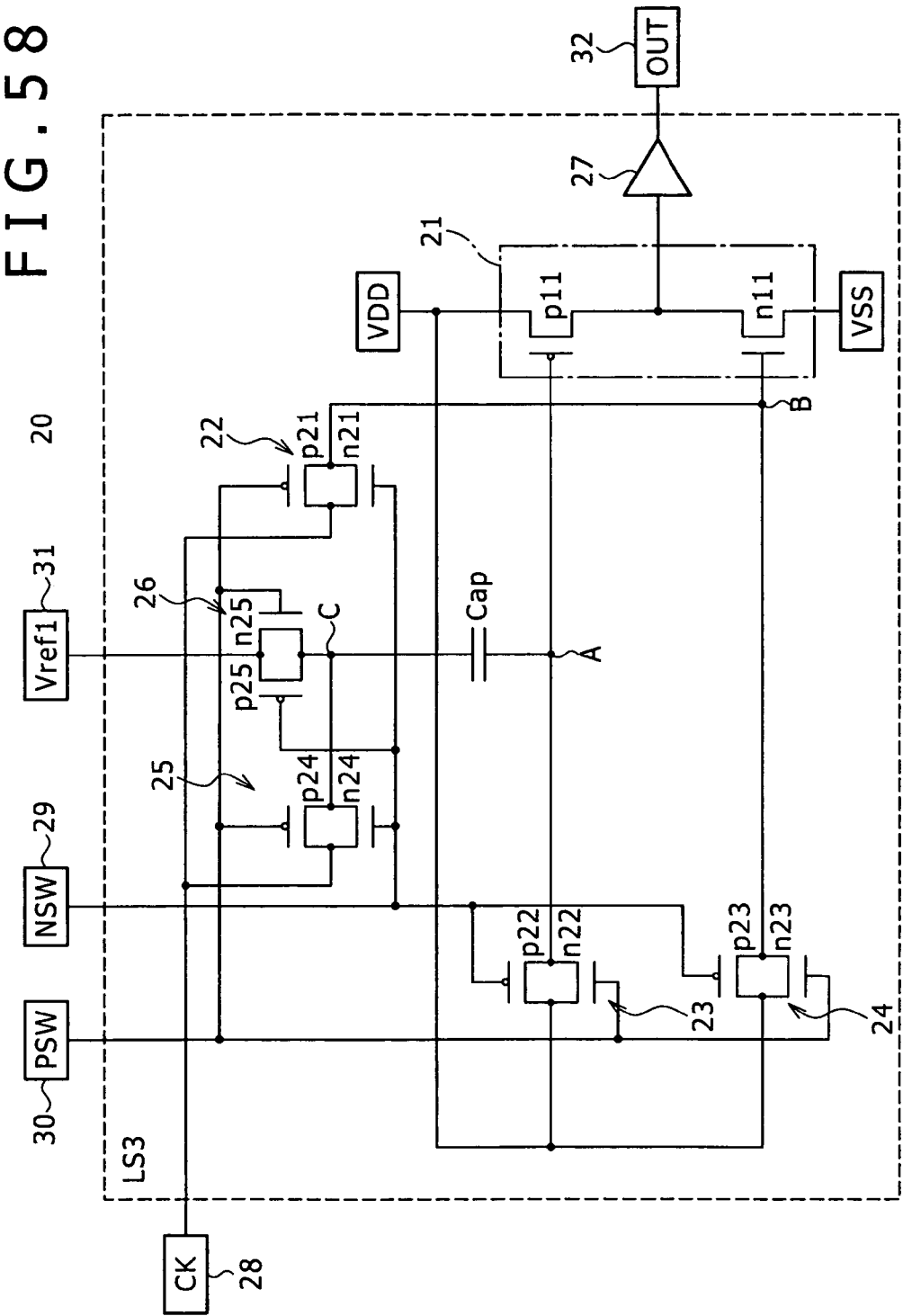
FIG. 58 is a circuit diagram showing an example of a configuration of a level shifting section shown in FIG. 57.

FIG. 58 shows an example of a configuration of the level shifting circuit (LS1) 20. Referring to FIG. 58, the level shifting section 20 according to the present example includes a complementary circuit 21, first to fifth switch circuits 22 to 26, a capacitance element Cap, and a buffer 27. The level shifting section 20 further has a clock terminal 28, control terminals 29 and 30, a voltage terminal 31, and an output terminal 32.

The complementary circuit 21 is formed from first and second transistors of the opposite conduction types to each other connected in series between the power supply potential VSS and the power supply potential VDD, that is, an NMOS transistor n11 and a PMOS transistor p11. The drains of the NMOS transistor n11 and the PMOS transistor p11 are connected to the circuit output terminal 32 through the buffer 27.

The first switch circuit 22 is formed from a CMOS switch including an NMOS transistor n21 and a PMOS transistor p21 connected in parallel to each other. The CMOS switch is connected at one terminal thereof to the clock terminal 28 and at the other terminal thereof to the gate of the NMOS transistor n11. The gates of the NMOS transistor n11 and the PMOS transistor p11 are connected to the control terminals 29 and 30, respectively.

The clock terminal 28 receives the clock pulse CK1/CK2 of the VSS-Vin amplitude (for example, 0 to 3 V amplitude) (in the first shift circuit 11-1, receives the clock pulse CK1, but in the second shift circuit 11-2, receives the clock pulse CK2) supplied thereto. It is to be noted that the High side potential Vin of the clock pulse CK1/CK2 must be higher than the threshold level Vth of the transistors. (VDD>Vin>Vth)

To the control terminals 29 and 30, the control pulses NSW and PSW of the opposite phases to each other generated by the control pulse generation section 40 are supplied, respectively. The control pulse NSW is a High-active pulse signal while the control pulse PSW is a Low-active pulse signal. To the voltage terminal 31, a fixed potential Vref1 (for example, the High side potential Vin of the clock pulse CK1/CK2) is applied.

The second switch circuit 23 is formed from a CMOS switch including an NMOS transistor n22 and a PMOS transistor p22 connected in parallel to each other. The CMOS switch is connected at one terminal thereof to the power supply potential VDD and at the other terminal thereof to the gate of the PMOS transistor p11. The gates of the NMOS transistor n22 and the PMOS transistor p22 are connected to the control terminals 29 and 30, respectively. The second switch circuit 23 exhibits an off state when the control pulses NSW and PSW are in an active state to interrupt the electric connection between the power supply potential VDD and the gate of the PMOS transistor p11.

The third switch circuit 24 is formed from a CMOS switch including an NMOS transistor n23 and a PMOS transistor p23 connected in parallel to each other. The CMOS switch is connected at one terminal thereof to the power supply potential VDD and at the other terminal thereof to the gate of the NMOS transistor n11. The gates of the NMOS transistor n23 and the PMOS transistor p23 are connected to the control terminals 29 and 30, respectively. The third switch circuit 24 exhibits an off state when the control pulses NSW and PSW are in an active state to interrupt the electric connection between the power supply potential VDD and the gate of the NMOS transistor n11 to place the gate of the NMOS transistor n11 into a floating state.

The fourth switch circuit 25 is formed from a CMOS switch including an NMOS transistor n24 and a PMOS transistor p24 connected in parallel to each other. The CMOS switch is connected at one terminal thereof to the clock terminal 28 and at the other terminal thereof to one terminal of the capacitance element Cap. The gates of the NMOS transistor n24 and the PMOS transistor p24 are connected to the control terminals 29 and 30, respectively. The fourth switch circuit 25 exhibits an on state when the control pulses NSW and PSW are in an active state to allow the clock pulse CK to be supplied to the one end of the capacitance element Cap. However, when the control pulses NSW and PSW are in an inactive state, the fourth switch circuit 25 exhibits an off state and interrupts the electric connection between the clock terminal 28 and the one end of the capacitance element Cap.

The fifth switch circuit 26 is formed from a CMOS switch including an NMOS transistor n25 and a PMOS transistor p25 connected in parallel to each other. The CMOS switch is connected at one terminal thereof to the voltage terminal 31 and at the other terminal thereof to the one terminal of the capacitance element Cap. The control pulse PSW of the opposite phase is applied to the gate of the NMOS transistor n25 while the control pulse NSW of the positive phase is applied to the gate of the PMOS transistor p25. The fifth switch circuit 26 exhibits an off state when the control pulses NSW and PSW are in an active state to interrupt the electric connection between the voltage terminal 31 and the one end of the capacitance element Cap. However, when the control pulses NSW and PSW are in an inactive state, the fifth switch circuit 26 exhibits an on state and electrically connects the voltage terminal 31 and the one end of the capacitance element Cap.

The capacitance element Cap is connected between the other ends of the fourth and fifth switch circuits 25 and 26 and the gate of the NMOS transistor n11. Consequently, when the fourth switch circuit 25 is in an on state, the clock pulse CK is applied to the one end of the capacitance element Cap through the switch circuit 25 and transmitted to the gate of the PMOS transistor p11 through the coupling by the capacitance element Cap.

The buffer 27 is formed from, for example, an inverter buffer circuit. However, the buffer 27 is not essentially required but is disposed as occasion demands.

Figure 59:
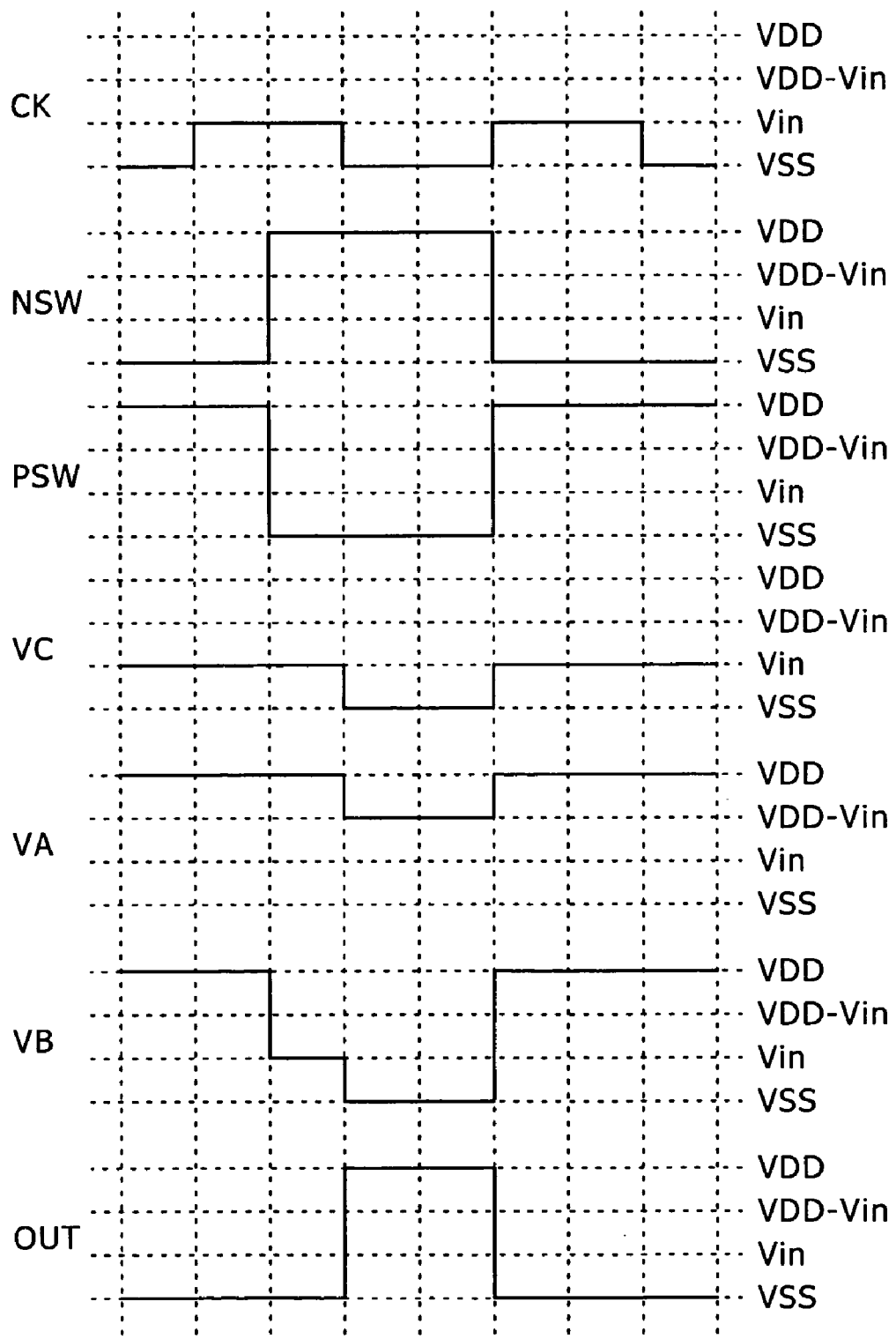
FIG. 59 is a timing chart illustrating operation of the level shifting section of FIG. 58.

Now, circuit operation of the level shifting section 20 having the configuration described above is described with reference to FIG. 59.

First, when the control pulses NSW and PSW are in an inactive state, the first and fourth switches 22 and 25 have an off state while the second, third, and fifth switches 23, 24, and 26 have an on state. Consequently, the potential VA at a node A (gate of the PMOS transistor p11) and the potential VB at another node B (gate of the NMOS transistor n11) are equal to the power supply potential VDD irrespective of the logical state of the clock pulse CK (CK1/CK2). Accordingly, since the PMOS transistor p11 is placed into an off state and the NMOS transistor n11 is placed into an on state, the output pulse OUT has the power supply potential VSS.

When the control pulses NSW and PSW are in an active state, that is, when the level shifting section 20 is in a driven state, the first and fourth switches 22 and 25 have an on state while the second, third, and fifth switches 23, 24, and 26 have an off state. Consequently, the node A is placed into a floating state and is coupled to the clock pulse CK through the capacitance element Cap. To the node B, the clock pulse CK is applied through the first switch circuit 22.

Within an active period of the control pulses NSW and PSW, a process of extracting a Low potential side pulse of the clock pulse CK (CK1/CK2), that is, an active Low pulse, and another process of level-shifting the clock pulse CK from the VSS-Vin amplitude to the VSS-VDD amplitude are performed.

Further, the clock amplitude at the node B within an active period of the control pulses NSW and PSW is VSS/Vin, and the clock amplitude at the node A is VDD-Vin/VDD, and besides the clocks applied to the nodes A and B have the same phase. Consequently, at a timing at which the PMOS transistor p11 and the NMOS transistor n11 are to be turned off, they are placed into an off state with certainty from the relationship of the potentials VA and VB at the nodes A and B. Accordingly, in the complementary circuit 21 formed from the PMOS transistor p11 and the NMOS transistor n11, leak when the MOS transistors p11 and n11 are off can be prevented with certainty.

As described hereinabove, the level shifting section 20, which level-shifts the clock pulse CK of the VSS-Vin (for example, 0 to 3 V) amplitude to the output pulse OUT of the VSS-VDD (for example, 0 to 8 V) amplitude includes, as a basic circuit, the complementary circuit 21 formed from the NMOS transistor n11 and the PMOS transistor p11. Then, when the level shifting section 20 is driven for level-shifting, the clock pulse CK is applied to the gate of the NMOS transistor n11 while a clock pulse obtained by relatively shifting the clock pulse CK to the power supply potential VDD side through the coupling by the capacitance element Cap is applied to the gate of the PMOS transistor p11. Consequently, at a timing at which the NMOS transistor n11 and the PMOS transistor p11 are to be turned off, they are placed into an off state with certainty. Consequently, no leak current flows to the complementary circuit 21.

Since no leak current flows to the level shifting section 20 in this manner, reduction of the power consumption of the shift register circuit 10 can be achieved. Further, since the complementary circuit 21 formed from transistors of the opposite conduction types is used as a basic circuit, the complementary circuit 21 does not suffer from leak current and is always driven in a saturation region of the transistors. Consequently, the level shifting section 20 is tough against the dispersion in transistor characteristic (threshold level Vth, drain-source current Ids, and so forth), which appears with the level shifting circuit in related art using a current mirror circuit as a basic circuit. In other words, the circuit performances of the level shifting section 20 are not influenced much by the dispersion in transistor characteristic. Besides, since no leak appears between the power supply potential VDD and the clock pulse CK, the burden on the clock pulse CK can be reduced.

Further, when the control pulses NSW and PSW are in an inactive state, the fourth switch circuit 25 exhibits an off state, in which it interrupts the electric connection between the clock terminal 28 and a node C (one end of the capacitance element Cap), so that the influence of the clock pulse CK may not be had on the node A. Further, the fifth switch circuit 26 is placed into an on state to electrically connect the voltage terminal 31 and the node C to fix the potential VC at the node C to the fixed potential Vref1 (=Vin). Consequently, the coupling of the clock pulse CK can be prevented from having an influence on the node A through the capacitance element Cap. Consequently, appearance of whisker-like noise arising from a fluctuation of the potential VA at the node A on the output pulse OUT can be prevented.

Besides, since the first and fourth switches 22 and 25 are formed using a CMOS switch, the possibility regarding the on resistance of the NMOS transistors where the first and fourth switches 22 and 25 are each formed from a single NMOS transistor, that is, the possibility that the High side potential Vin of the clock pulse CK (CK1/CK2) may become higher than the power supply potential VDD in an on state, can be eliminated by action of the PMOS transistors p21 and p24.

Further, since the second, third, and fifth switches 23, 24, and 26 are each formed from a CMOS switch, the possibility originating from the gate-drain coupling or the gate-source coupling where the second, third, and fifth switches 23, 24, and 26 are each formed from a single NMOS transistor, that is, the possibility that the circuit may malfunction because of noise invading through the coupling, can be eliminated by action of the PMOS transistors p22, p23, and p25.

It is to be noted that, while, in the present example, the possibilities described above are eliminated by forming the first to fifth switch circuits 22 to 26 using a CMOS switch, the countermeasure for the elimination is not necessarily required, and it is possible to select whether or not the countermeasure should be taken through examination of the necessity for a countermeasure against the possibilities depending upon the circuit constants and driving conditions (various voltage setting values).

Figure 60:
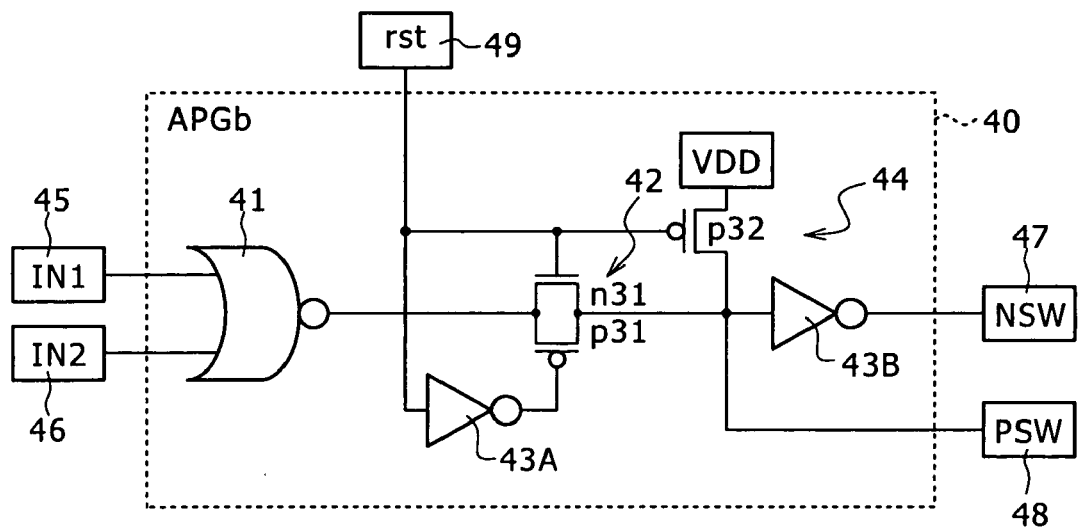
FIG. 60 is a block diagram showing an example of a configuration of a control pulse generation section shown in FIG. 56.

Now, a circuit configuration of the control pulse generation section 40 is described. FIG. 60 shows an example of a configuration of the control pulse generation section 40.

Referring to FIG. 60, the control pulse generation section 40 according to the present example includes a NOR circuit 41, a switch circuit 42, two inverter circuits 43A and 43B, and a reset circuit 44. Further, the control pulse generation section 40 has two input terminals 45 and 46, two output terminals 47 and 48, and a reset terminal 49.

The input terminal 45 receives an input pulse IN1 of a pulse width equal to that of the clock pulse CK (CK1/CK2) as an input thereto. The input pulse IN1 corresponds to the input pulse to the self stage in the shift register circuit 10. The input terminal 46 receives an input pulse IN2 of a phase displaced by a ¼ cycle of the clock pulse CK from that of the input pulse IN1 as an input thereto. The input pulse IN2 corresponds to the output pulse of the self stage in the shift register circuit 10.

The NOR circuit 41 logically NORs the input pulse IN1 and the input pulse IN2. The switch circuit 42 is formed from a CMOS switch including an NMOS transistor n31 and a PMOS transistor p31 connected in parallel to each other, and is connected at an input terminal thereof to an output terminal of the NOR circuit 41. In the switch circuit 42, a reset pulse "rest" inputted through the reset terminal 49 is applied directly to the gate of the NMOS transistor n31. Meanwhile, the reset pulse "rest" is applied to the gate of the PMOS transistor p31 after it is inverted by the inverter circuit 43A. The reset pulse "rest" is a Low-active pulse signal.

The reset circuit 44 is formed from a PMOS transistor p32 connected between the power supply potential VDD and the output terminal of the switch circuit 42 and adapted to receive the reset pulse "rest" as a gate input thereto. In the reset circuit 44, when the reset pulse "rest" exhibits the Low potential, the PMOS transistor p32 is placed into an on state to perform a resetting operation of setting the output terminal potential of the switch circuit 42 to the power supply potential VDD.

Figure 61:
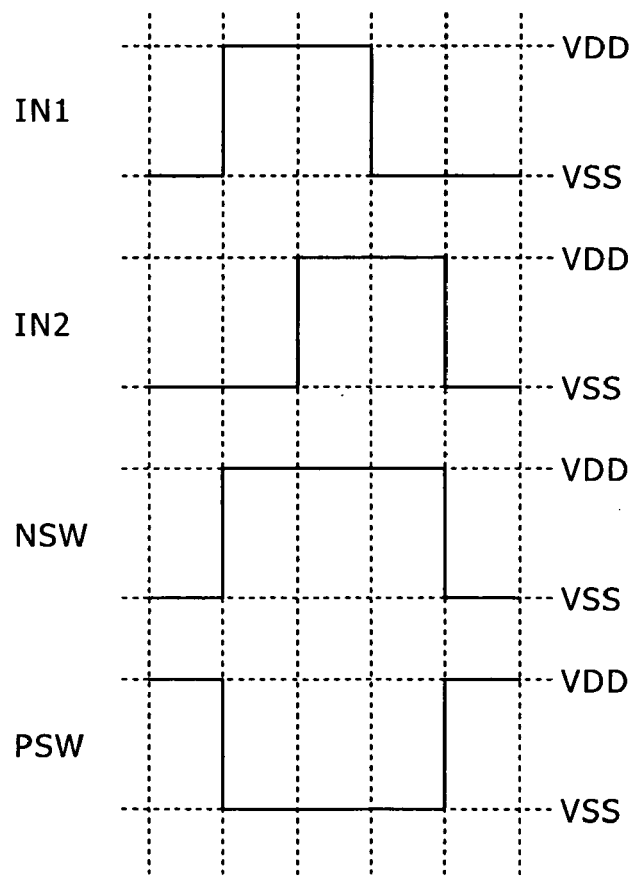
FIG. 61 is a timing chart illustrating circuit operation of the control pulse generation section of FIG. 60.

The inverter circuit 43B inverts the output pulse of the switch circuit 42 to produce the control pulse NSW of the positive phase and outputs the control pulse NSW through the output terminal 47. Further, the output pulse of the switch circuit 42 passes as it is through the output terminal 48 and is outputted as the control pulse PSW of the opposite phase. FIG. 61 illustrates a timing relationship of the input pulses IN1 and IN2 and the control pulses NSW and PSW.

In the control pulse generation section 40 having the configuration described above, if the reset pulse "rest" is placed into a Low state (power supply potential VSS), then both of the NMOS transistor n31 and the PMOS transistor p31 of the switch circuit 42 are placed into an off state while the PMOS transistor p32 of the reset circuit 44 is placed into an on state to fix the input terminal of the inverter circuit 43B to the power supply potential VDD. Consequently, the control pulse generation section 40 outputs the control pulses NSW and PSW of an inactive state to place the level shifting section 20 into an inactive state. When the reset pulse "rest" has the High level (power supply potential VDD), the switch circuit 42 is on and the reset circuit 44 is off, and consequently, the control pulse generation section 40 outputs the control pulses NSW and PSW of an active state to place the level shifting section 20 into an active state.

Figure 62:
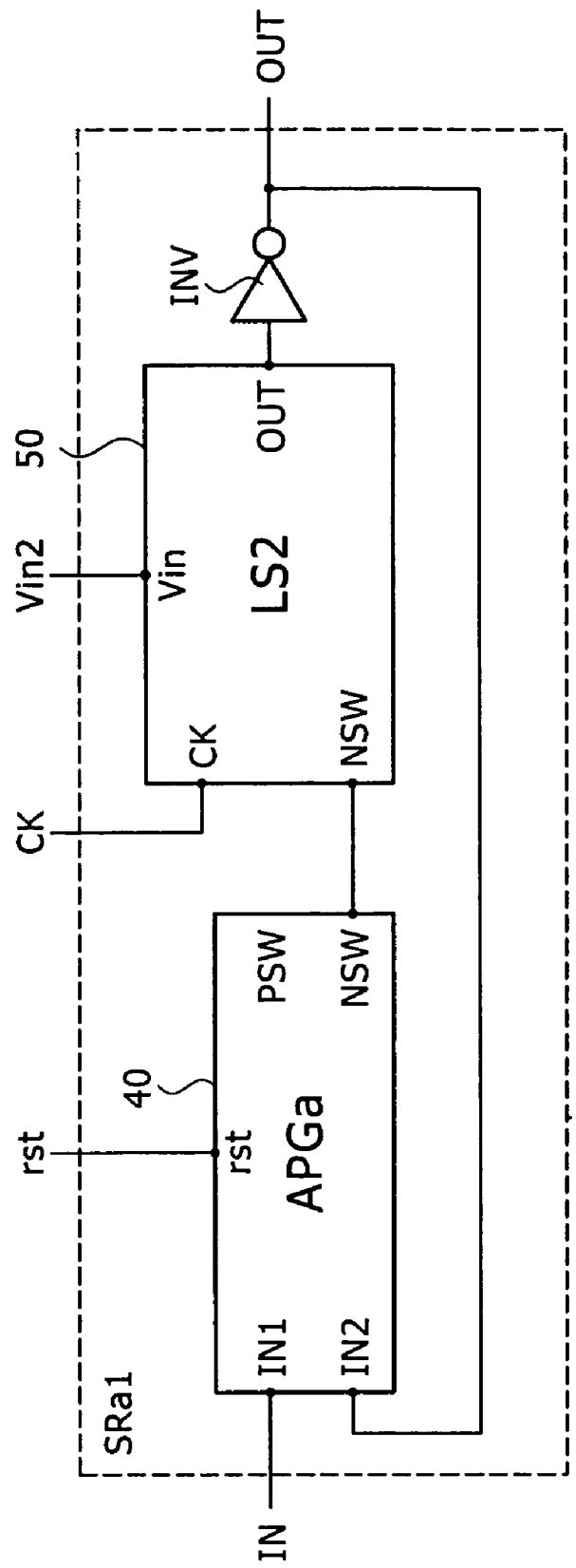
FIG. 62 is a block diagram showing an example of a configuration of third and fourth shift circuits shown in FIG. 55.

FIG. 62 shows an example of a configuration of the third and fourth shift circuits 11-3 and 11-4.

Referring to FIG. 62, the third and fourth shift circuits 11-3 and 11-4 according to the present example are each configured such that it includes a level shifting section 50, a control pulse generation section 40, and an inverter circuit INV. The control pulse generation section 40 is formed from a control pulse generation section having a configuration that is the same as that of the control pulse generation section 40 of the first and second shift circuits 11-1 and 11-2. However, in the third and fourth shift circuits 11-3 and 11-4 according to the present example, the output pulse OUT of the level shifting section 50 is inverted by the inverter circuit INV and then led out as an output pulse of the self stage.

The third and fourth shift circuits 11-3 and 11-4 are different from the shift circuits 11-1 and 11-2 in the following point. In particular, as described hereinabove, when the control pulse IN is in an active state, the shift circuits 11-1 and 11-2 extract and level-shift the active Low level of the clock pulse CK1/CK2. In contrast, the third and fourth shift circuits 11-3 and 11-4 extract and level-shift the active High level of the clock pulse CK1/CK2.

The level shifting sections 20 and 50 execute the different processes. Since the level shifting section 50 performs a basic process same as that of the level shifting section 20, it is basically same also in terms of the configuration.

Figure 63:
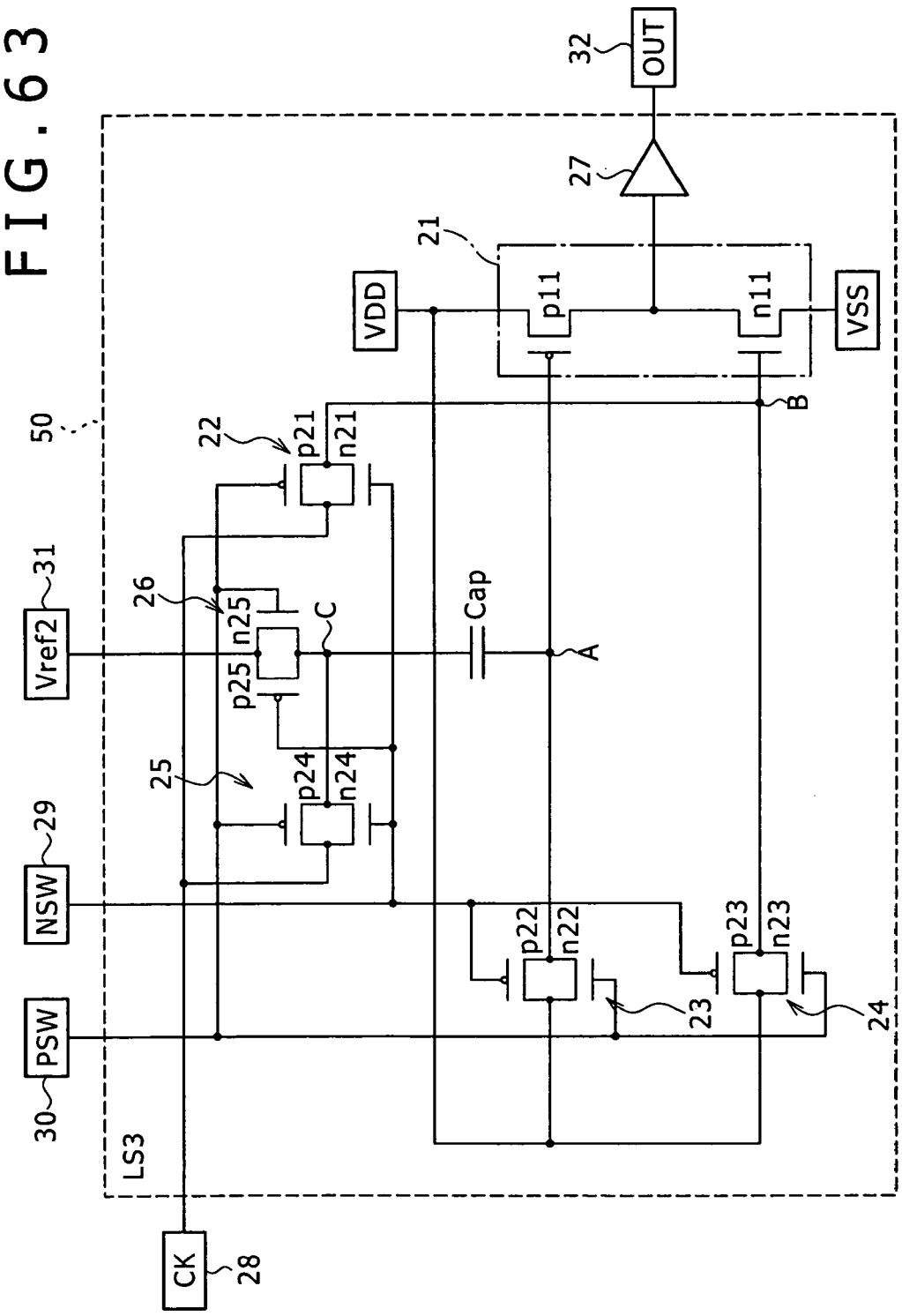
FIG. 63 is a circuit diagram showing an example of a configuration of a level shifting section shown in FIG. 62.

FIG. 63 shows an example of a configuration of the level shifting section 50 (LS2). Since the level shifting section 50 includes components same as those of the level shifting section 20, in FIG. 63, the equivalent components are denoted by like reference characters to those in FIG. 58.

In particular, referring to FIG. 63, the level shifting section 50 according to the present example includes a complementary circuit 21, first to fifth switch circuits 22 to 26, a capacitance element Cap, and a buffer 27. Further, the level shifting section 50 has a clock terminal 28, control terminals 29 and 30, a voltage terminal 31, and an output terminal 32. In addition, the level shifting section 50 is configured such that it uses a third power supply potential VDD2 in addition to the first and second power supply potentials VSS and VDD in order to execute a process different from that of the level shifting section 20.

The third power supply potential VDD2 is set to VDD-Vin when the amplitude of the clock pulse CK (CK1/CK2) is set to VSS-Vin. Further, the second switch circuit 23 is connected between the power supply potential VDD2 and the gate of the PMOS transistor p11, and the third switch circuit 24 is connected between the power supply potential VSS and the gate of the NMOS transistor n11. Furthermore, a fixed potential Vref2 (for example, power supply potential VSS) is applied to the voltage terminal 31.

Figure 64:
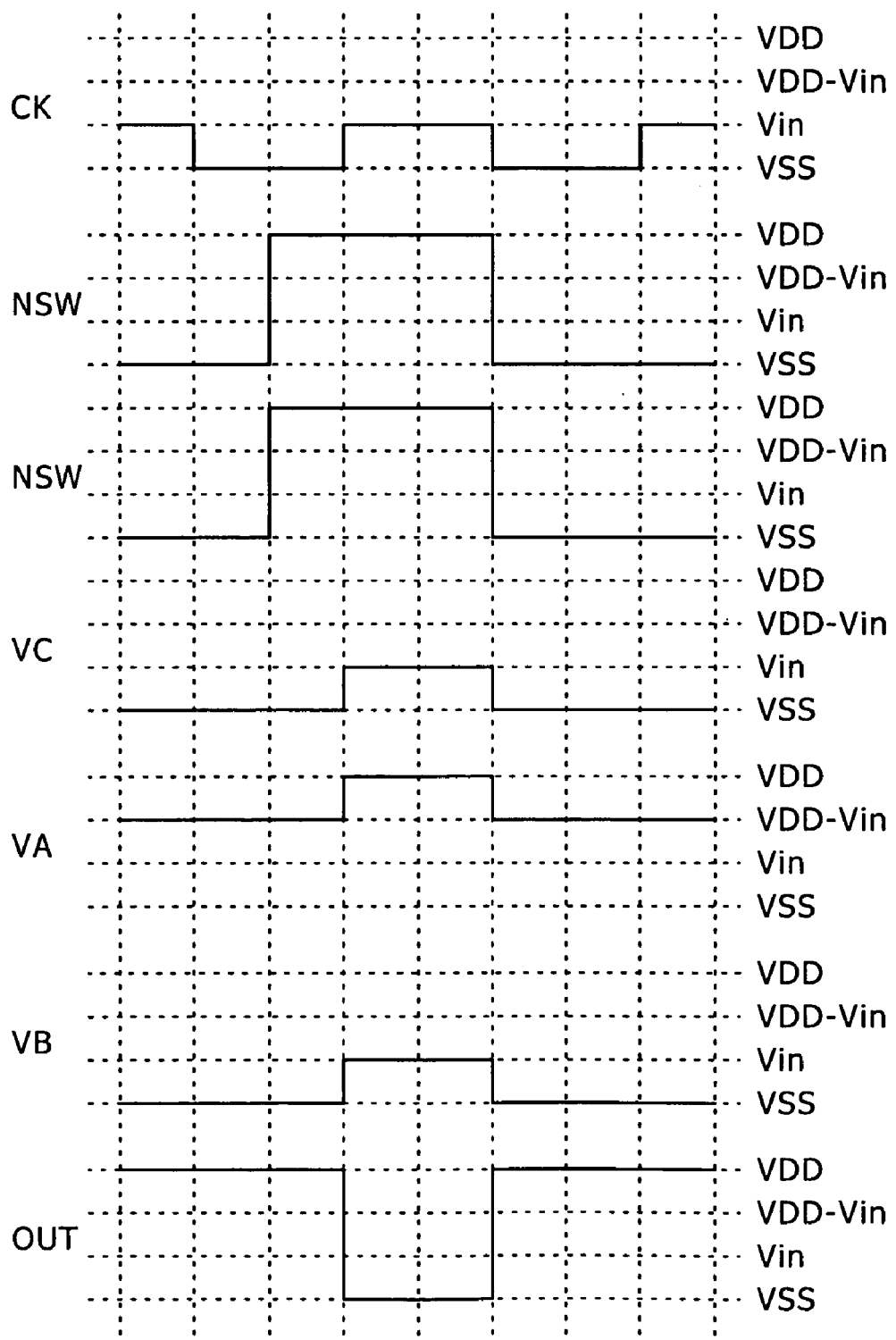
FIG. 64 is a timing chart illustrating circuit operation of the level shifting section of FIG. 63.

Now, circuit operation of the level shifting section 50 having the configuration described above is described with reference to FIG. 64.

First, when the control pulses NSW and PSW are in an inactive state, the first and fourth switches 22 and 25 are in an off state while the second, third, and fifth switches 23, 24, and 26 are in an on state. Consequently, irrespective of the logical state of the clock pulse CK (CK1/CK2), the potential VA at a node A (gate of the PMOS transistor p11) is equal to the power supply potential VDD2 (VDD-Vin) and the potential VB at another node B (gate of the NMOS transistor n11) is equal to the power supply potential VSS. Accordingly, the PMOS transistor p11 exhibits an on state and the NMOS transistor n11 exhibits an off state, and consequently, the output pulse OUT is equal to the power supply potential VDD.

When the control pulses NSW and PSW are in an active state, that is, when the level shifting section 50 is in a driven state, the first and fourth switches 22 and 25 are in an on state while the second, third, and fifth switches 23, 24, and 26 are in an off state. Consequently, the node A is in a floating state and is influenced by the coupling of the clock pulse CK through the capacitance element Cap. To the node B, the clock pulse CK is applied through the first switch circuit 22.

Within an active period of the control pulses NSW and PSW, a process of extracting a High potential side pulse of the clock pulse CK (CK1/CK2), that is, extracting an active High pulse, and another process of level-shifting (level-converting) the clock pulse CK from the VSS-Vin amplitude to the VSS-VDD amplitude are performed.

Further, the clock amplitude at the node B within an active period of the control pulses NSW and PSW is VSS/Vin while the clock amplitude at the node A is VDD–Vin/VDD, and besides the clocks applied to the nodes A and B have the same phase. Consequently, at a timing at which the PMOS transistor p11 and the NMOS transistor n11 are to be turned off, they are placed into an off state with certainty from the relationship of the potentials VA and VB at the nodes A and B. Accordingly, in the complementary circuit 21 formed from the PMOS transistor p11 and the NMOS transistor n11, leak when the MOS transistors p11 and n11 are off can be prevented with certainty.

As described hereinabove, the level shifting section 50, which level-shifts the clock pulse CK of the VSS-Vin amplitude to the output pulse OUT of the VSS-VDD amplitude, uses the complementary circuit 21 formed from the NMOS transistor n11 and the PMOS transistor p11 as a basic circuit. Then, when the level shifting section 50 is driven for level-shifting, the clock pulse CK is applied to the gate of the NMOS transistor n11 while a clock pulse obtained by relatively shifting the clock pulse CK to the power supply potential VDD side through the coupling by the capacitance element Cap is applied to the gate of the PMOS transistor p11. Consequently, at a timing at which the NMOS transistor n11 and the PMOS transistor p11 are to be turned off, they are placed into an off state with certainty. Therefore, no leak current flows to the complementary circuit 21.

Since no leak current flows to the level shifting section 50 in this manner, reduction in power consumption of the shift register circuit 10 can be anticipated. Further, since the complementary circuit 21 formed from transistors of the opposite conduction types is used as a basic circuit, no leak current flows through the complementary circuit 21 and the complementary circuit 21 is driven always in a saturation region of the transistors. Consequently, the level shifting section 50 can be implemented tough against the dispersion in transistor characteristic (threshold level Vth, drain-source current Ids, and so forth), which appears with the level shifting circuit in related art using a current mirror circuit as a basic circuit. In other words, the circuit performances of the level shifting section 50 are not influenced much by the dispersion in transistor characteristic. Besides, since no leak appears between the power supply potential VDD and the clock pulse CK, the burden on the clock pulse CK can be reduced. The level shifting section 50 exhibits further action and advances similar to those of the level shifting section 20.

Fifth Embodiment

Figure 65:
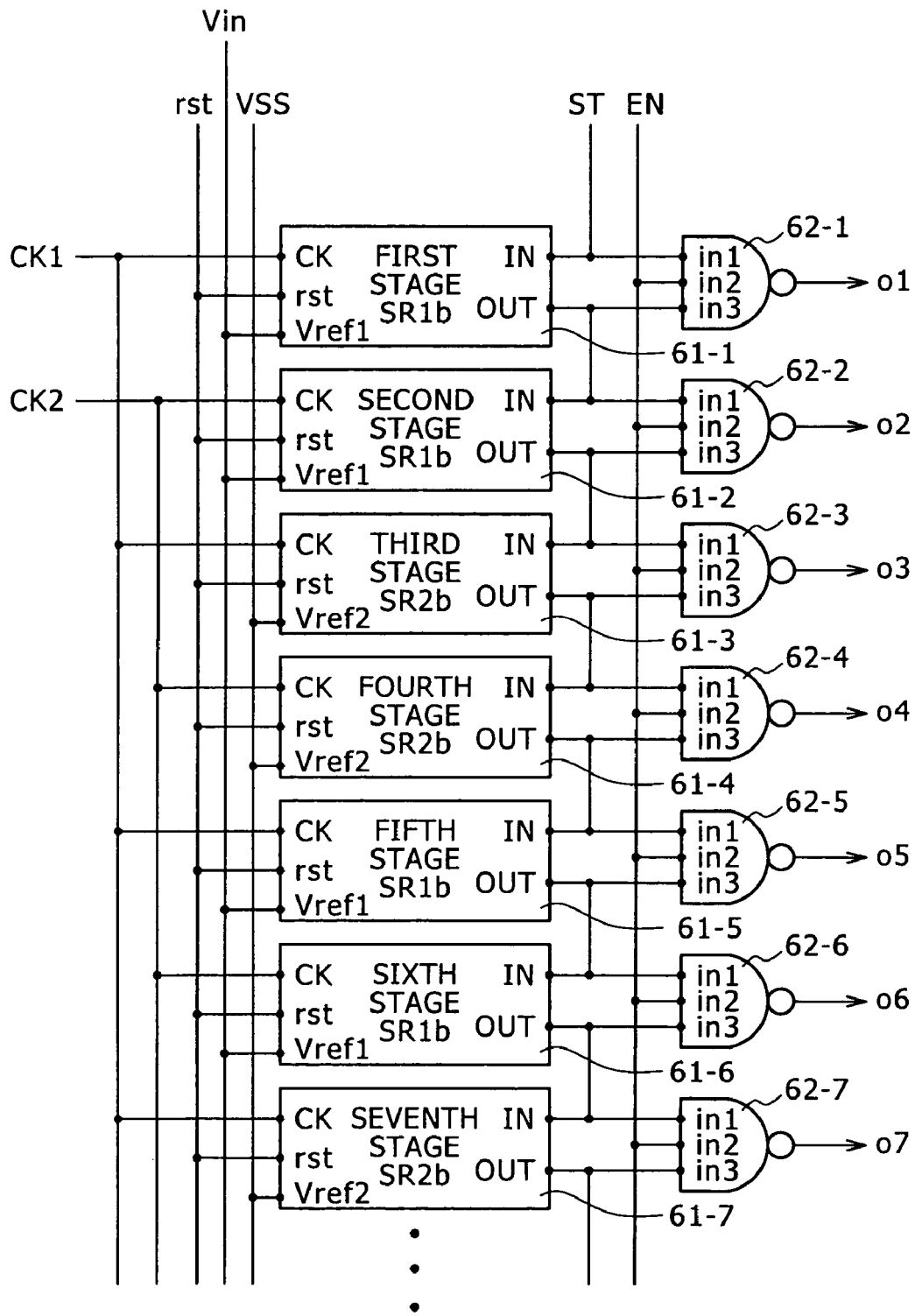
FIG. 65 is a block diagram showing a configuration of a shift register circuit according to a fifth embodiment of the present invention.

FIG. 65 shows a configuration of a shift register circuit according to a fifth embodiment of the present invention. The shift register circuit 60 according to the present embodiment is configured such that first to fourth shift circuits 61-1 to 61-4 are connected in cascade connection as shift register units (transfer stages/shift stages) and a plurality of such sets of the four first to fourth shift circuits 61-1 to 61-4 are disposed repetitively and connected in cascade connection similarly as in the shift register circuit 10 according to the fourth embodiment.

As hereinafter described in detail, the first shift circuit 61-1 and the second shift circuit 61-2 have a same circuit configuration, and the third shift circuit 61-3 and the fourth shift circuit 61-4 have another same circuit configuration. A first clock pulse CK1 is applied to the first and third shift circuits 61-1 and 61-3 while a second clock pulse CK2 having a frequency equal to that of the first clock pulse CK1 and having a phase displaced by a ¼ cycle from the first clock pulse CK1 is applied to the second and fourth shift circuits 61-2 and 61-4.

A Low-active start pulse ST is applied as a control pulse IN to the first shift circuit 61-1. When the control pulse IN is in an active state (Low potential), the shift circuit 61-1 extracts a Low potential side pulse (active Low) of the first clock pulse CK1, level-shifts the Low potential side pulse from a first amplitude to a second amplitude, and outputs the level-shifted Low potential side pulse. A Low-active output pulse OUT of the first shift circuit 61-1 is applied as a control pulse IN to the shift circuit 61-2 at the second stage.

When the control pulse IN is in an active state, the shift circuit 61-2 at the second stage extracts a Low potential side pulse of the second clock pulse CK2, level-shifts the Low potential side pulse from the first amplitude to the second amplitude, and outputs the level-shifted Low potential side pulse. A Low-active output pulse OUT of the shift circuit 61-2 is applied as a control pulse IN to the shift circuit 61-3 at the third stage.

When the control pulse IN is in an active state, the shift circuit 61-3 at the third stage extracts a High potential side pulse (active High) of the first clock pulse CK1, level-shifts the High potential side pulse from the first amplitude to the second amplitude, and outputs the level-shifted High potential side pulse. A Low-active output pulse OUT of the third shift circuit 61-3 is applied as a control pulse IN to the shift circuit 61-4 at the fourth stage.

When the control pulse IN is in an active state, the shift circuit 61-4 at the fourth stage extracts a High potential side pulse of the second clock pulse CK2, level-shifts the High potential side pulse from the first amplitude to the second amplitude, and outputs the level-shifted High potential side pulse. A Low-active output pulse OUT of the fourth shift circuit 61-4 is applied as a control pulse IN to the shift circuit 61-5 at the fifth stage.

Thereafter, the circuit operations of the set of the four stages of first to fourth shift circuits 61-1 to 61-4 are repeated.

In the shift circuits (transfer stages) 61-1, 61-2, . . . , the input pulse IN (control pulse) to the self stage and the output pulse OUT of the self stage are used as two inputs to 3-input NOR circuits 62-1, 62-2, . . . . A High-active enable pulse EN having a pulse width much smaller than that of the clock pulses CK1 and CK2 is applied to the remaining one input of the NOR circuits 62-1, 62-2, . . . . Then, the High-active output pulses of the NOR circuits 62-1, 62-2, . . . are led out as transfer pulses o1, o2, . . . of the individual transfer stages.

Figure 66:
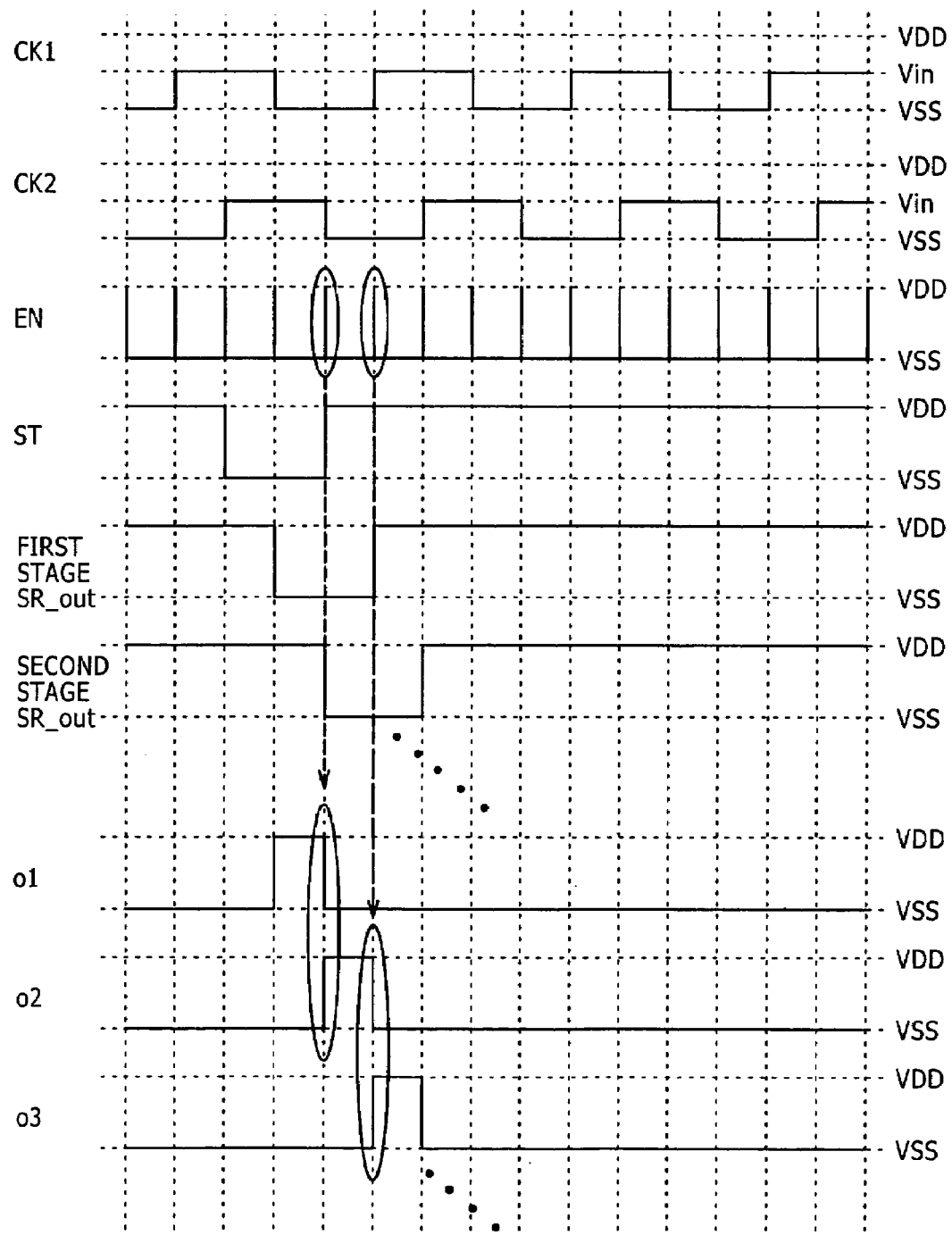
FIG. 66 is a timing chart illustrating operation of the shift register circuit of FIG. 65.

FIG. 66 illustrates a timing relationship of the clock pulses CK1 and CK2, enable pulse EN, start pulse ST, output pulses SR_out of the first and second stages, and transfer pulses o1, o2, o3, . . . . As can be seen apparently from the timing chart of FIG. 66, the shift circuits 61-1, 61-2, . . . extract the clock pulses CK1 and CK2 of the first amplitude (VSS-Vin) and level-shift (level-convert) the clock pulses CK1 and CK2 to the transfer pulses o1, o2, o3, . . . of the second amplitude (VSS-VDD).

As described above, also in the shift register circuit 60 according to the fifth embodiment, the shift circuits 61-1, 61-2 are paired with each other and connected in cascade connection, and the third shift circuit 61-3 and the fourth shift circuit 61-4 are paired with each other and connected in cascade connection. Further, the two sets of shift circuit pairs are connected in cascade connection, and the clock pulse CK1 and the clock pulse CK2, which have phases displaced by a ¼ cycle from each other, are applied alternately to the repetitive arrangement of such shift register units (transfer stages). Consequently, driving of the shift register circuit 60 with the frequency of the clock pulses CK1 and CK2 reduced to one half that of the clock pulses CK and xCK used in the shift register in related art can be implemented. In the related art, shift register units having the same circuit configuration are disposed repetitively. Therefore, the burden on a clock generation circuit for generating the clock pulses CK1 and CK2 can be reduced to one half, and the driving frequency can be reduced to one half. As a result, reduction of the power consumption by the shift register circuit 60 itself can be anticipated.

Now, a particular configuration of the first to fourth shift circuits (shift register units) 61-2 to 61-4 is described.

Figure 67:
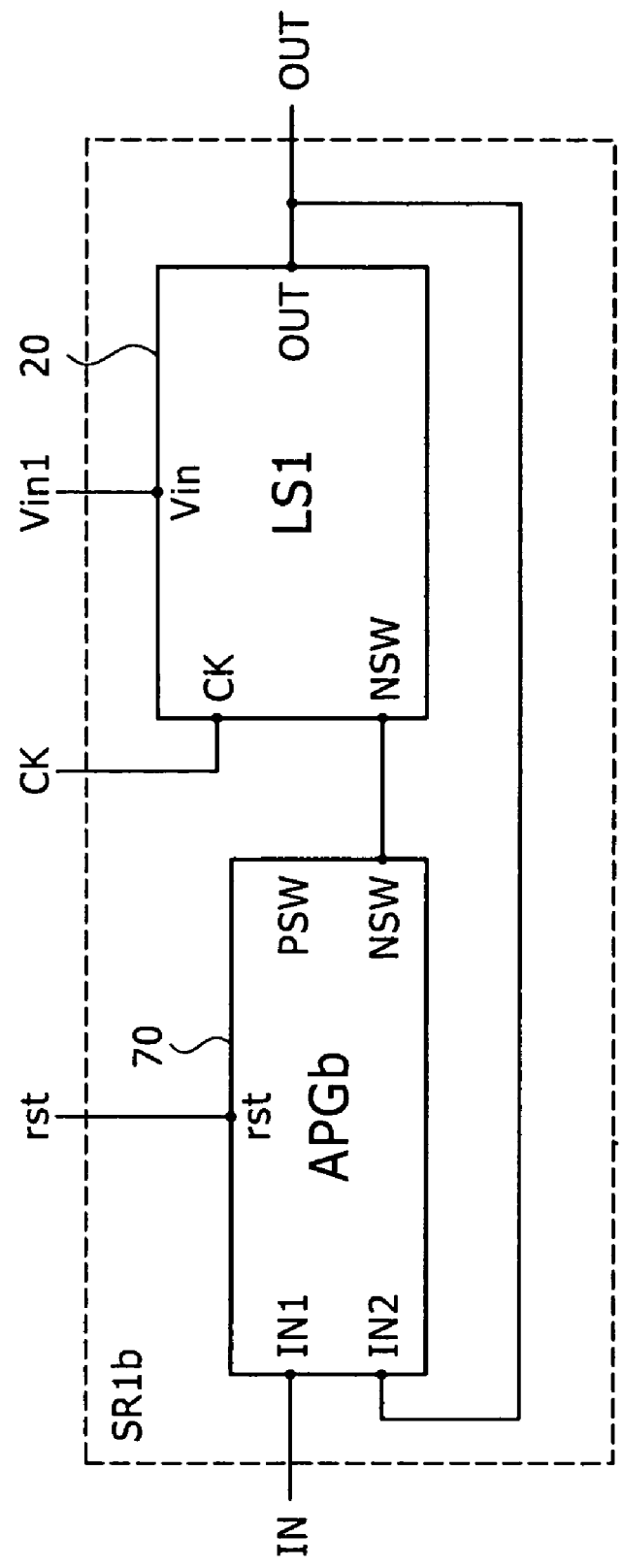
FIG. 67 is a block diagram showing an example of a configuration of first and second shift circuits shown in FIG. 65.

FIG. 67 shows an example of a configuration of the shift circuits 61-1 and 61-2. Referring to FIG. 67, the shift circuits 61-1 and 61-2 according to the present example include a level shifting section 20, a control pulse generation section 70, and an inverter circuit INV. The level shifting section 20 is same as the level shifting section 20 described hereinabove in connection with the shift register circuit 10 according to the fourth embodiment and has a same particular circuit configuration (FIG. 58).

Figure 68:
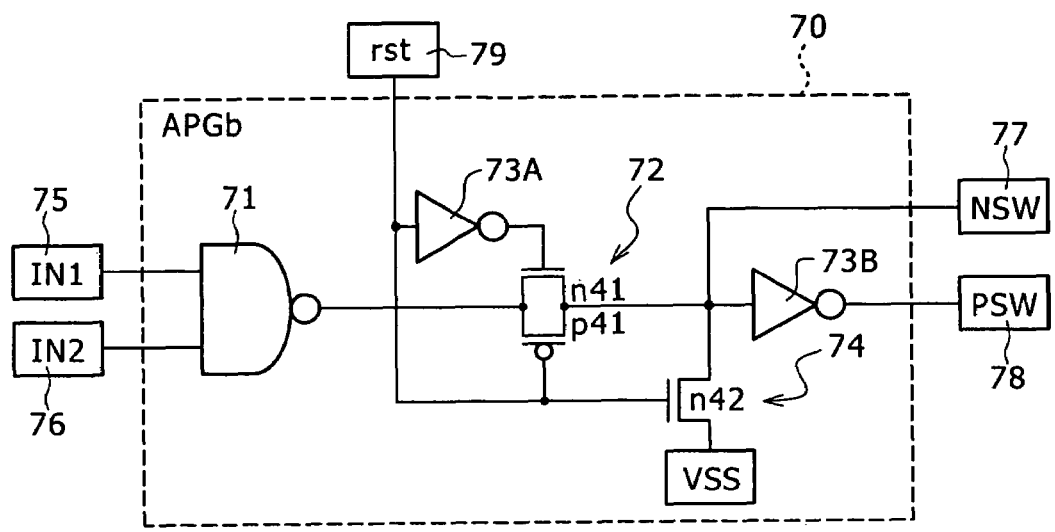
FIG. 68 is a block diagram showing a configuration of a control pulse generation section shown in FIG. 67.

Here, a particular circuit configuration of the control pulse generation section 70 is described. FIG. 68 shows an example of a configuration of the control pulse generation section 70.

Referring to FIG. 68, the control pulse generation section 70 according to the present example includes a NAND circuit 71, a switch circuit 72, two inverter circuits 73A and 73B, and a reset circuit 74. Further, the control pulse generation section 70 has two input terminals 75 and 76, two output terminals 77 and 78, and a reset terminal 79.

The input terminal 75 receives an input pulse IN1 of a pulse width equal to that of the clock pulse CK (CK1/CK2) as an input thereto. The input pulse IN1 corresponds to the input pulse to the self stage of the shift register circuit 60. The input terminal 76 receives another input pulse IN2 as an input thereto. The input pulse IN2 has a phase displaced by a ¼ cycle of the clock pulse CK from the input pulse IN1. The input pulse IN2 corresponds to the output pulse of the self stage of the shift register circuit 60.

The NAND circuit 71 logically NANDs the input pulse IN1 and the input pulse IN2. The switch circuit 72 is formed from a CMOS switch including an NMOS transistor n41 and a PMOS transistor p41 connected in parallel to each other and is connected at an input terminal thereof to an output terminal of the NAND circuit 71. In the switch circuit 72, a reset pulse "rest" inputted through the reset terminal 79 is applied to the gate of the NMOS transistor n41 after it is inverted by the inverter circuit 73A. Meanwhile, the reset pulse "rest" is applied directly to the gate of the PMOS transistor p41. The reset pulse "rest" is a High-active pulse signal.

The reset circuit 74 is formed from an NMOS transistor n42 connected between an output terminal of the switch circuit 72 and the power supply potential VSS and adapted to receive the reset pulse "rest" as a gate input thereto. In the reset circuit 74, when the reset pulse "rest" exhibits the High potential, the NMOS transistor n42 is placed into an on state to perform a resetting operation of setting the output terminal voltage of the switch circuit 72 to the power supply potential VSS.

Figure 69:
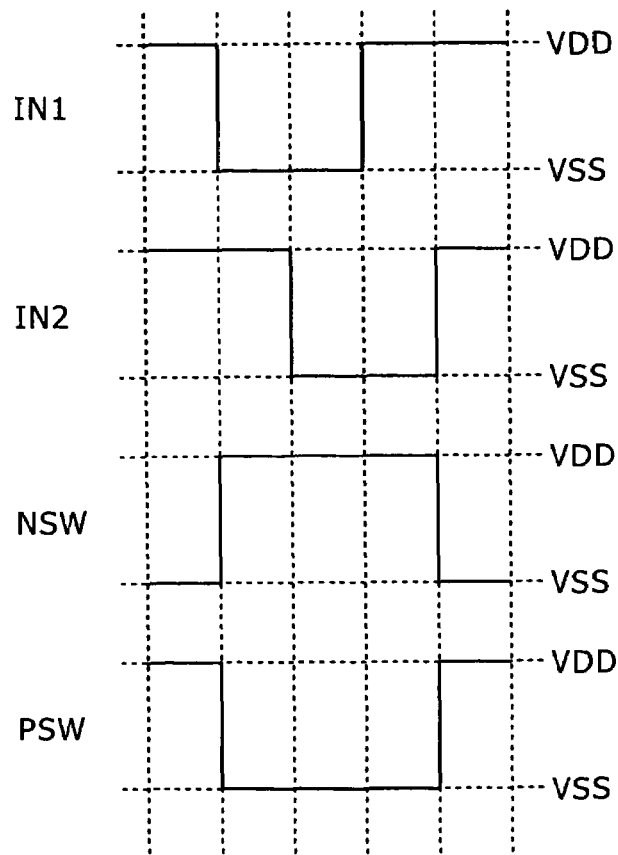
FIG. 69 is a timing chart illustrating circuit operation of the control pulse generation section of FIG. 67.

The inverter circuit 73B inverts an output pulse of the switch circuit 72 to produce a control pulse PSW of the opposite phase and outputs the produced control pulse PSW through the output terminal 78. Further, the output pulse of the switch circuit 72 passes as it is through the output terminal 77 and is outputted as the control pulse NSW of the positive phase. FIG. 69 illustrates a timing relationship of the input pulses IN1 and IN2 and the control pulses NSW and PSW.

In the control pulse generation section 70 having the configuration described above, if the reset pulse "rest" is placed into the High level (power supply potential VDD), then both of the NMOS transistor n41 and the PMOS transistor p41 of the switch circuit 72 are placed into an off state while the NMOS transistor n42 of the reset circuit 74 is placed into an on state to fix the input terminal of the inverter circuit 73B to the power supply potential VSS. Consequently, the control pulse generation section 70 outputs the control pulses NSW and PSW of an inactive state to place the level shifting section 20 into an inactive state. When the reset pulse "rest" has the Low level (power supply potential VSS), the switch circuit 72 is on and the reset circuit 74 is off. Consequently, the control pulses NSW and PSW of an active state are outputted from the control pulse generation section 70 to place the level shifting section 20 into an active state.

Figure 70:
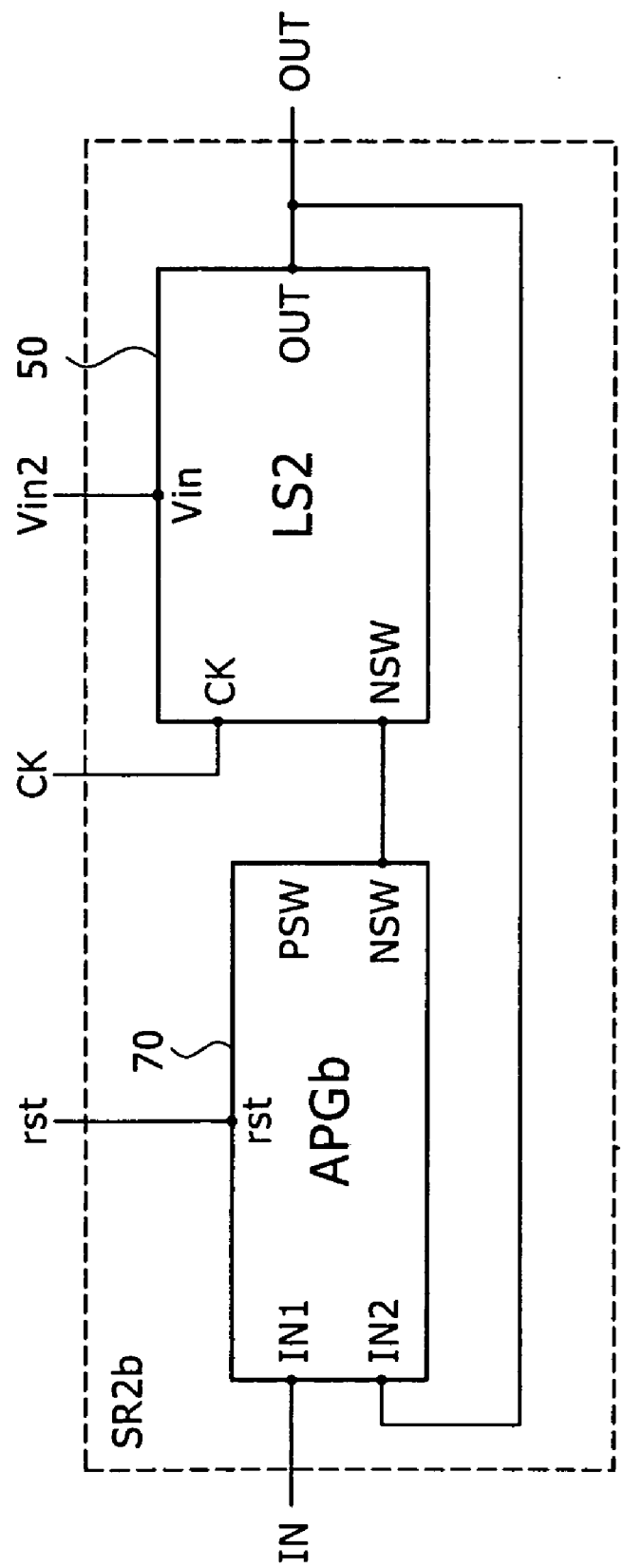
FIG. 70 is a block diagram showing an example of a configuration of third and fourth shift circuits shown in FIG. 65.

As described above, while the first and second shift circuits 61-1 and 61-2 include the combination of the control pulse generation section 70 according to the present example and the level shifting section 20, the third and fourth shift circuits 61-3 and 61-4 include the combination of the control pulse generation section 70 according to the present example and the level shifting section 50 (FIG. 63) as seen in FIG. 70.

Now, a particular circuit configuration of various circuit blocks used with the shift register circuits 10 and 60 according to the fourth and fifth embodiments is described.

Figure 71:
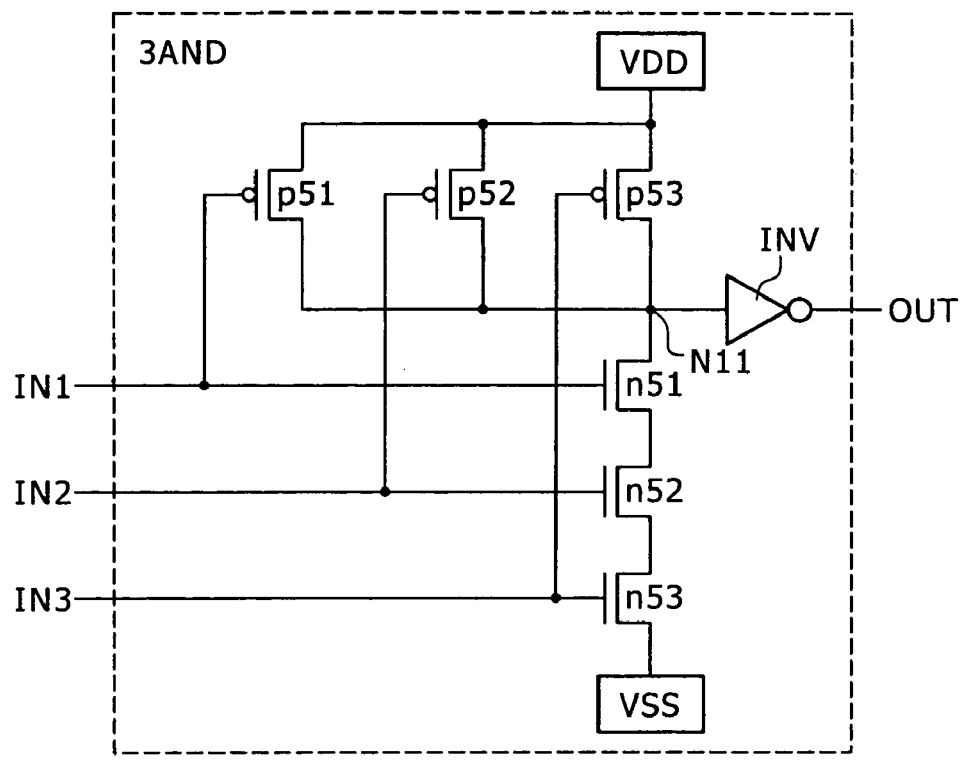
FIG. 71 is a circuit diagram showing an example of a configuration of a 3-input AND circuit shown in FIG. 55.

First, the 3-input AND circuits 12-1, 12-2, . . . used in the shift register circuit 10 according to the fourth embodiment are described with reference to FIG. 71. The three-input AND circuit includes NMOS transistors n51, n52, and n53 connected in series between a node N11 and the power supply potential VSS, and PMOS transistors p51, p52, and p53 connected in parallel between the power supply potential VDD and the node N11. The 3-input AND circuit is configured such that the potential at the node N11 when three inputs IN1, IN2, and IN3 are applied to the gates of the transistors n51 to n53 and p51 to p53 is inverted by the inverter circuit INV and outputted as a logical AND output.

Figure 72:
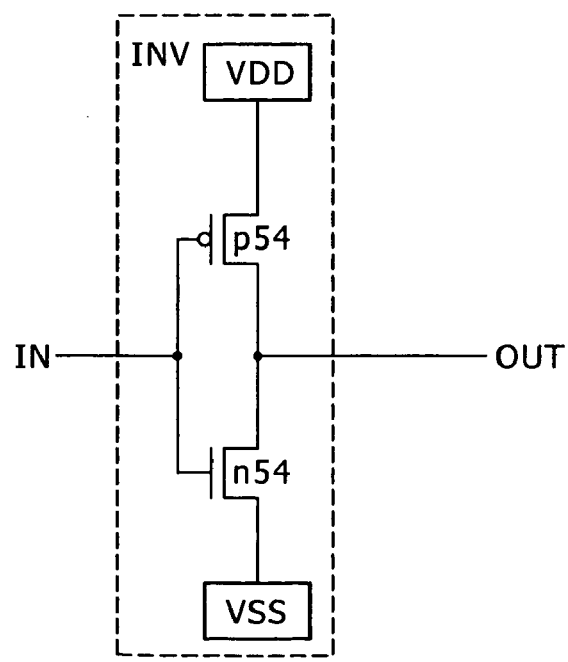
FIG. 72 is a circuit diagram showing an example of a configuration of an inverter circuit.

For the inverter circuit INV described above and the inverter circuits used at various locations of the shift register circuits 10 and 60 according to the fourth and fifth embodiments, a CMOS inverter is used including an NMOS transistor and a PMOS transistor connected in series between the power supply potential VDD and the power supply potential VSS and connected at the gates and drains thereof commonly to each other as seen in FIG. 72.

Figure 73:
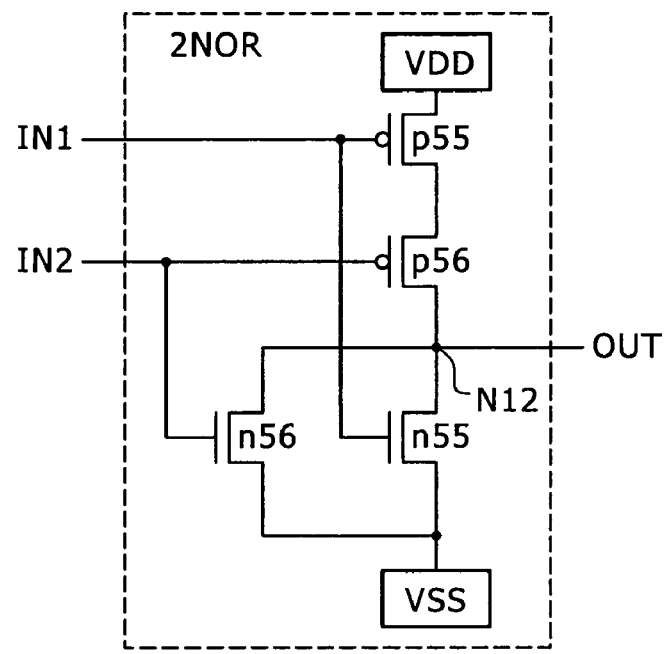
FIG. 73 is a circuit diagram showing an example of a configuration of a 2-input NOR circuit shown in FIG. 60.

Now, the 2-input NOR circuit 41 used in the control pulse generation section 40 of the shift register circuit 10 according to the fourth embodiment is described with reference to FIG. 73. The 2-input NOR circuit includes PMOS transistors p55 and p56 connected in series between the power supply potential VDD and a node N12 and NMOS transistors n55 and n56 connected in parallel between the node N12 and the power supply potential VSS. The 2-input NOR circuit is configured such that the potential at the node N12 when two inputs IN1 and IN2 are applied to the gates of the PMOS transistors p55 and p56 and the NMOS transistors n55 and n56, respectively, is led out as a logical NOR output.

Figure 74:
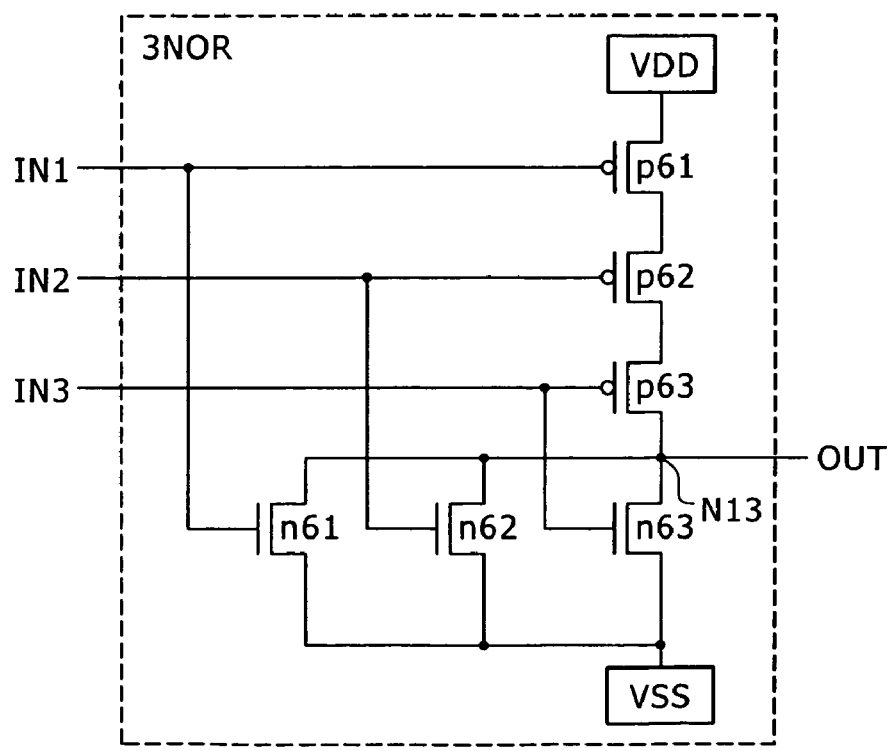
FIG. 74 is a circuit diagram showing an example of a configuration of a 3-input NOR circuit shown in FIG. 65.

Now, the NOR circuits 62-1, 62-2, . . . used in the shift register circuit 60 according to the fifth embodiment are described with reference to FIG. 74. The 3-input NOR circuit shown includes NMOS transistors n61, n62, and n63 connected in parallel between a node N13 and the power supply potential VSS, and PMOS transistors p61, p62, and p63 connected in series between the power supply potential VDD and the node N13. The 3-input NOR circuit is configured such that the potential at the node N13 when three inputs IN1, IN2, and IN3 are applied to the gates of the transistors n61 to n63 and p61 to p63 is led out as a logical NOR output.

Figure 75:
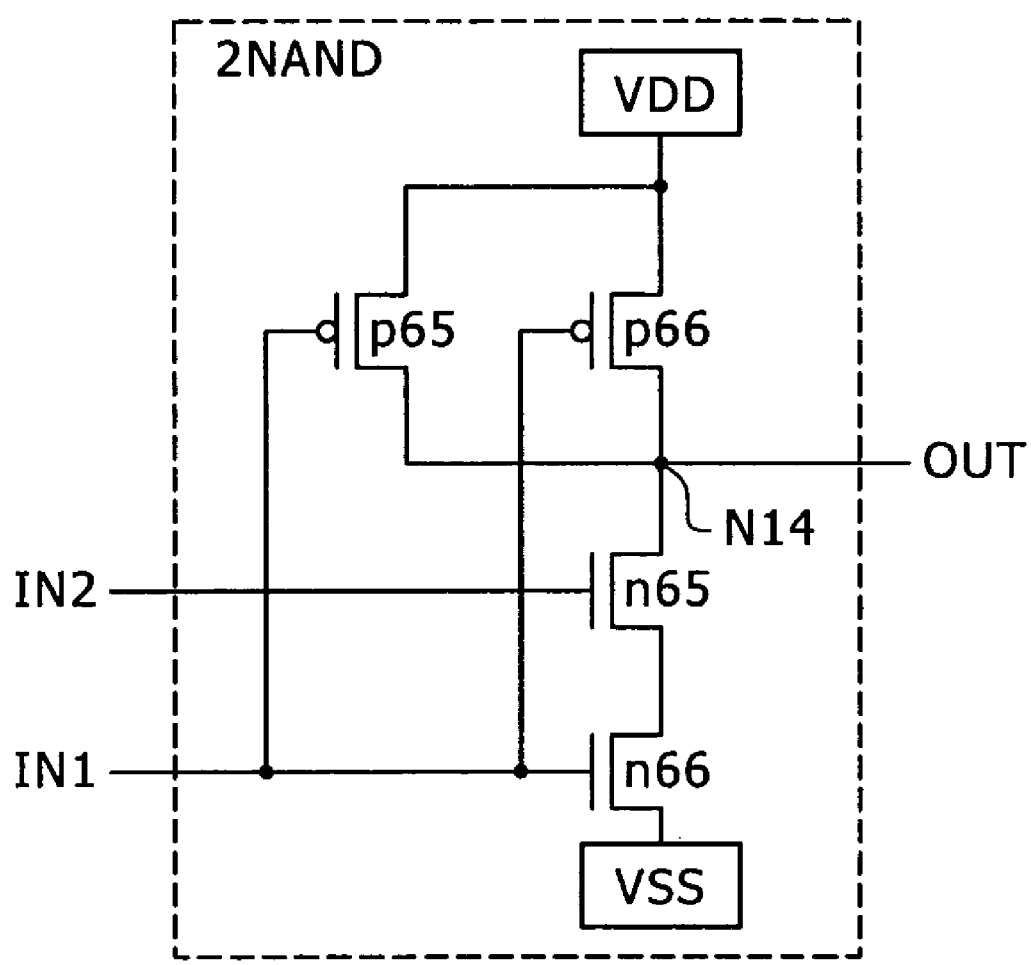
FIG. 75 is a circuit diagram showing an example of a configuration of a 2-input NAND circuit shown in FIG. 68.
Figure 76:
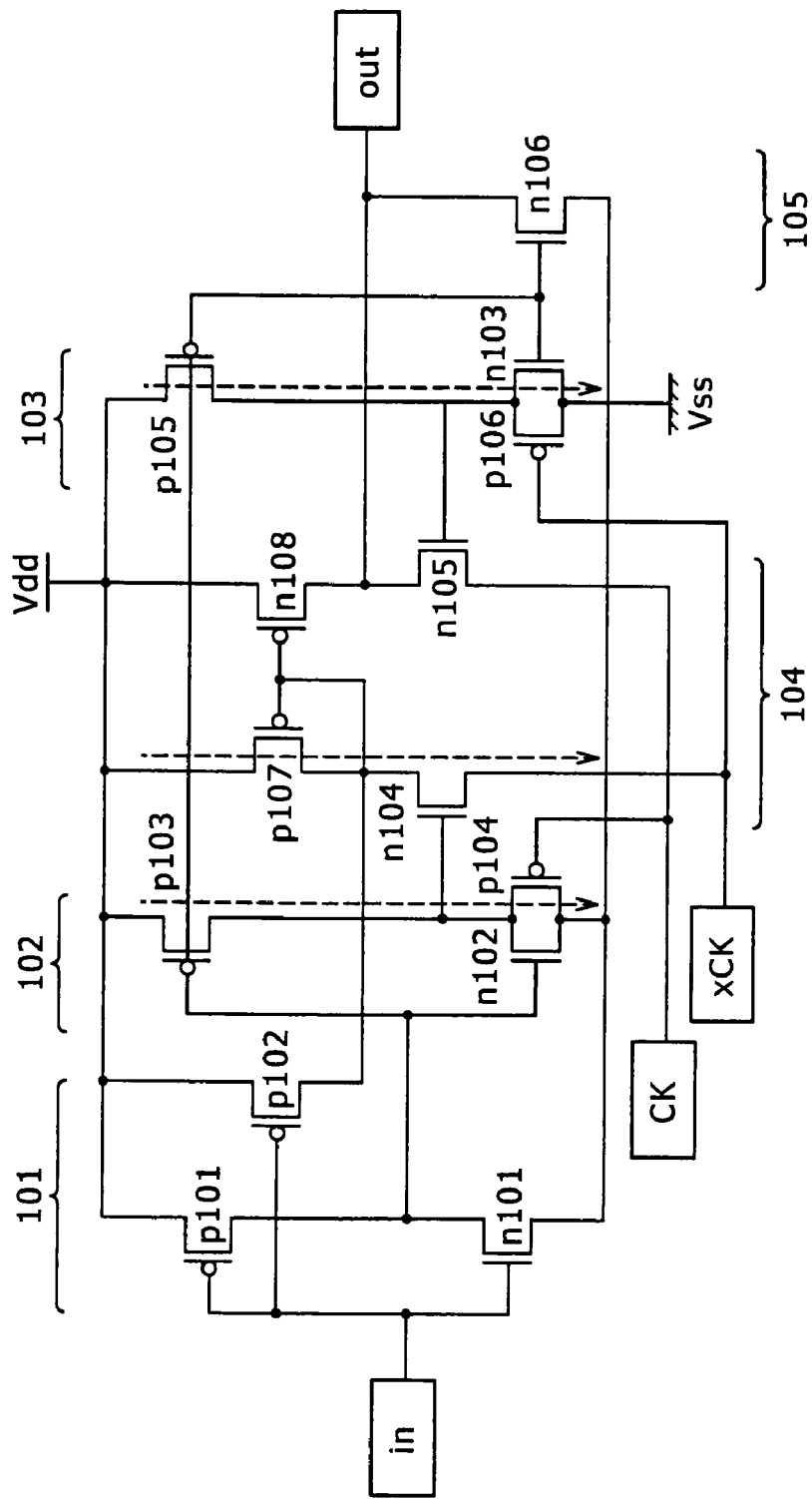
FIG. 76 is a circuit diagrams showing an example of a configuration of a current mirror type level conversion circuit in related art.
Figure 77:
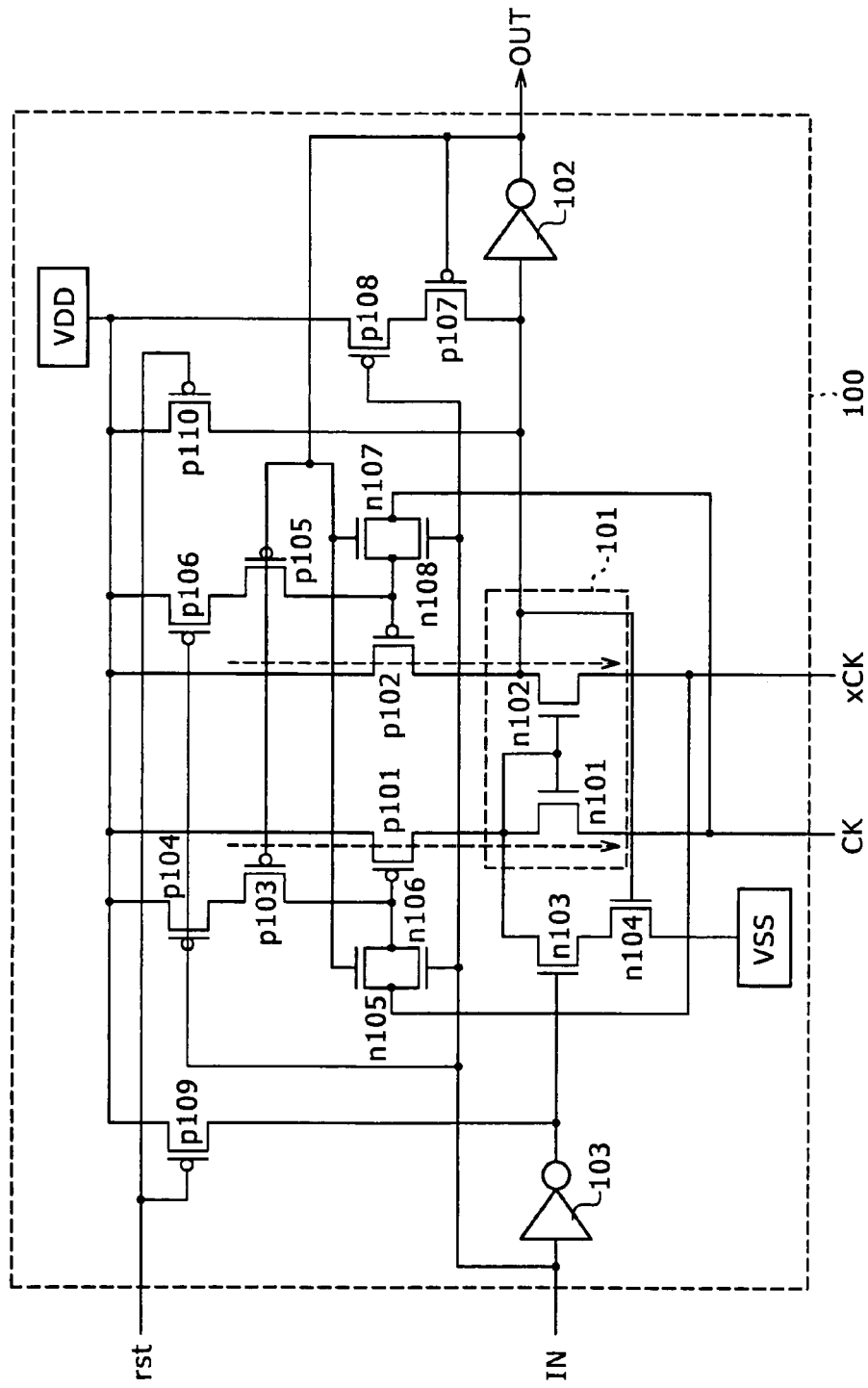
FIG. 77 is a circuit diagram showing a shift circuit in related art with a level shifting function.

Finally, the 2-input NAND circuit 71 used in the control pulse generation section 70 of the shift register circuit 60 according to the fifth embodiment is described with reference to FIG. 75. The 2-input NAND circuit shown includes PMOS transistors p65 and p66 connected in parallel between the power supply potential VDD and a node N14 and NMOS transistors n65 and n66 connected in series between the node N14 and the power supply potential VSS. The 2-input NAND circuit is configured such that the potential at the node N14 when two input pulses IN1 and IN2 are applied to the gates of the PMOS transistors p65 and p66 and the NMOS transistors n65 and n66, respectively, is led out as a NAND output. The logic circuits shown in FIGS. 71 to 75 are a mere example and can be replaced by any other logic circuit only if it operates similarly.

The shift register circuits 10 and 60 according to the fourth and fifth embodiments can be used as a general shift register circuit with a level shifting function. The shift register circuits 10 and 60 can be further used as a shift register circuit forming a scanner for a vertical driver or a horizontal driver in a display apparatus of the type integrated with a drive circuit. In the display apparatus, peripheral drive circuits for driving a pixel array section wherein pixels each including an electro-optical element are arranged two-dimensionally in rows and columns are formed on a board on which the pixel array section is disposed.

APPLIED EXAMPLE 3

FIG. 54 shows an example of a configuration of a display apparatus according to an applied example of the present invention. The display apparatus shown in FIG. 54 is formed as an active matrix type liquid crystal display apparatus, and a liquid crystal cell is used as an electro-optical element of a pixel.

Referring to FIG. 54, the active matrix type liquid crystal display apparatus 80 according to the present applied example includes a pixel array section 81, a vertical driver 82, a horizontal driver 83, and so forth. Peripheral driving circuits including the vertical driver 82 and the horizontal driver 83 are formed integrally on a liquid crystal panel 84 on which the pixel array section 81 is formed. The liquid crystal panel 84 includes two insulating substrates, for example, glass plates, disposed in an opposing relationship with a fixed gap left therebetween, and a liquid crystal material is encapsulated in the gap.

The pixel array section 81 has pixels 90 disposed two-dimensionally in m rows and n columns thereon. Further, on the matrix array of the pixels 90, scanning lines 85-1 to 85-m are wired for the individual rows and signal lines 86-1 to 86-n are wired for the individual columns. Each of the pixels 90 includes a TFT (Thin Film Transistor) 91, a liquid crystal cell 92 having a pixel electrode connected to the drain electrode of the TFT 91, and a retention capacitor 93 connected at one of electrodes thereof to the drain electrode of the TFT 91.

In the pixel structure described, the TFT 61 of each of the pixels 90 is connected at the gate electrode thereof to a scanning line 85 (85-1 to 85-m) and at the source electrode thereof to a signal line 86 (86-1 to 86-n). Meanwhile, an opposing electrode of the liquid crystal cell 92 and the other electrode of the retention capacitor 93 are connected to a common line 87 to which a common voltage VCOM is applied.

The vertical driver 82 is formed from a shift register or the like and selects the pixels 90 of the pixel array section 81 in a unit of a row. The horizontal driver 83 is formed from a shift register, sampling switches, or the like and writes a video signal inputted from the outside of the panel sequentially in a unit of a pixel (dot-sequentially) or simultaneously in a unit of a row (line-sequentially) into the pixels 90 of the row selected by the vertical driver 82.

In the active matrix type liquid crystal display apparatus 80 having the configuration described above, the shift register circuit 10 or 60 according to the first or second embodiment described above is used as a shift register circuit forming at least one of the vertical driver 82 and the horizontal driver 83.

The shift register circuit 10 or 60 is used as a shift register circuit forming the vertical driver 82 or the horizontal driver 83 in this manner. The shift register circuits 10 and 60 use, as shift register units (transfer stages) thereof, the shift circuits 11-1, 11-2, . . . /61-1, 61-2, . . . including the level shifting section 20 or 50, which is free from leak current and is low in current consumption. Thu, the power consumption by the shift register circuits 10 and 60 is low. Consequently, reduction of the power consumption of the liquid crystal display apparatus 80 can be anticipated.

It is to be noted that, while, in the applied example described above, the present invention is applied to a liquid crystal display apparatus wherein a liquid crystal cell is used as an electro-optical element of a pixel, the application of the present invention is not limited to the liquid crystal display apparatus, but the present invention can be applied also to various display apparatus. The examples of the various display apparatus can be an EL display apparatus, which uses An EL (Electro Luminescence) element as an electro-optical element of a pixel, or other apparatus incorporating a scanner formed using a shift register circuit. In the EL display apparatus, a vertical driver or a horizontal driver formed using a shift register circuit is formed on a board on which the pixel array section is formed.

While preferred embodiments of the present invention have been described using specific terms, such description is for illustrative purposes only, and it is to be understood that changes and variations may be made without departing from the spirit or scope of the following claims.

What is claimed is:

1. A level conversion circuit, comprising:
   first and second transistors of the opposite conduction types to each other connected in series between a first power supply potential and a second power supply potential;
   a clock terminal to which a clock signal is inputted;
   first switch means connected between said clock terminal and the gate of said first transistor and having an on state when a circuit operation control signal is in an active state;
   second switch means connected between said second power supply potential and the gate of said second transistor and having an off state when the circuit operation control signal is in an active state; and
   a capacitance element connected between said clock terminal and the gate of said second transistor.

2. The level conversion circuit according to claim 1, further comprising a unidirectional circuit connected between said second power supply potential and the gate of said second transistor.

3. The level conversion circuit according to claim 1, wherein the circuit operation control signal changes from an inactive state to an active state when the clock signal is placed into a high level.

4. The level conversion circuit according to claim 1, further comprising resetting means for periodically setting the gate potential of said second transistor to said second power supply potential.

5. The level conversion circuit according to claim 4, wherein said resetting means is connected between said second power supply potential and the gate of said second transistor and having an on state when the clock signal has a high level.

6. A power supply voltage generation circuit, comprising:
   level conversion means for level-converting a clock pulse of a first amplitude into a clock pulse of a second amplitude;
   buffer means for converting the clock pulse of the second amplitude obtained by the level-conversion by said level conversion means into clock pulses of the opposite phases to each other; and
   a circuit section for operating in response to the clock pulses of the opposite phases outputted from said buffer means to generate a predetermined power supply voltage;
   said level conversion means including
   first and second transistors of the opposite conduction types to each other connected in series between a first power supply potential and a second power supply potential,
   a clock terminal to which a clock signal is inputted,
   first switch means connected between said clock terminal and the gate of said first transistor and having an on state when a circuit operation control signal is in an active state,
   second switch means connected between said second power supply potential and the gate of said second transistor and having an off state when the circuit operation control signal is in an active state, and
   a capacitance element connected between said clock terminal and the gate of said second transistor.

7. The power supply voltage generation circuit according to claim 6, wherein said level conversion means further includes a unidirectional circuit connected between said second power supply potential and the gate of said second transistor.

8. The power supply voltage generation circuit according to claim 6, wherein the circuit operation control signal changes from an inactive state to an active state when the clock pulse is placed into a high level.

9. The power supply voltage generation circuit according to claim 6, wherein said level conversion means further includes resetting means for periodically setting the gate potential of said second transistor to said second power supply potential.

10. The power supply voltage generation circuit according to claim 9, wherein said resetting means is connected between said second power supply potential and the gate of said second transistor and having an on state when the clock signal has a high level.

11. The power supply voltage generation circuit according to claim 10, wherein said buffer means includes an odd number of stages of inverter circuits connected in cascade connection, and said power supply voltage generation circuit further comprises reset signal production means for producing a reset signal for controlling driving of said reset means using an output of one of said inverter circuits at an arbitrary stage of said buffer means.

12. A display apparatus, comprising:
   a power supply voltage generation circuit including
   level conversion means for level-converting a clock pulse of a first amplitude into a clock pulse of a second amplitude,
   buffer means for converting the clock pulse of the second amplitude obtained by the level-conversion by said level conversion means into clock pulses of the opposite phases to each other, and
   a circuit section for operating in response to the clock pulses of the opposite phases outputted from said buffer means to generate a predetermined power supply voltage;
   a pixel array section wherein a plurality of pixels each including electro-optical means are arranged two-dimensionally; and
   a circuit board on which said power supply voltage generation circuit and said pixel array section are formed;

said level conversion means including
first and second transistors of the opposite conduction types to each other connected in series between a first power supply potential and a second power supply potential,
a clock terminal to which a clock signal is inputted,
first switch means connected between said clock terminal and the gate of said first transistor and having an on state when a circuit operation control signal is in an active state,
second switch means connected between said second power supply potential and the gate of said second transistor and having an off state when the circuit operation control signal is in an active state, and
a capacitance element connected between said clock terminal and the gate of said second transistor.

13. The display apparatus according to claim 12, wherein said level conversion means further includes a unidirectional circuit connected between said second power supply potential and the gate of said second transistor.

14. The display apparatus according to claim 12, wherein the circuit operation control signal changes from an inactive state to an active state when the clock signal is placed into a high level.

15. The display apparatus according to claim 12, wherein said level conversion means further includes resetting means for periodically setting the gate potential of said second transistor to said second power supply potential.

16. The display apparatus according to claim 15, wherein said resetting means is connected between said second power supply potential and the gate of said second transistor and having an on state when the clock signal has a high level.

17. The display apparatus according to claim 16, wherein said buffer means includes an odd number of stages of inverter circuits connected in cascade connection, and said display apparatus further comprises reset signal production means for producing a reset signal for controlling driving of said reset means using an output of one of said inverter circuits at an arbitrary stage of said buffer means.

18. A shift circuit, comprising:
level shifting means for level-shifting a clock pulse from a first amplitude to a second amplitude when a control pulse is in an active state and outputting the level-shifted clock pulse; and
control pulse generation means for generating the control pulse;
said level shifting means including
first and second transistors of the opposite conduction types to each other connected in series between a first power supply potential and a second power supply potential,
a clock terminal to which the clock pulse is inputted,
first switch means connected between said clock terminal and the gate of said first transistor and having an on state when the control pulse is in an active state,
second switch means connected between said second power supply potential and the gate of said second transistor and having an off state when the control pulse is in an active state, and
a capacitance element connected between said clock terminal and the gate of said second transistor.

19. The shift circuit according to claim 18, wherein said level shifting means further includes third switch means connected between said second power supply potential and the gate of said first transistor and having an off state when the control pulse is in an active state.

20. The shift circuit according to claim 18, wherein said level shifting means further includes fourth switch means connected between said clock terminal and said capacitance element for interrupting the electric connection between said clock terminal and said capacitance element when the control pulse is in an inactive state.

21. The shift circuit according to claim 20, wherein said level shifting means further includes fixing means for fixing the potential at the connection node between said fourth switch means and said capacitance element to a fixed potential when the control pulse is in an inactive state.

22. The shift circuit according to claim 18, wherein the control pulse has an active state only for a period of time of one cycle of the clock pulse.

23. A shift register circuit, comprising:
a plurality of stages of shift circuits connected in cascade connection and each including
level shifting means for level-shifting a clock pulse from a first amplitude to a second amplitude when a control pulse is in an active state and outputting the level-shifted clock pulse and
control pulse generation means for generating the control pulse;
said level shifting means including
first and second transistors of the opposite conduction types to each other connected in series between a first power supply potential and a second power supply potential,
a clock terminal to which the clock pulse is inputted,
first switch means connected between said clock terminal and the gate of said first transistor and having an on state when the control pulse is in an active state,
second switch means connected between said second power supply potential and the gate of said second transistor and having an off state when the control pulse is in an active state, and
a capacitance element connected between said clock terminal and the gate of said second transistor.

24. The shift register circuit according to claim 23, wherein said level shifting means further includes third switch means connected between said second power supply potential and the gate of said first transistor and having an off state when the control pulse is in an active state.

25. The shift register circuit according to claim 24, wherein said level shifting means further includes fixing means for fixing the potential at the connection node between said fourth switch means and said capacitance element to a fixed potential when the control pulse is in an inactive state.

26. The shift register circuit according to claim 25, wherein each of the shift circuits performs a shifting operation in response to clock pulses of the opposite phases to each other having the fixed potential equal to a high level side potential, and said shift register circuit further comprises fixed potential production means for producing the fixed potential in response to the clock pulses of the opposite phases to each other.

27. The shift register circuit according to claim 23, wherein said level shifting means further includes fourth switch means connected between said clock terminal and said capacitance element for interrupting the electric connection between said clock terminal and said capacitance element when the control pulse is in an inactive state.

28. The shift register circuit according to claim 23, wherein said control pulse generation means generates the control pulse in response to an input to the shift circuit to which said control pulse generation means belongs and an output of the shift circuit to which said control pulse generation means belongs.

29. The shift register circuit according to claim 23, wherein said control pulse generation means generates the control pulse in response to an input to the shift circuit to which said control pulse generation means belongs and an output of the shift circuit at the next stage to which said control pulse generation means belongs.

30. The shift register circuit according to claim 29, wherein a power supply potential is inputted as an output of the shift circuit at the next stage to said control pulse generation means of the shift circuit at the last one of the plural stages, and said shift register circuit further comprises providing means for providing the power supply potential to the shift circuit at the second last stage when the output of the shift circuit at the second last stage has an active state but providing the output of the shift circuit at the last stage to the shift circuit at the second last stage when the output of the shift circuit at the second last stage has an inactive state.

31. The shift register circuit according to claim 23, wherein each of the control pulse generation means in those of the shift circuits from the first to the second last stages of the plural stages generates the control pulse in response to an input to the shift circuit to which the control pulse generation means belongs and an output of the shift circuit at the next stage to which the control pulse generation means belongs, and said control pulse generation means in the shift circuit at the last stage generates the control pulse in response to an input to the shift circuit to which said control pulse generation means belongs and an output of the shift circuit to which said control pulse generation means belongs.

32. A display apparatus, comprising:

a pixel array section wherein a plurality of pixels each including an electro-optical element are disposed two-dimensionally in rows and columns;

vertical driving means for selecting the pixels of said pixel array section in a unit of a row; and horizontal driving means for writing a video signal into the pixels of the row selected by said vertical driving means;

at least one of said vertical driving means and said horizontal driving means including a shift register circuit;

said shift register circuit including a plurality of stages of shift circuits connected in cascade connection and each including level shifting means for level-shifting a clock pulse from a first amplitude to a second amplitude when a control pulse is in an active state and outputting the level-shifted clock pulse and control pulse generation means for generating the control pulse;

said level shifting means including first and second transistors of the opposite conduction types to each other connected in series between a first power supply potential and a second power supply potential, a clock terminal to which the clock pulse is inputted, first switch means connected between said clock terminal and the gate of said first transistor and having an on state when the control pulse is in an active state, second switch means connected between said second power supply potential and the gate of said second transistor and having an off state when the control pulse is in an active state, and a capacitance element connected between said clock terminal and the gate of said second transistor.

33. The display apparatus according to claim 32, wherein said level shifting means further includes third switch means connected between said second power supply potential and the gate of said first transistor and having an off state when the control pulse is in an active state.

34. The display apparatus according to claim 33, wherein said level shifting means further includes fixing means for fixing the potential at the connection node between said fourth switch means and said capacitance element to a fixed potential when the control pulse is in an inactive state.

35. The display apparatus according to claim 34, wherein each of the shift circuits performs a shifting operation in response to clock pulses of the opposite phases to each other having the fixed potential equal to a high level side potential, and said display apparatus further comprises fixed potential production means for producing the fixed potential in response to the clock pulses of the opposite phases to each other.

36. The display apparatus according to claim 32, wherein said level shifting means further includes fourth switch means connected between said clock terminal and said capacitance element for interrupting the electric connection between said clock terminal and said capacitance element when the control pulse is in an inactive state.

37. The display apparatus according to claim 32, wherein said control pulse generation means generates the control pulse in response to an input to the shift circuit to which said control pulse generation means belongs and an output of the shift circuit to which said control pulse generation means belongs.

38. The display apparatus according to claim 32, wherein said control pulse generation means generates the control pulse in response to an input to the shift circuit to which said control pulse generation means belongs and an output of the shift circuit at the next stage to which said control pulse generation means belongs.

39. The display apparatus according to claim 37, wherein a power supply potential is inputted as an output of the shift circuit at the next stage to said control pulse generation means of the shift circuit at the last one of the plural stages, and said display apparatus further comprises providing means for providing the power supply potential to the shift circuit at the second last stage when the output of the shift circuit at the second last stage has an active state but providing the output of the shift circuit at the last stage to the shift circuit at the second last stage when the output of the shift circuit at the second last stage has an inactive stage.

40. The display apparatus according to claim 32, wherein each of the control pulse generation means in those of the shift circuits from the first to the second last stages of the plural stages generates the control pulse in response to an input to the shift circuit to which the control pulse generation means belongs and an output of the shift circuit at the next stage to which the control pulse generation means belongs, and said control pulse generation means in the shift circuit at the last stage generates the control pulse in response to an input to the shift circuit to which said control pulse generation means belongs and an output of the shift circuit to which said control pulse generation means belongs.

41. A shift register circuit, comprising:
a plurality of first shift circuit pairs and a plurality of second shift circuit pairs connected alternately in cascade connection;
each of said first shift circuit pairs including a first shift circuit and a second shift circuit connected in cascade connection while each of said second shift circuit pairs includes a third shift circuit and a fourth shift circuit connected in cascade connection;
said first shift circuit being operable, when a first control pulse has an active state, to extract a low level side pulse of a first clock pulse, level-shift the low level side pulse from a first amplitude to a second amplitude, and output the level-shifted low level side pulse;
said second shift circuit being operable, when the first control pulse has an active state, to extract a low level side pulse of a second clock pulse having a frequency equal to that of the first clock pulse but having a phase displaced by a ¼ cycle from that of the first clock pulse, level-shift the low level side pulse from the first amplitude to the second amplitude, and output the level-shifted low level side pulse;
said third shift circuit being operable, when a second control pulse has an active state, to extract a high level side pulse of the first clock pulse, level-shift the high level side pulse from the first amplitude to the second amplitude, and output the level-shifted high level side pulse; and
said fourth shift circuit being operable, when the second control pulse has an active state, to extract a high level side pulse of the second clock pulse, level-shift the high level side pulse from the first amplitude to the second amplitude, and output the level-shifted high level side pulse.

42. The shift register circuit according to claim 41, wherein each of said first and second shift circuits includes:
first and second transistors of the opposite conduction types to each other connected in series between a first power supply potential and a second power supply potential;
a first clock terminal to which the first and second clock pulses are inputted;
first switch means connected between said first clock terminal and the gate of said first transistor and having an on state when the first control pulse is in an active state;
second switch means connected between said second power supply potential and the gate of said second transistor and having an off state when the first control pulse is in an active state; and
a first capacitance element connected between said first clock terminal and the gate of said second transistor.

43. The shift register circuit according to claim 42, wherein each of said first and second shift circuits further includes third switch means connected between said second power supply potential and the gate of said first transistor and having an off state when the first control pulse is an active state.

44. The shift register circuit according to claim 42, wherein each of said first and second shift circuits further includes fourth switch means connected between said first clock terminal and said first capacitance element for interrupting the electric connection between said first clock terminal and said first capacitance element when the first control pulse is in an inactive state.

45. The shift register circuit according to claim 44, wherein each of said first and second shift circuits further includes fixing means for fixing the potential at the connection node between said fourth switch means and said first capacitance element to a fixed potential when the first control pulse is in an inactive state.

46. The shift register circuit according to claim 41, wherein each of said third and fourth shift circuits includes:
third and fourth transistors of the opposite conduction types to each other connected in series between said first power supply potential and said second power supply potential;
a second clock terminal to which the first and second clock pulses are inputted;
fifth switch means connected between said second clock terminal and the gate of said third transistor and having an on state when the second control pulse is in an active state;
sixth switch means connected between a third power supply potential lower by an amplitude voltage of the first and second clock pulses than said second power supply potential and the gate of said fourth transistor and having an off state when the second control pulse is in an active state; and
a second capacitance element connected between said second clock terminal and the gate of said fourth transistor.

47. The shift register circuit according to claim 46, wherein each of said third and fourth shift circuits further includes seventh switch means connected between said first power supply potential and the gate of said first transistor and having an off state when the second control pulse is an active state.

48. The shift register circuit according to claim 46, wherein each of said third and fourth shift circuits further includes eighth switch means connected between said second clock terminal and said second capacitance element for interrupting the electric connection between said second clock terminal and said second capacitance element when the second control pulse is in an inactive state.

49. The shift register circuit according to claim 48, wherein each of said third and fourth shift circuits further includes fixing means for fixing the potential at the connection node between said eight switch means and said second capacitance element to a fixed potential when the second control pulse is in an inactive state.

50. The shift register circuit according to claim 41, wherein each of said first and second shift circuits produces the first control pulse in response to an input to and an output of the stage to which the shift circuit belongs.

51. The shift register circuit according to claim 41, wherein each of said third and fourth shift circuits produces the second control pulse in response to an input to and an output of the stage to which the shift circuit belongs.

52. A display apparatus, comprising:
a pixel array section wherein a plurality of pixels each including an electro-optical element are disposed two-dimensionally in rows and columns;
vertical deriving means for selecting the pixels of said pixel array section in a unit of a row; and
horizontal driving means for writing a video signal into the pixels of the row selected by said vertical driving means;

at least one of said vertical driving means and said horizontal driving means including a shift register circuit;

said shift register circuit including a plurality of first shift circuit pairs and a plurality of second shift circuit pairs connected alternately in cascade connection;

each of said first shift circuit pairs including a first shift circuit and a second shift circuit connected in cascade connection while each of said second shift circuit pairs includes a third shift circuit and a fourth shift circuit connected in cascade connection;

said first shift circuit being operable, when a first control pulse has an active state, to extract a low level side pulse of a first clock pulse, level-shift the low level side pulse from a first amplitude to a second amplitude, and output the level-shifted low level side pulse;

said second shift circuit being operable, when the first control pulse has an active state, to extract a low level side pulse of a second clock pulse having a frequency equal to that of the first clock pulse but having a phase displaced by a ¼ cycle from that of the first clock pulse, level-shift the low level side pulse from the first amplitude to the second amplitude, and output the level-shifted low level side pulse;

said third shift circuit being operable, when a second control pulse has an active state, to extract a high level side pulse of the first clock pulse, level-shift the high level side pulse from the first amplitude to the second amplitude, and output the level-shifted high level side pulse; and said fourth shift circuit being operable, when the second control pulse has an active state, to extract a high level side pulse of the second clock pulse, level-shift the high level side pulse from the first amplitude to the second amplitude, and output the level-shifted high level side pulse.

53. The display apparatus according to claim 52, wherein each of said first and second shift circuits includes:

first and second transistors of the opposite conduction types to each other connected in series between a first power supply potential and a second power supply potential;

a first clock terminal to which the first and second clock pulses are inputted;

first switch means connected between said first clock terminal and the gate of said first transistor and having an on state when the first control pulse is in an active state;

second switch means connected between said second power supply potential and the gate of said second transistor and having an off state when the first control pulse is in an active state; and a first capacitance element connected between said first clock terminal and the gate of said second transistor.

54. The display apparatus according to claim 53, wherein each of said first and second shift circuits further includes third switch means connected between said second power supply potential and the gate of said first transistor and having an off state when the first control pulse is an active state.

55. The display apparatus according to claim 53, wherein each of said first and second shift circuits further includes fourth switch means connected between said first clock terminal and said first capacitance element for interrupting the electric connection between said first clock terminal and said first capacitance element when the first control pulse is in an inactive state.

56. The display apparatus according to claim 55, wherein each of said first and second shift circuits further includes fixing means for fixing the potential at the connection node between said fourth switch means and said first capacitance element to a fixed potential when the first control pulse is in an inactive state.

57. The display apparatus according to claim 52, wherein each of said third and fourth shift circuits includes:

third and fourth transistors of the opposite conduction types to each other connected in series between said first power supply potential and said second power supply potential;

a second clock terminal to which the first and second clock pulses are inputted;

fifth switch means connected between said second clock terminal and the gate of said third transistor and having an on state when the second control pulse is in an active state;

sixth switch means connected between a third power supply potential lower by an amplitude voltage of the first and second clock pulses than said second power supply potential and the gate of said fourth transistor and having an off state when the second control pulse is in an active state; and a second capacitance element connected between said second clock terminal and the gate of said fourth transistor.

58. The display apparatus according to claim 57, wherein each of said third and fourth shift circuits further includes seventh switch means connected between said first power supply potential and the gate of said first transistor and having an off state when the second control pulse is an active state.

59. The display apparatus according to claim 57, wherein each of said third and fourth shift circuits further includes eighth switch means connected between said second clock terminal and said second capacitance element for interrupting the electric connection between said second clock terminal and said second capacitance element when the second control pulse is in an inactive state.

60. The display apparatus according to claim 59, wherein each of said third and fourth shift circuits further includes fixing means for fixing the potential at the connection node between said eight switch means and said second capacitance element to a fixed potential when the second control pulse is in an inactive state.

61. The display apparatus according to claim 52, wherein each of said first and second shift circuits produces the first control pulse in response to an input to and an output of the stage to which the shift circuit belongs.

62. The display apparatus according to claim 52, wherein each of said third and fourth shift circuits produces the second control pulse in response to an input to and an output of the stage to which the shift circuit belongs.

* * * * *

UNITED STATES PATENT AND TRADEMARK OFFICE
CERTIFICATE OF CORRECTION

PATENT NO. : 7,239,179 B2  
APPLICATION NO. : 11/195837  
DATED : July 3, 2007  
INVENTOR(S) : Seiichiro Jinta et al.

Page 1 of 1

It is certified that error appears in the above-identified patent and that said Letters Patent is hereby corrected as shown below:

Column 52, Line 44 Claim 39:
"claim 37" should read -- claim 36 --.

Column 54, Line 35 Claim 47:
"is an" should read -- is in an --.

Column 54, Line 47 Claim 49:
"eight" should read -- eighth --.

Column 56, Line 37 Claim 58:
"is an" should read -- is in an --.

Column 56, Line 50 Claim 60:
"eight" should read -- eighth --.

Signed and Sealed this

Sixth Day of November, 2007

JON W. DUDAS  
*Director of the United States Patent and Trademark Office*